(12) United States Patent
Mori et al.

(10) Patent No.: US 10,199,979 B2
(45) Date of Patent: Feb. 5, 2019

(54) POWER CONVERSION DEVICE

(71) Applicant: Mitsubishi Electric Corporation, Tokyo (JP)

(72) Inventors: Tatsuya Mori, Tokyo (JP); Akira Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/911,166

(22) PCT Filed: Nov. 11, 2013

(86) PCT No.: PCT/JP2013/080400
§ 371 (c)(1),
(2) Date: Feb. 9, 2016

(87) PCT Pub. No.: WO2015/068300
PCT Pub. Date: May 14, 2015

(65) Prior Publication Data
US 2016/0190972 A1    Jun. 30, 2016

(51) Int. Cl.
*G01R 31/02*    (2006.01)
*H02H 3/04*    (2006.01)
(Continued)

(52) U.S. Cl.
CPC .......... *H02P 27/08* (2013.01); *G01R 19/0092* (2013.01); *H02M 7/5395* (2013.01);
(Continued)

(58) Field of Classification Search
CPC ........... H02P 27/08; H02P 21/22; H02P 21/00
(Continued)

(56) References Cited

U.S. PATENT DOCUMENTS 5,182,508 A    1/1993    Schauder
9,130,481 B2 *   9/2015    Nakano ............. H02M 7/53875
(Continued)

FOREIGN PATENT DOCUMENTS

JP        6-343206 A    12/1994
JP    2008-219956 A    9/2008
(Continued)

OTHER PUBLICATIONS

International Search Report of PCT/JP2013/080400 dated Feb. 10, 2014.
(Continued)

*Primary Examiner* — Erick Glass
(74) *Attorney, Agent, or Firm* — Sughrue Mion, PLLC; Richard C. Turner

(57) ABSTRACT

A power conversion device includes an alternating current rotating machine having a multiple of multi-phase windings, a multiple of power conversion means that convert direct current voltage of a direct current power supply based on a multiple of switching signals and apply voltage to the multiple of multi-phase windings, first current detection means that detects a first bus current, which is current flowing between the power conversion means that applies voltage to one multi-phase windings of the multiple of multi-phase windings and the direct current power supply, and first phase current calculation means that calculates the current flowing through the one multi-phase windings based on the first bus current, wherein the first current detection means detects the first bus current at a timing at which a multiple of voltage vectors based on the multiple of switching signals neighbor or coincide.

18 Claims, 50 Drawing Sheets

(51) Int. Cl.
*H02H 7/08* (2006.01)
*H02P 27/08* (2006.01)
*H02M 7/5387* (2007.01)
*H02M 7/5395* (2006.01)
*H02P 21/22* (2016.01)
*G01R 19/00* (2006.01)
*H02M 1/00* (2006.01)

(52) U.S. Cl.
CPC ........ *H02M 7/53873* (2013.01); *H02P 21/22* (2016.02); *H02M 2001/0009* (2013.01); *H02M 2001/0025* (2013.01); *H02M 2007/53876* (2013.01)

(58) Field of Classification Search
USPC .................................................. 318/490, 496
See application file for complete search history.

(56) References Cited

U.S. PATENT DOCUMENTS

| | | | |
|---|---|---|---|
| 2008/0061728 A1 | 3/2008 | Tomigashi | |
| 2011/0156623 A1* | 6/2011 | Nakamura | H02P 5/74 318/400.02 |
| 2011/0221369 A1* | 9/2011 | Welchko | H02P 29/0241 318/400.22 |
| 2013/0158808 A1 | 6/2013 | Imamura et al. | |
| 2013/0257332 A1 | 10/2013 | Nakano et al. | |
| 2013/0299271 A1* | 11/2013 | Endo | B62D 5/046 180/446 |
| 2016/0200355 A1* | 7/2016 | Mori | B62D 5/0484 180/446 |

FOREIGN PATENT DOCUMENTS

| | | |
|---|---|---|
| JP | 2011-061950 A | 3/2011 |
| JP | 2013-062913 A | 4/2013 |

OTHER PUBLICATIONS

Communication dated Feb. 2, 2018, issued by the State Intellectual Property Office of the P.R.C. in corresponding Chinese Application No. 201380080878.4.

Communication dated May 31, 2017, from the European Patent Office in counterpart European Application No. 13897096.7.

* cited by examiner

FIG.6

| Qup1 | Qun1 | Qvp1 | Qvn1 | Qwp1 | Qwn1 | Vu1 | Vv1 | Vw1 | FIRST VOLTAGE VECTOR | FIRST BUS CURRENT Idc1 |
|---|---|---|---|---|---|---|---|---|---|---|
| 0 | 1 | 0 | 1 | 0 | 1 | 0 | 0 | 0 | V0(1) | 0 |
| 1 | 0 | 0 | 1 | 0 | 1 | 2/3×Vdc | -1/3×Vdc | -1/3×Vdc | V1(1) | Iu1 |
| 1 | 0 | 1 | 0 | 0 | 1 | 1/3×Vdc | 1/3×Vdc | -2/3×Vdc | V2(1) | -Iw1 |
| 0 | 1 | 1 | 0 | 0 | 1 | -1/3×Vdc | 2/3×Vdc | -1/3×Vdc | V3(1) | Iv1 |
| 0 | 1 | 1 | 0 | 1 | 0 | -2/3×Vdc | 1/3×Vdc | 1/3×Vdc | V4(1) | -Iu1 |
| 0 | 1 | 0 | 1 | 1 | 0 | -1/3×Vdc | -1/3×Vdc | 2/3×Vdc | V5(1) | Iw1 |
| 1 | 0 | 0 | 1 | 1 | 0 | 1/3×Vdc | -2/3×Vdc | 1/3×Vdc | V6(1) | -Iv1 |
| 1 | 0 | 1 | 0 | 1 | 0 | 0 | 0 | 0 | V7(1) | 0 |

FIG.8

| Qup2 | Qun2 | Qvp2 | Qvn2 | Qwp2 | Qwn2 | Vu2 | Vv2 | Vw2 | SECOND VOLTAGE VECTOR |
|---|---|---|---|---|---|---|---|---|---|
| 0 | 1 | 0 | 1 | 0 | 1 | 0 | 0 | 0 | V0(2) |
| 1 | 0 | 0 | 1 | 0 | 1 | 2/3 × Vdc | - 1/3 × Vdc | - 1/3 × Vdc | V1(2) |
| 1 | 0 | 1 | 0 | 0 | 1 | 1/3 × Vdc | 1/3 × Vdc | - 2/3 × Vdc | V2(2) |
| 0 | 1 | 1 | 0 | 0 | 1 | - 1/3 × Vdc | 2/3 × Vdc | - 1/3 × Vdc | V3(2) |
| 0 | 1 | 1 | 0 | 1 | 0 | - 2/3 × Vdc | 1/3 × Vdc | 1/3 × Vdc | V4(2) |
| 0 | 1 | 0 | 1 | 1 | 0 | - 1/3 × Vdc | 2/3 × Vdc | - 1/3 × Vdc | V5(2) |
| 1 | 0 | 0 | 1 | 1 | 0 | 1/3 × Vdc | - 2/3 × Vdc | 1/3 × Vdc | V6(2) |
| 1 | 0 | 1 | 0 | 1 | 0 | 0 | 0 | 0 | V7(2) |

| Qup2 | Qun2 | Qvp2 | Qvn2 | Qwp2 | Qwn2 | Vu2 | Vv2 | Vw2 | SECOND VOLTAGE VECTOR | SECOND BUS CURRENT Idc2 |
|---|---|---|---|---|---|---|---|---|---|---|
| 0 | 1 | 0 | 1 | 0 | 1 | 0 | 0 | 0 | V0(2) | 0 |
| 1 | 0 | 0 | 1 | 0 | 1 | 2/3 × Vdc | −1/3 × Vdc | −1/3 × Vdc | V1(2) | Iu2 |
| 1 | 0 | 1 | 0 | 0 | 1 | 1/3 × Vdc | 1/3 × Vdc | −2/3 × Vdc | V2(2) | −Iw2 |
| 0 | 1 | 1 | 0 | 0 | 1 | −1/3 × Vdc | 2/3 × Vdc | −1/3 × Vdc | V3(2) | Iv2 |
| 0 | 1 | 1 | 0 | 1 | 0 | −2/3 × Vdc | 1/3 × Vdc | 1/3 × Vdc | V4(2) | −Iu2 |
| 0 | 1 | 0 | 1 | 1 | 0 | −1/3 × Vdc | −1/3 × Vdc | 2/3 × Vdc | V5(2) | Iw2 |
| 1 | 0 | 0 | 1 | 1 | 0 | 1/3 × Vdc | −2/3 × Vdc | 1/3 × Vdc | V6(2) | −Iv2 |
| 1 | 0 | 1 | 0 | 1 | 0 | 0 | 0 | 0 | V7(2) | 0 |

FIG.39

| θv (DEGREES) | 0-60 | 60-120 | 120-180 | 180-240 | 240-300 | 300-360 |
|---|---|---|---|---|---|---|
| MAGNITUDE RELATIONSHIP | Vu1≥Vv1≥Vw1 | Vv1≥Vw1≥Vw1 | Vv1≥Vw1≥Vu1 | Vw1≥Vv1≥Vu1 | Vw1≥Vu1≥Vv1 | Vu1≥Vw1≥Vv1 |
| FIRST COMBINATION | V1(1), V1(2) | V2(1), V2(2) | V3(1), V3(2) | V4(1), V4(2) | V5(1), V5(2) | V6(1), V6(2) |
| SECOND COMBINATION | V2(1), V2(2) | V3(1), V3(2) | V4(1), V4(2) | V5(1), V5(2) | V6(1), V6(2) | V1(1), V1(2) |

FIG.42

| θ (DEGREES) | 270-330 | 330-0, 0-30 | 30-90 | 90-150 | 150-210 | 210-270 |
|---|---|---|---|---|---|---|
| q AXIS PHASE θq (DEGREES) | 0-60 | 60-120 | 120-180 | 180-240 | 240-300 | 300-360 |
| FIRST COMBINATION | V1(1), V1(2) | V2(1), V2(2) | V3(1), V3(2) | V4(1), V4(2) | V5(1), V5(2) | V6(1), V6(2) |
| SECOND COMBINATION | V2(1), V2(2) | V3(1), V3(2) | V4(1), V4(2) | V5(1), V5(2) | V6(1), V6(2) | V1(1), V1(2) |

FIG.46

| θ (DEGREES) | 285 - 345 | 345 - 0, 0 - 45 | 45 - 105 | 105 - 195 | 195 - 255 | 255 - 315 |
|---|---|---|---|---|---|---|
| q AXIS PHASE θq (DEGREES) | 15 - 75 | 75 - 135 | 135 - 195 | 195 - 255 | 255 - 315 | 315 - 360, 0 - 15 |
| FIRST COMBINATION | V1(1), V1(2) | V2(1), V2(2) | V3(1), V3(2) | V4(1), V4(2) | V5(1), V5(2) | V6(1), V6(2) |
| SECOND COMBINATION | V2(1), V2(2) | V3(1), V3(2) | V4(1), V4(2) | V5(1), V5(2) | V6(1), V6(2) | V1(1), V1(2) |

FIG.50

| CURRENT COMMAND MAGNITUDE RELATIONSHIP | $|Iu|\geq|Iv|\geq|Iw|$ | $|Iv|\geq|Iu|\geq|Iw|$ | $|Iv|\geq|Iw|\geq|Iu|$ | $|Iw|\geq|Iv|\geq|Iu|$ | $|Iw|\geq|Iu|\geq|Iv|$ | $|Iu|\geq|Iw|\geq|Iv|$ |
|---|---|---|---|---|---|---|
| FIRST COMBINATION | V1(1), V1(2) | V2(1), V2(2) | V3(1), V3(2) | V4(1), V4(2) | V5(1), V5(2) | V6(1), V6(2) |
| SECOND COMBINATION | V2(1), V2(2) | V3(1), V3(2) | V4(1), V4(2) | V5(1), V5(2) | V6(1), V6(2) | V1(1), V1(2) |

POWER CONVERSION DEVICE

CROSS REFERENCE TO RELATED APPLICATIONS

This is a National Stage of International Application No. PCT/JP2013/080400 filed Nov. 11, 2013, the contents of which are incorporated herein by reference in its entirety.

TECHNICAL FIELD

The present invention relates to a power conversion device.

BACKGROUND ART

An existing motor control device and electric power steering device are such that a motor control device that controls the drive of a motor based on the PWM duty command value of each phase, and detects the motor current of each phase of the motor using a one-shunt type current detector, includes a detected current correction unit that calculates a detected current correction value from an inverter power supply voltage, the duty command value of each phase, motor counter electromotive voltage information, the motor current of each phase detected by the current detector, PWM disposition information, and motor electrical characteristics, and controls the drive of the motor by correcting the motor current of each phase detected by the current detector to an average motor current using the detected current correction value (for example, PTL 1).

CITATION LIST

Patent Literature

PTL 1: JP-A-2013-62913

Non Patent Literature

NPL 1: Sugimoto Hidehiko et al, "Theory and Designing Practice of AC Servo System", Sogo Denshi Publishing, pages 35 to 37

SUMMARY OF INVENTION

Technical Problem

This kind of motor control device and electric power steering device is of a configuration wherein, when correcting to the average current, the detected current correction value is calculated in the detected current correction unit using a formula including the inverter power supply voltage, the duty command value of each phase, motor counter electromotive voltage information, the motor current of each phase detected by the current detector, PWM disposition information, and motor electrical characteristics, meaning that a large number of operations are necessary when calculating the correction value, because of which there is a problem in that it is difficult to mount the motor control device and electric power steering device in a low-priced microcomputer.

Furthermore, flux linkage proportionate to a resistance R and counter electromotive voltage EMF of the motor fluctuates due to motor temperature fluctuation, and inductance L of the motor fluctuates due to the effect of magnetic saturation when current is flowing through the winding of the motor. When the motor constants fluctuate in this way, and a discrepancy occurs between the motor constants and motor constants stored by the detected current correction unit, a discrepancy occurs between the difference between the motor current of each phase detected by the current detector and the average motor current and the detected current correction value, and there is a problem in that the motor current of each phase detected by the current detector cannot be corrected to the average motor current. Also, even when adopting a countermeasure so that correction that takes motor constant fluctuation into consideration is performed by the detected current correction unit, a new problem occurs in that further operations are necessary for the countermeasure.

The invention, having been contrived in order to resolve the heretofore described kinds of problem, has an object of obtaining an average motor current while facilitating mounting in a low-priced microcomputer with a small number of operations.

Solution to Problem

A power conversion device according to the invention is characterized by including an alternating current rotating machine having a multiple of multi-phase windings, a direct current power supply, a voltage command calculation unit that outputs a multiple of voltage commands, switching signal generating means that outputs a multiple of switching signals based on the multiple of voltage commands, a multiple of power conversion means that convert direct current voltage of the direct current power supply based on the multiple of switching signals and apply voltage to the multiple of multi-phase windings, first current detection means that detects a first bus current, which is current flowing between the power conversion means that applies voltage to one multi-phase windings of the multiple of multi-phase windings and the direct current power supply, and first phase current calculation means that calculates the current flowing through the one multi-phase windings based on the detected first bus current, wherein the first current detection means detects the first bus current at a timing at which a multiple of voltage vectors based on the multiple of switching signals neighbor or coincide.

Advantageous Effects of Invention

Fluctuation in current flowing through the first multi-phase windings and second multi-phase windings is small at a timing at which a multiple of voltage vectors neighbor or coincide. By the first bus current being detected at this timing, a value near the average value of current flowing through the first multi-phase windings is obtained. Therefore, remarkable advantages not obtained to date can be obtained in that the power conversion device according to the invention is such that there is no need to carry out a large number of operations to calculate a detected current correction value in a detected current correction unit using a formula including an inverter power supply voltage, the duty command value of each phase, motor counter electromotive voltage information, the motor current of each phase detected by a current detector, PWM disposition information, and motor electrical characteristics, as is the case in PTL 1, the application of a low-priced microcomputer is facilitated by being able to implement with a small number of operations, and furthermore, the effect on fluctuation in the constants of the alternating current rotating machine is restricted, and a value near the average motor current can be obtained.

Objects, characteristics, aspects, and advantages of the invention other than those heretofore described will be further clarified by the following detailed description of the invention referring to the drawings.

BRIEF DESCRIPTION OF DRAWINGS

FIG. 6 is a diagram showing the relationship between first switching signals and first voltage vectors, and the relationship between a first bus current and currents flowing through first three-phase windings, in Embodiment 1.

FIG. 8 is a diagram showing the relationship between second switching signals and second voltage vectors in Embodiment 1.

FIG. 12 is a diagram showing waveforms when a step voltage of the same sign and same amplitude is added to d axis voltages Vd1 and Vd2 in FIG. 4.

FIG. 13 is a diagram showing waveforms when a step voltage of differing sign and same amplitude is added to the d axis voltages Vd1 and Vd2 in FIG. 4.

FIG. 23 is a diagram showing the relationship between second switching signals and second voltage vectors, and the relationship between a second bus current and currents flowing through second three-phase windings, in Embodiment 5.

FIG. 39 is a diagram showing an example of switching between two combinations in switching signal generating means of Embodiment 9.

FIG. 42 is a diagram showing a method of switching between two combinations in switching signal generating means of Embodiment 10.

FIG. 46 is a diagram showing a method of switching between two combinations in switching signal generating means of Embodiment 11.

FIG. 50 is a diagram showing a method of switching between two combinations in switching signal generating means of Embodiment 12.

DESCRIPTION OF EMBODIMENTS

Embodiment 1

Figure 1:
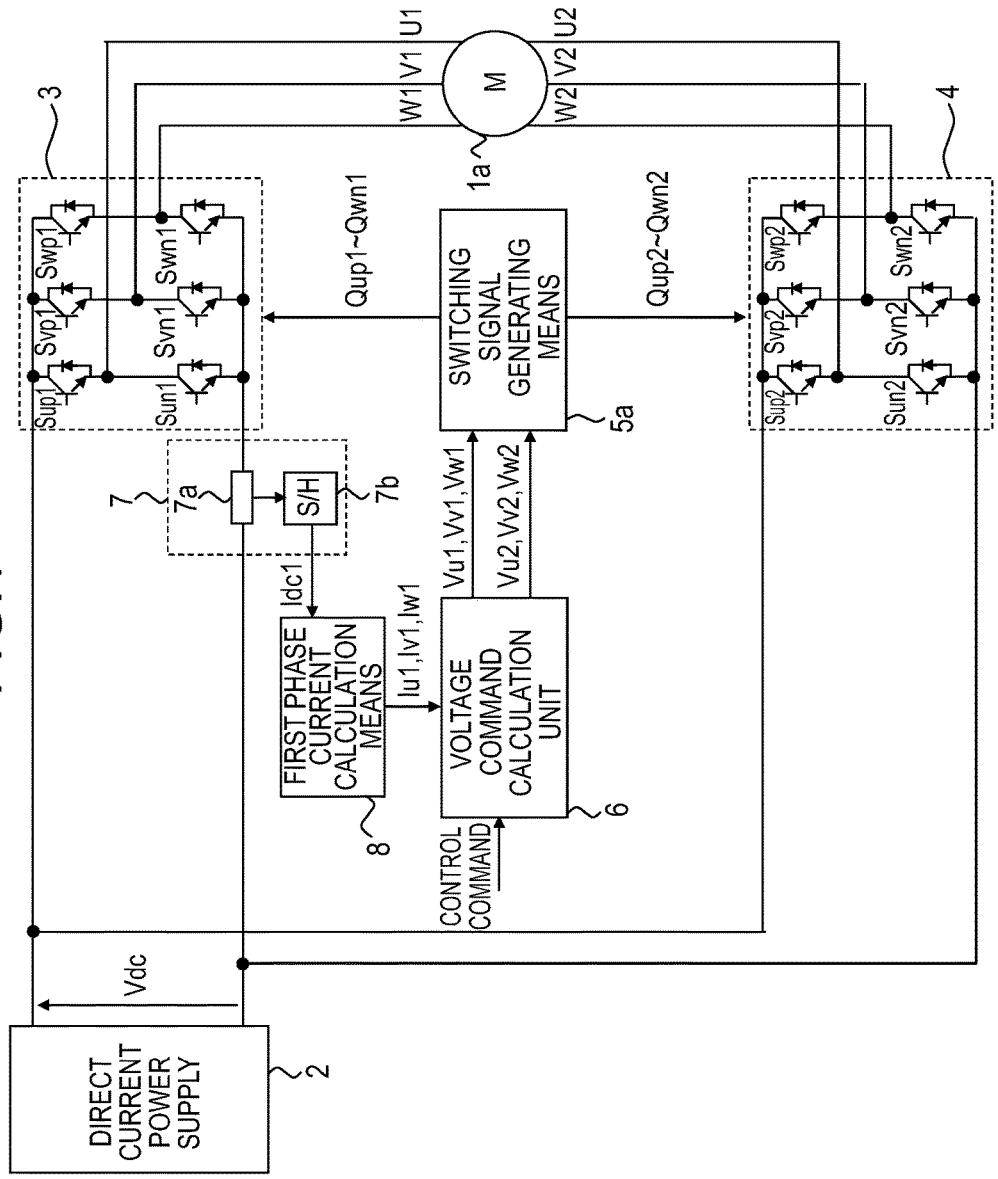
FIG. 1 is a configuration diagram showing the whole of a power conversion device in Embodiment 1 of the invention.

FIG. 1 is a configuration diagram showing the whole of a power conversion device in Embodiment 1 of the invention. The power conversion device is used in, for example, a motor control device and electric power steering device. An alternating current rotating machine 1a has first three-phase windings U1, V1, and W1 and second three-phase windings U2, V2, and W2, and is a permanent magnet synchronous rotating machine that has no mechanical phase difference between the first three-phase windings and second three-phase windings. A direct current power supply 2 outputs a direct current voltage Vdc to first power conversion means 3 and second power conversion means 4. Any instrument that outputs direct current voltage, such as a battery, a DC-DC converter, a diode rectifier, or a PWM rectifier, is used as the direct current power supply. Also, a direct current power supply may be provided for each of the first power conversion means 3 and second power conversion means 4.

The first power conversion means 3, by turning semiconductor switches Sup1 to Swn1 on and off based on first switching signals Qup1 to Qwn1, converts the direct current voltage Vdc input from the direct current power supply 2, and applies voltage to the first three-phase windings U1, V1, and W1 of the alternating current rotating machine 1a. Switches wherein a semiconductor switch such as an IGBT, bipolar transistor, MOS power transistor, or the like, and a diode are connected in anti-parallel are used as the semiconductor switches Sup1 to Swn1. Herein, the first switching signals Qup1, Qun1, Qvp1, Qvn1, Qwp1, and Qwn1 are switching signals for turning Sup1, Sun1, Svp1, Svn1, Swp1, and Swn1 respectively on and off in the first power conversion means 3.

The second power conversion means 4, by turning semiconductor switches Sup2 to Swn2 on and off based on second switching signals Qup2 to Qwn2, converts the direct current voltage Vdc input from the direct current power supply 2, and applies voltage to the second three-phase windings U2, V2, and W2 of the alternating current rotating machine 1a. Switches wherein a semiconductor switch such as an IGBT, bipolar transistor, MOS power transistor, or the like, and a diode are connected in anti-parallel are used as the semiconductor switches Sup2 to Swn2. The second switching signals Qup2, Qun2, Qvp2, Qvn2, Qwp2, and Qwn2 are switching signals for turning Sup2, Sun2, Svp2, Svn2, Swp2, and Swn2 respectively on and off in the second power conversion means 4.

Switching signal generating means 5a, by carrying out pulse width modulation (PWM) based on first voltage commands Vu1, Vv1, and Vw1 output from a voltage command calculation unit 6, outputs switching signals Qup1 to Qwn1 having pulse widths in accordance with Vu1, Vv1, and Vw1. In the same way, the switching signal generating means 5a, by carrying out pulse width modulation (PWM) based on second voltage commands output from the voltage command calculation unit 6, outputs switching signals Qup2 to Qwn2 having pulse widths in accordance with Vu2, Vv2, and Vw2.

The voltage command calculation unit 6 calculates the first voltage commands Vu1, Vv1, and Vw1 and second voltage commands Vu2, Vv2, and Vw2 for driving the alternating current rotating machine 1a, and outputs the voltage commands to the switching signal generating means 5a. V/F control whereby the amplitudes of the first voltage commands and second voltage commands are determined after setting a speed (frequency) command f of the alternating current rotating machine 1a as the control command in FIG. 1, current feedback control whereby a current command of the alternating current rotating machine 1a is set as the control command and, based on the deviation between the control command and currents Iu1, Iv1, and Iw1 flowing through the first three-phase windings, output by first phase current calculation means 8 to be described hereafter, the first voltage commands Vu1, Vv1, and Vw1 and second voltage commands Vu2, Vv2, and Vw2 are calculated by proportional-integral control for adjusting the deviation to zero, or the like, is used as a method of calculating the first voltage commands Vu1, Vv1, and Vw1 and second voltage commands Vu2, Vv2, and Vw2. Note that as V/F control is feedforward control, the first three-phase currents Iu1, Iv1, and Iw1 are not necessary. Therefore, in this case, input of the first three-phase currents Iu1, Iv1, and Iw1 into the voltage command calculation unit 6 is not essential.

First current detection means 7 detects a first bus current Idc1, which is current flowing between the direct current power supply 2 and first power conversion means 3, and outputs the first bus current Idc1 to the first phase current calculation means 8. The first current detection means 7 is configured of a shunt resistor 7a, and a sample and hold instrument 7b that detects the first bus current Idc1 by sampling and holding current flowing through the shunt resistor 7a. A gauge current transformer (CT) may be used instead of the shunt resistor 7a, in which case the first bus current Idc1 is detected by the output voltage of the gauge current transformer being sampled and held by the sample and hold instrument 7b.

Figure 2:
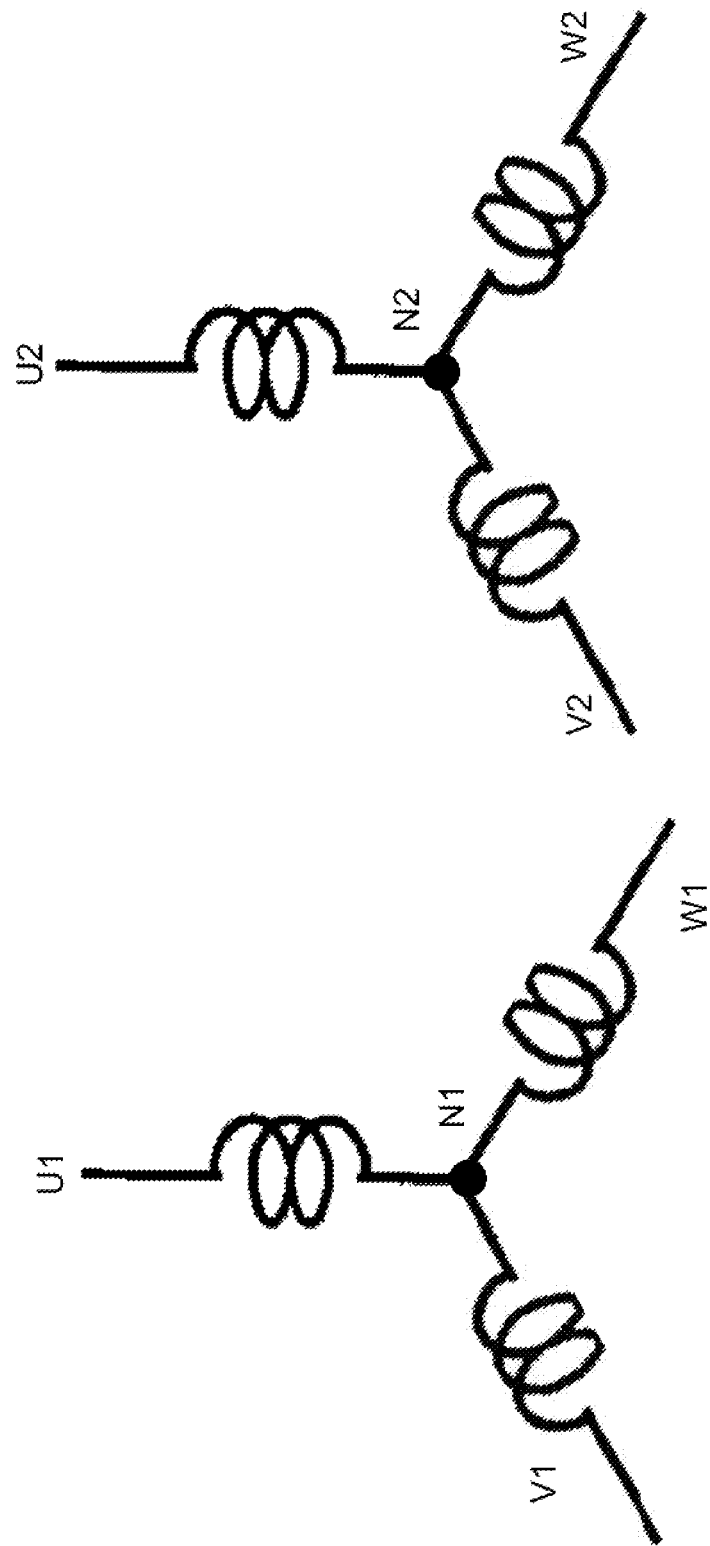
FIG. 2 is a diagram showing phases of first windings and second windings of a stator of an alternating current rotating machine of Embodiment 1.

Continuing, the alternating current rotating machine 1a will be described in detail. As shown in FIG. 2, the alternating current rotating machine 1a is a three-phase alternating current rotating machine wherein the first three-phase windings (multi-phase windings) U1, V1, and W1, connected at a neutral point N1, and second three-phase windings (multi-phase windings) U2, V2, and W2, connected at a neutral point N2, are housed in a stator of the rotating machine without being electrically connected. There is no mechanical phase difference between the U1 winding and U2 winding, the V1 winding and V2 winding, or the W1 winding and W2 winding. Although the two windings are not electrically connected, the windings are magnetically coupled by a magnetic circuit configured by the alternating current rotating machine 1a, in a coupled state exactly like the primary side and secondary side of a transformer. Therefore, an equivalent circuit of the U1 phase and U2 phase disposed in parallel can be represented as in FIG. 3.

Figure 3:
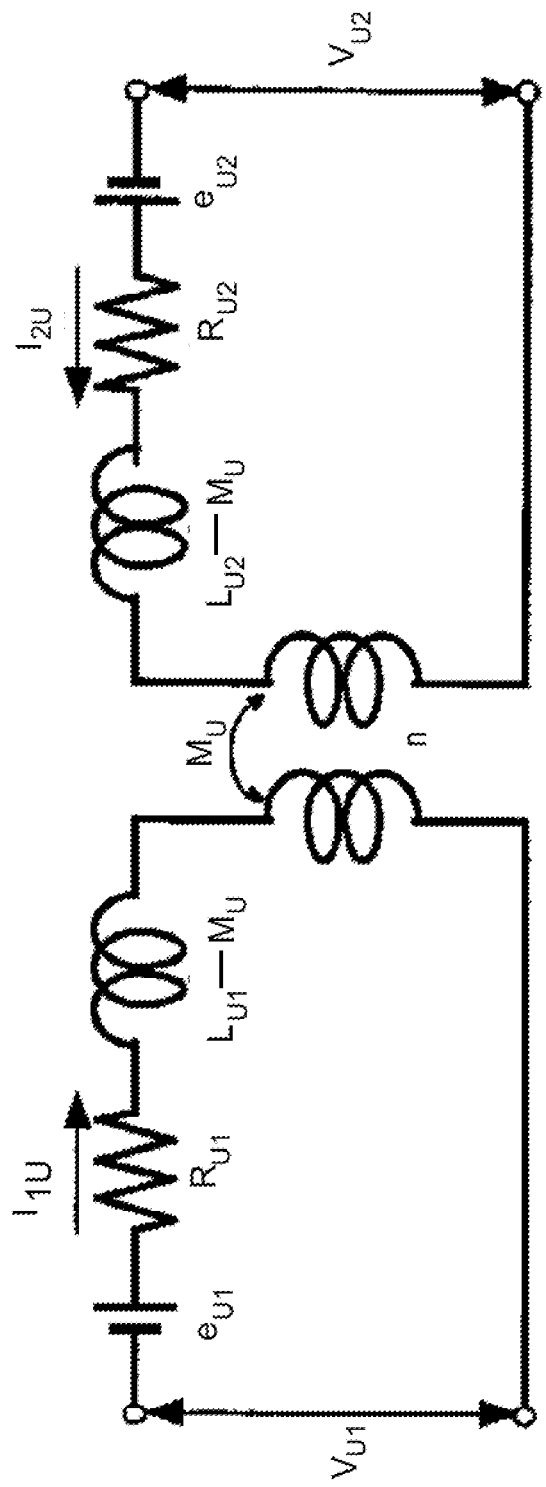
FIG. 3 is a diagram showing an equivalent circuit of the U phase of the stator of the alternating current rotating machine of Embodiment 1.

In FIG. 3, Vu1 and Vu2 represent U phase voltage from the respective neutral points, Ru1 and Ru2 represent armature winding resistance, eu1 and eu2 represent induced voltage, Mu represents armature winding mutual inductance, and Lu1−Mu and Lu2−Mu represent first winding and second winding leakage inductance (armature winding self-inductance-armature winding mutual inductance) respectively. Also, n is what is known as the turn ratio in a transformer. It should be noted that of these values, in particular, Lu1−Mu and Mu, and Lu2−Mu and Mu, unlike interphase (between U and V phases, between V and W phases, or between W and U phases) values used in motor control, are values between two phases in the first three-phase windings and second three-phase windings disposed in parallel.

Also, as parallel windings generally have the same number of turns in an alternating current rotating machine, n=1. Also, in this case, the same also applies in equivalent circuits of the V1 phase and V2 phase and the W1 phase and W2 phase, because of which, even when carrying out coordinate transformation from the three phases on two rotational axes (d-q axes), the equivalent circuits on the two rotational axes (d-q axes) are the same as the equivalent circuit shown in FIG. 3 when the characteristics of the three phases UVW are equal.

Figure 4:
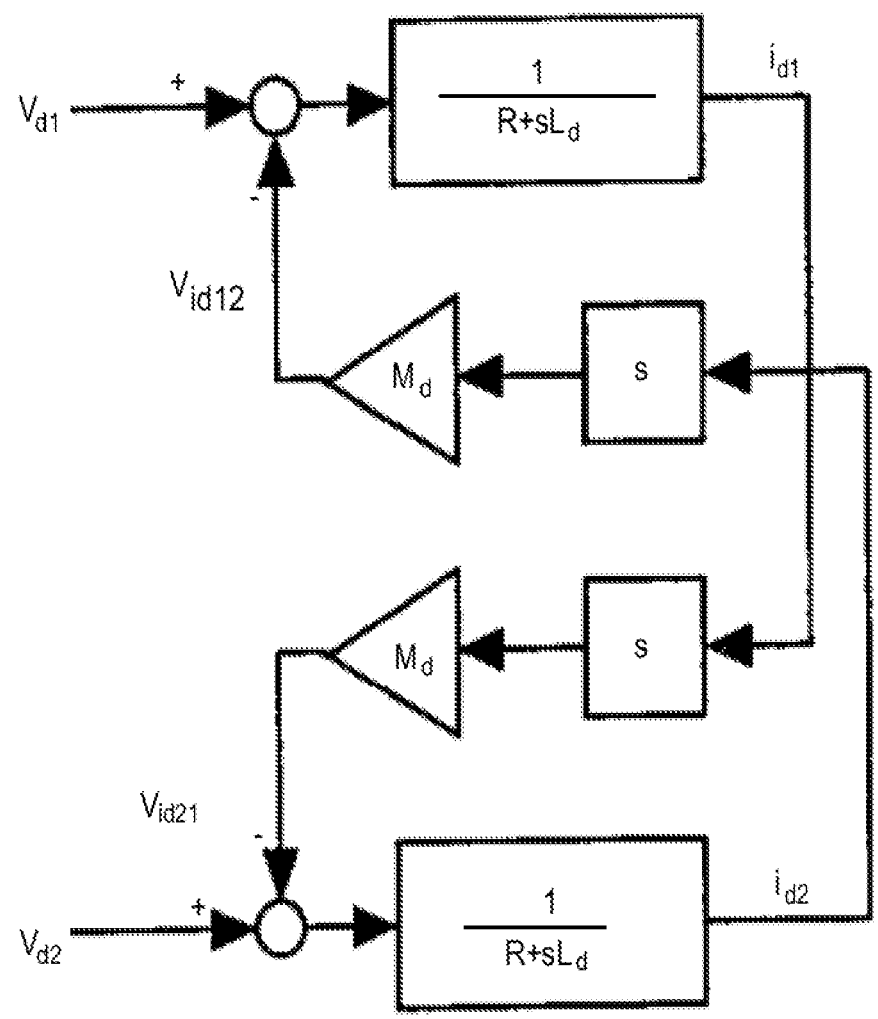
FIG. 4 is a diagram representing in block diagram format a d axis equivalent circuit when the coordinates of equivalent circuits of the stator of the alternating current rotating machine of Embodiment 1 are transformed on two rotational axes (d-q axes).

As the two three-phase windings of the alternating current rotating machine 1a are magnetically coupled, as heretofore described, mutual interference voltage occurs. When the coordinates of the equivalent circuits of the three phases UVW of the alternating current rotating machine 1a are transformed on the two rotational axes (d-q axes), the circuit configuration of each phase is the same as in FIG. 3, as heretofore described, but the d axis equivalent circuit represented in block diagram format is shown in FIG. 4. In the drawing, Vd1 and Vd2 are d axis voltages for the first and second three-phase windings respectively, and Id1 and Id2 are d axis currents for the first and second three-phase windings respectively. Also, voltages represented by Vid12 and Vid21 in the drawing indicate interference voltage from another winding group.

In the drawing, s represents a Laplace transform differential operator, R represents armature winding resistance, Ld represents d axis self-inductance, and Md represents d axis mutual inductance. FIG. 4 represents the equivalent circuit of the d axis of the two rotational axes (d-q axes), but the equivalent circuit on the q axis is also of the same configuration, and is shown in block diagram format in FIG. 5. In the drawing, Vq1 and Vq2 are q axis voltages for the first and second three-phase windings respectively, eq1 and eq2 are induced voltages, and iq1 and iq2 are q axis currents for the first and second three-phase windings respectively. Also, voltages represented by Viq12 and Viq21 in the drawing indicate interference voltage from another winding group. Lq in the drawing represents q axis self-inductance, and Mq represents q axis mutual inductance.

Next, a description will be given of the relationship between first voltage vectors based on the first switching signals Qup1 to Qwn1 and the first bus current Idc1 and currents Iu1, Iv1, and Iw1 flowing through the first three-phase windings. FIG. 6 shows the relationship between the first switching signals Qup1 to Qwn1 and first voltage vectors, the first bus current, and the currents Iu1, Iv1, and Iw1 flowing through the first three-phase windings. In FIG. 6, Qup1 to Qwn1 are such that the semiconductor switches Sup1 to Swn1 corresponding to Qup1 to Qwn1 are turned on when the value of Qup1 to Qwn1 is 1, while the semiconductor switches Sup1 to Swn1 corresponding to Qup1 to Qwn1 are turned off when the value of Qup1 to Qwn1 is 0.

Next, as the relationship between the turned on semiconductor switches, the voltages Vu1, Vv1, and Vw1 applied to the first windings, and the first voltage vectors is as in FIG. 6, and the relationship is commonly known technology described in, for example, NPL 1 and the like, a detailed description is omitted here. The suffix (1) in the first voltage vectors is provided to indicate a first voltage vector, and provided to distinguish the first voltage vectors from second voltage vectors to be described hereafter. An illustration of the first voltage vectors is as in FIG. 7, wherein V1(1) to V6(1) are vectors having phase differences of 60 degrees each. V1(1) coincides with the U1 phase direction of the first three-phase windings, V3(1) coincides with the V1 phase direction of the first three-phase windings, and V5(1) coincides with the W1 phase direction of the first three-phase windings, while V0(1) and V7(1) are voltage vectors with a magnitude of zero. Also, the relationship between the first switching signals and first voltage vectors and the first bus current is shown in FIG. 6.

The first phase current calculation means 8, based on the first bus current Idc1 and first switching signals Qup1 to Qwn1, outputs the first winding currents Iu1, Iv1, and Iw1 in accordance with the relationship shown in FIG. 6. Herein, in the case of a three-phase three-wire type of rotating machine, a configuration wherein the currents of any two phases of the first winding currents Iu1, Iv1, and Iw1 are calculated and output may be adopted, utilizing the fact that the sum of the currents flowing through the three phases is zero.

Next, a description will be given of the relationship with second voltage vectors based on the second switching signals Qup2 to Qwn2. FIG. 8 shows the relationship between the second switching signals Qup2 to Qwn2 and the second voltage vectors. In FIG. 8, Qup2 to Qwn2 are such that the semiconductor switches Sup2 to Swn2 corresponding to Qup2 to Qwn2 are turned on when the value of Qup2 to Qwn2 is 1, while the semiconductor switches Sup2 to Swn2 corresponding to Qup2 to Qwn2 are turned off when the value of Qup2 to Qwn2 is 0. The relationship between the turned on semiconductor switches, the voltages Vu2, Vv2, and Vw2 applied to the second windings, and the second voltage vectors is as in FIG. 8.

Figure 7:
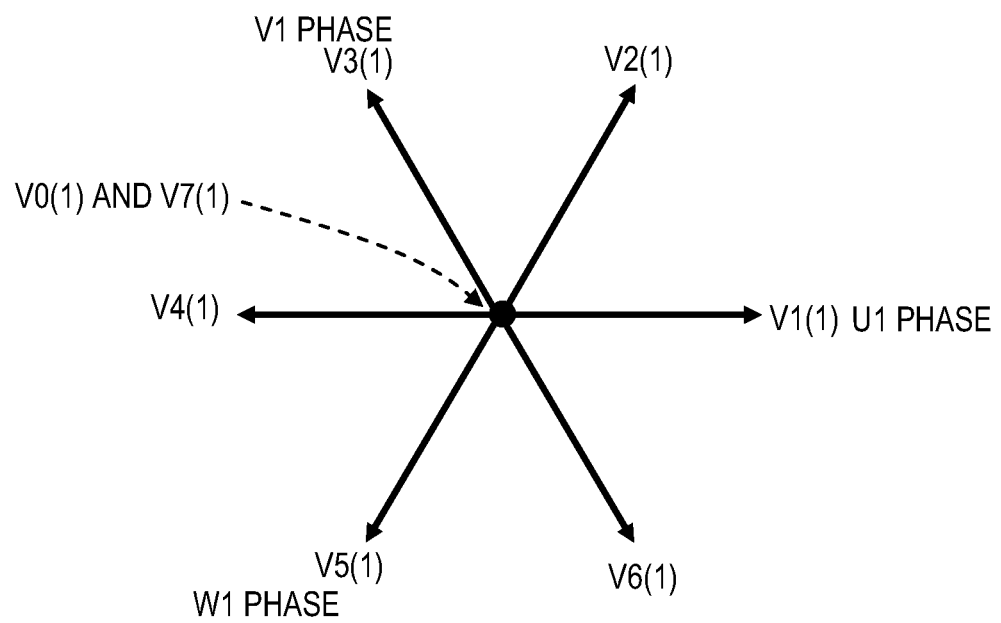
FIG. 7 is a diagram showing the first voltage vectors of Embodiment 1.
Figure 9:
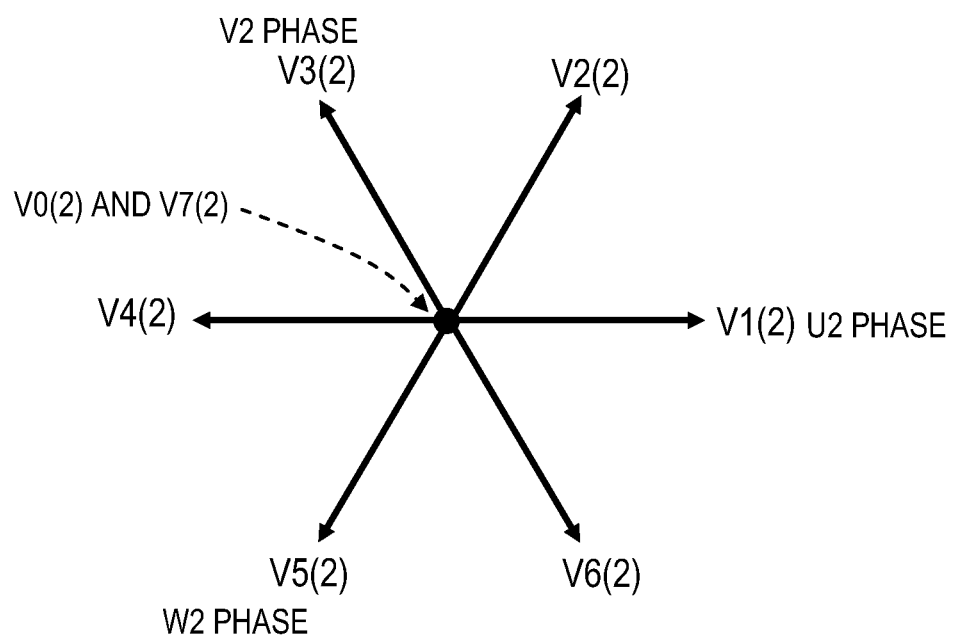
FIG. 9 is a diagram showing the second voltage vectors of Embodiment 1.

An illustration of the second voltage vectors is as in FIG. 9, wherein V1(2) to V6(2) are vectors having phase differences of 60 degrees each. V1(2) coincides with the U2 phase direction of the second three-phase windings, V3(2) coincides with the V2 phase direction of the second three-phase windings, and V5(2) coincides with the W2 phase direction of the second three-phase windings, while V0(2) and V7(2) are voltage vectors with a magnitude of zero. As previously described, the alternating current rotating machine 1a in Embodiment 1 is such that there is no phase difference between the first three-phase windings and second three-phase windings, because of which the relationships between the U1 phase and U2 phase, the V1 phase and V2 phase, and the W1 phase and W2 phase in FIG. 7 and FIG. 9 are such that each pair is in the same phase. Therefore, the relationships between V1(1) and V1(2), V2(1) and V2(2), V3(1) and V3(2), V4(1) and V4(2), V5(1) and V5(2), and V6(1) and V6(2) are also such that each pair is in the same phase. The relationship between these vectors in a same-phase relationship is defined in the invention as "coinciding".

Figure 10:
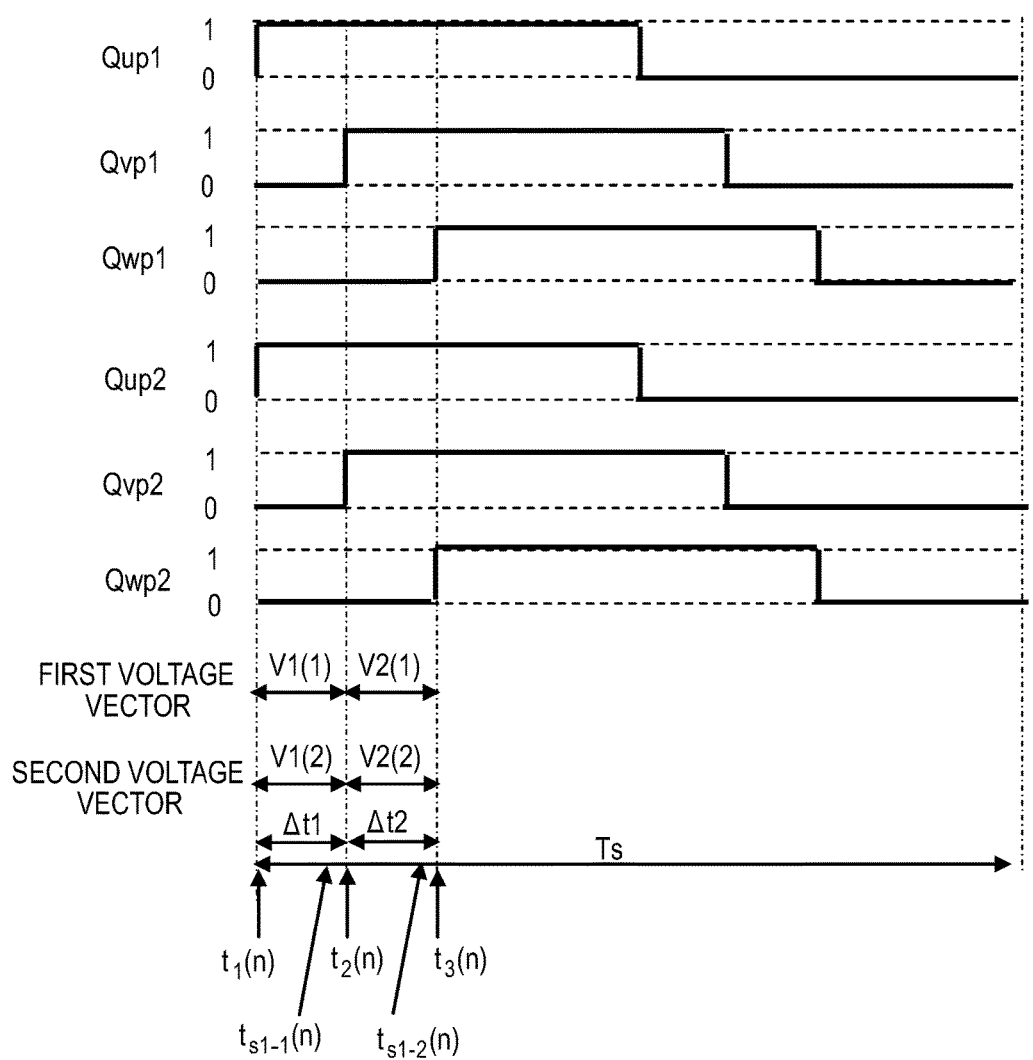
FIG. 10 is an illustration of an operation in a switching signal cycle Is relating to a method of generating the first and second switching signals in switching signal generating means, and to first bus current detection timing in current detection means, of Embodiment 1.

FIG. 10 is an illustration of an operation in a switching signal cycle Ts relating to a method of generating the first switching signals Qup1 to Qwn1 and second switching signals Qup2 to Qwn2 in the switching signal generating means 5a, and to the first bus current Idc1 detection timing in the current detection means 7, of Embodiment 1. As Qun1, Qvn1, Qwn1, Qun2, Qvn2, and Qwn2 are in an inverse (0 when 1, 1 when 0, excepting a dead time period) relationship to Qup1, Qvp1, Qwp1, Qup2, Qvp2, and Qwp2 respectively, as shown in FIG. 6 and FIG. 8, Qun1 to Qwn2 are omitted. Taking Qup1 and Qup2 to be 1 and Qvp1, Qwp1, Qvp2, and Qwp2 to be 0 at a time t1(n), this switching pattern continues until a time t2(n) after the elapse of Δt1 from the time t1(n).

According to FIG. 6 and FIG. 10, the first voltage vector is V1(1) and the second voltage vector V1(2) from the time t1(n) to t2(n), and the first voltage vector and second voltage vector coincide. The first bus current Idc1 is detected at a time ts1−1(n) in the period of the time t1(n) to t2(n). Δt1 is set to a time longer than the sum of dead time of the first power conversion means 3 or second power conversion means 4 and the time needed for the first current detection means 7 to detect the first bus current Idc1 (for example, the time needed for ringing included in the detected waveform to converge, or the time needed for sampling and holding).

According to FIG. 6 and FIG. 10, the first voltage vector is V1(1) from the time t1(n) to t2(n), and Idc1 detected at the time ts1−1(n) is equivalent to the current Iu1 flowing through the U1 phase. Next, taking Qvp1 and Qvp2 to be 1 at the time t2(n), this switching pattern continues until a time t3(n). According to FIG. 6 and FIG. 10, the first voltage vector is V2(1) and the second voltage vector V2(2) from the time t2(n) to t3(n), and the first voltage vector and second voltage vector coincide. The first bus current Idc1 is detected again at a time ts1−2(n) in this period.

In the same way as Δt1, Δt2 is set to a time longer than the sum of dead time of the first power conversion means 3 or second power conversion means 4 and the time needed for the first current detection means 7 to detect the first bus current Idc1. Generally, the setting is such that Δt1=Δt2. According to FIG. 6 and FIG. 10, the first bus current Idc1 detected at the time ts1−2(n) is equivalent to a value −Iw1, wherein the sign of the current flowing through the W1 phase is inverted. Then, Qwp1 and Qwp2 are taken to be 1 at a time t3(n). The pulse widths of Qup1 to Qwp2 (the time for which the value 1 continues) is determined by the first voltage commands Vu1, Vv1, and Vw1 and the second voltage commands Vu2, Vv2, and Vw2, because of which the timings at which Qup1 to Qwp2 become 0 are determined in accordance with the pulse widths.

In this way, in Embodiment 1, the first switching signals and second switching signals are output to the alternating current rotating machine 1a, wherein there is no phase difference between the first windings and second windings, so that two combinations wherein a first voltage vector and second voltage vector coincide, those being V1(1) and V1(2) and V2(1) and V2(2) respectively, are generated from the time t1(n) to t2(n) and t2(n) to t3(n), and the first bus current Idc1 is detected at the timing at which the first voltage vector and second voltage vector coincide.

Hereafter, a description will be given of advantages of the first bus current being detected at the timing at which the first voltage vector and second voltage vector coincide. According to FIG. 6 and FIG. 10, in order to detect the currents Iu1, Iv1, and Iw1 flowing through the first three-phase windings based on the first bus current Idc1, two of the first voltage vectors V1(1) to V6(1), excluding V0(1) and V7(1), need to be output as a combination such that two phases of Iu1, Iv1, and Iw1 can be regenerated from the first bus current Idc1, or three of the first voltage vectors need to be output as a combination such that three phases can be regenerated. As previously described, the time needed for the two or three first voltage vectors and second voltage vectors to be output, each time a vector is output, is equal to or longer than the dead time of the first power conversion means 3 or second power conversion means 4 and the time needed for the first current detection means 7 to detect the first bus current Idc1, and Iu1, Iv1, and Iw1, and Iu2, Iv2, and Iw2, fluctuate during that period.

Figure 11:
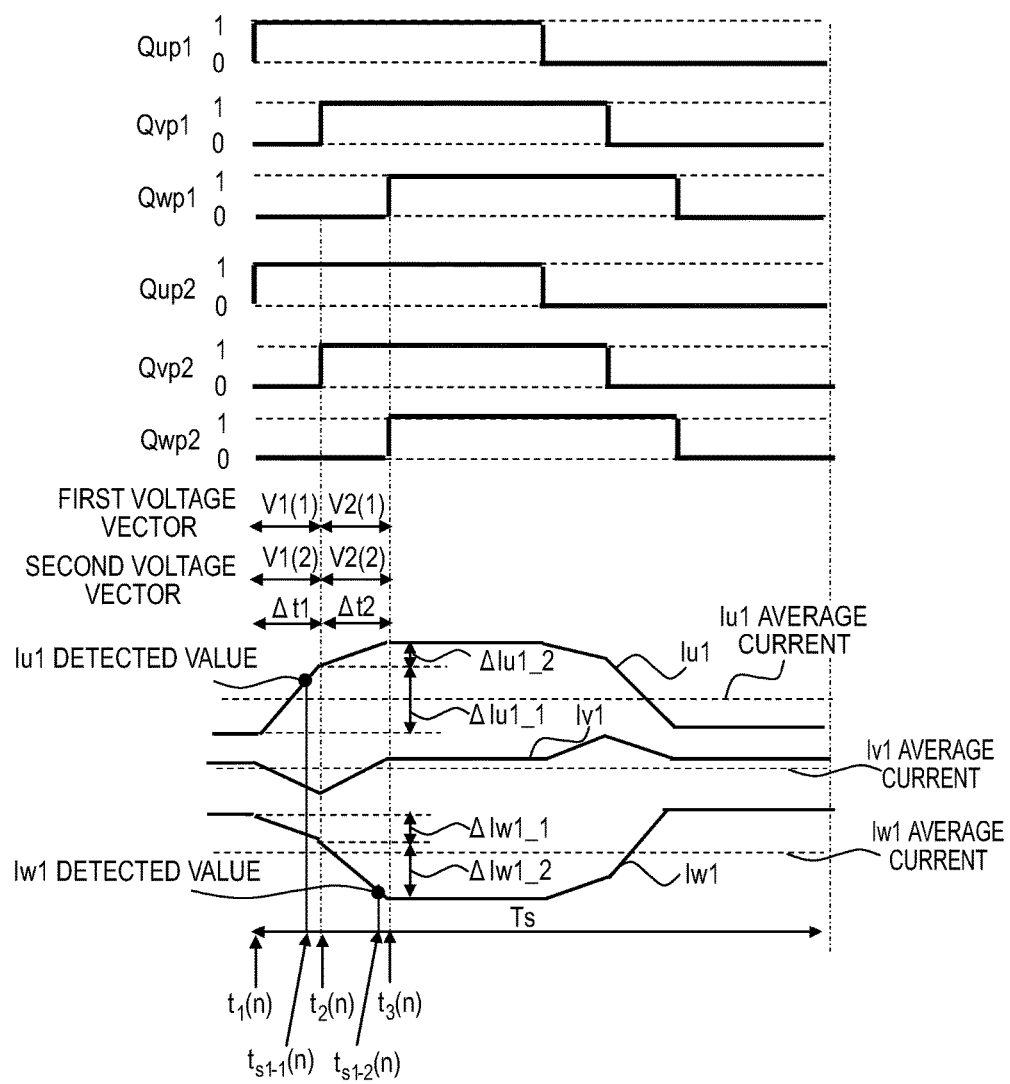
FIG. 11 is a diagram wherein the currents flowing through the first three-phase windings are added to FIG. 10.

FIG. 11 is such that the currents Iu1, Iv1, and Iw1 flowing through the first three-phase windings are added to FIG. 10. According to the drawing, Iu1 fluctuates by ΔIu1_1 and ΔIu1_2 respectively, while Iw1 fluctuates by ΔIw1_1 and ΔIw1_2 respectively, in the periods Δt1 and Δt2. As the average current of Iu1 and the average current of Iw1 do not coincide with the detected value of Iu1 and the detected value of Iw1 respectively, a detection error occurs. As FIG. 11 is an example wherein Iu1 and Iw1 are detected from the first bus current Idc1 as currents flowing through the first three-phase windings, there is no indication regarding fluctuation of Iv1, but Iv1 does fluctuate.

An example wherein a detected current correction value is calculated with respect to the detection error in a detected current correction unit using a formula including an inverter power supply voltage, the duty command value of each phase, motor counter electromotive voltage information, the motor current of each phase detected by a current detector, PWM disposition information, and motor electrical characteristics, and the detected current is corrected to the average current, is shown in PTL 1. However, a large number of operations are necessary when calculating the correction value, because of which there is a problem in that mounting in a low-priced microcomputer is difficult. Furthermore, flux linkage proportionate to a resistance R and counter electromotive voltage EMF of the motor fluctuates due to motor temperature fluctuation, and inductance L of the motor fluctuates due to the effect of magnetic saturation when current is flowing through the winding of the motor. When the motor constants fluctuate in this way, and a discrepancy occurs between the motor constants and motor constants stored by the detected current correction unit, a discrepancy occurs between the difference between the motor current of each phase detected by a current detector and the average motor current and the detected current correction value, and there is a problem in that the motor current of each phase detected by the current detector cannot be corrected to the average motor current. Also, even when adopting a countermeasure so that correction that takes motor constant fluctuation into consideration is performed by the detected current correction unit, a new problem occurs in that further operations are necessary for the countermeasure.

The invention is such that, by the first bus current Idc1 being detected at the timing at which the first voltage vector and second voltage vector coincide, fluctuation of the currents Iu1, Iv1, and Iw1 flowing through the first three-phase windings at that timing can be reduced, because of which the currents Iu1, Iv1, and Iw1 flowing through the first three-phase windings can be obtained accurately, with no need for a correction value to be calculated in a detected current correction unit, as is the case in PTL 1. According to the invention, the Iu1 fluctuation values ΔIu1_1 and ΔIu1_2 can be reduced, and furthermore, the Iw1 fluctuation values ΔIw1_1 and ΔIw1_2 can be reduced in, for example, FIG. 11. Therefore, the Iu1 detected value and Iw1 detected value are values nearer the Iu1 average current and Iw1 average current respectively. The reason for this will be described hereafter.

Herein, although not shown in FIG. 11, the amount of fluctuation in the currents Iu2, Iv2, and Iw2 flowing through the second three-phase windings can also be reduced simultaneously at the timing at which a first voltage vector and second voltage vector coincide. Therefore, the currents Iu2, Iv2, and Iw2 flowing through the second three-phase windings can also be detected accurately by introducing second current detection means that detects a second bus current, which is current flowing between the direct current power supply 2 and second power conversion means 4, and second phase current calculation means. This configuration will be described in a subsequent embodiment.

Figure 12:
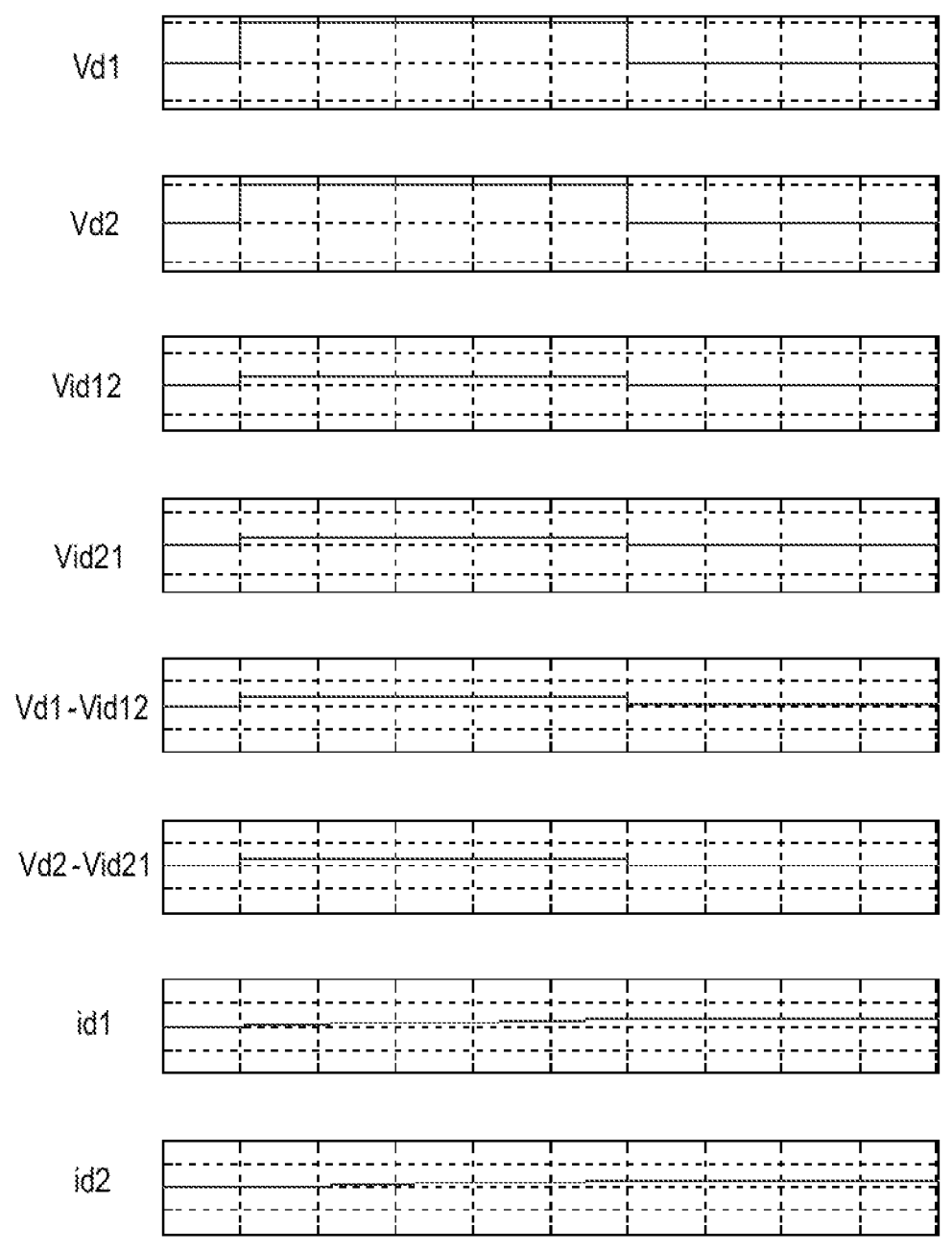
Figure 13:
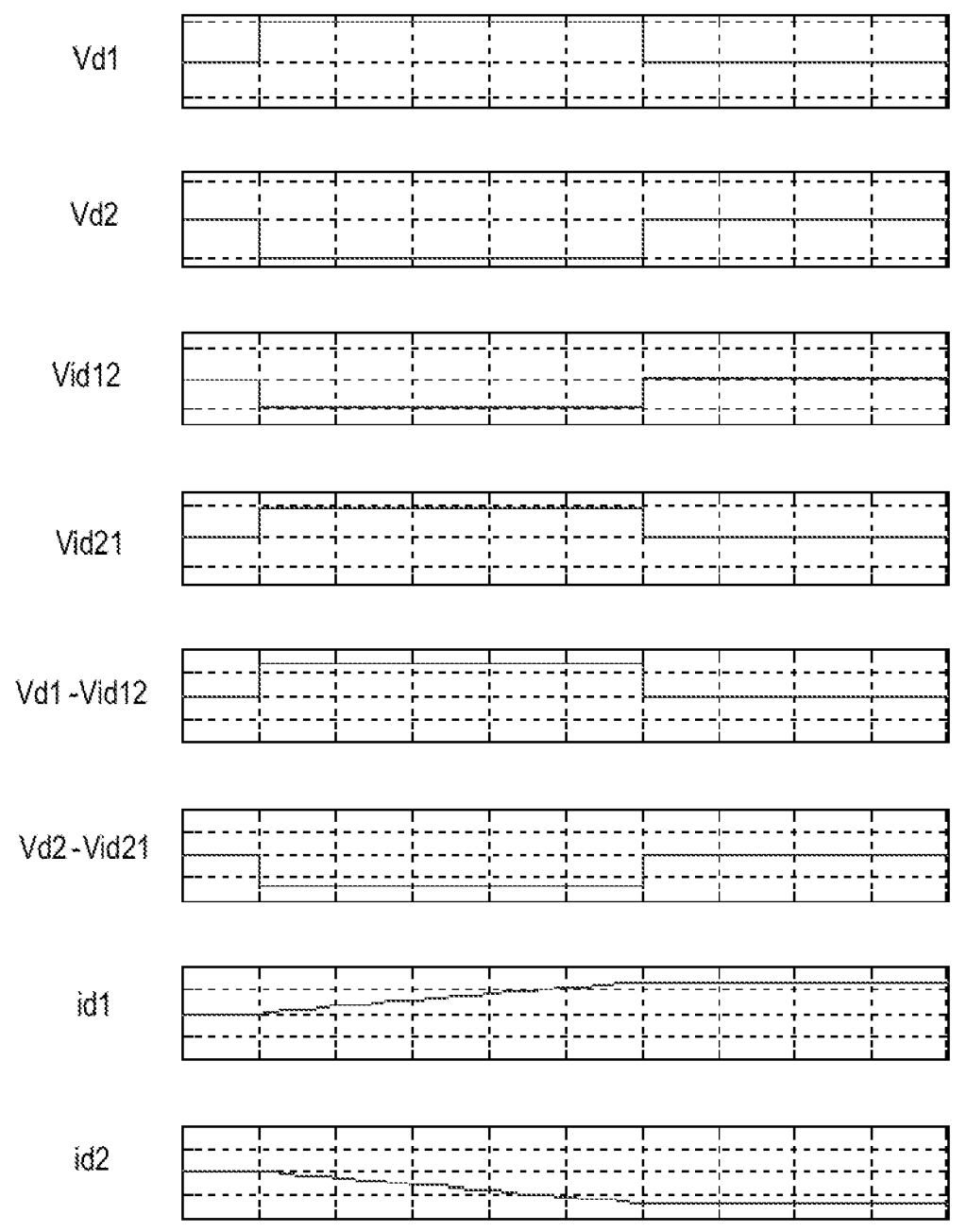

Hereafter, a description will be given of the reason why the amount of fluctuation in the currents Iu1, Iv1, and Iw1 flowing through the first three-phase windings and the currents Iu2, Iv2, and Iw2 flowing through the second three-phase windings decreases at the timing at which a first voltage vector and second voltage vector coincide. FIG. 12 and FIG. 13 show waveforms of each portion when a pulse voltage of a time width sufficiently shorter than an electrical time constant obtained by Ld/R, from the armature winding resistance R and d axis self-inductance Ld of the alternating current rotating machine 1a, is applied to Vd1 and Vd2 in FIG. 4. The horizontal axis represents time. FIG. 12 shows waveforms when step voltages of the same sign and same amplitude are applied to Vd1 and Vd2. Voltage of a positive sign is applied to Vd1 and Vd2, and id1 and id2 attempt to increase in the direction of the positive sign, but as the interference voltages Vid21 and Vid12 based on id1 and id2 are generated in the direction of the positive sign, the interference voltages act in a direction that weakens the applied voltage, Vd1−Vid12 and Vd2−Vid21 input into a primary delay system 1/(R+sLd) decrease in comparison with Vd1 and Vd2 respectively, and the amount of change in id1 and id2 is small in comparison with FIG. 13, to be described hereafter.

FIG. 13 is the same as FIG. 12 with regard to Vd1, while Vd2 is equivalent to −Vd1. In this case, id2 increases in a negative direction due to application of Vd2 in the negative direction, as a result of which Vid12 is generated in the negative direction. Therefore, unlike FIG. 12, the interference voltages act in a direction that strengthens the voltage as described hereafter, and Vd1−Vid12 input into the primary delay system 1/(R+sLd) increases in comparison with Vd1, as a result of which the amount of change in id1 is large. For the same reason, the amount of change in id2 is also large.

Figure 5:
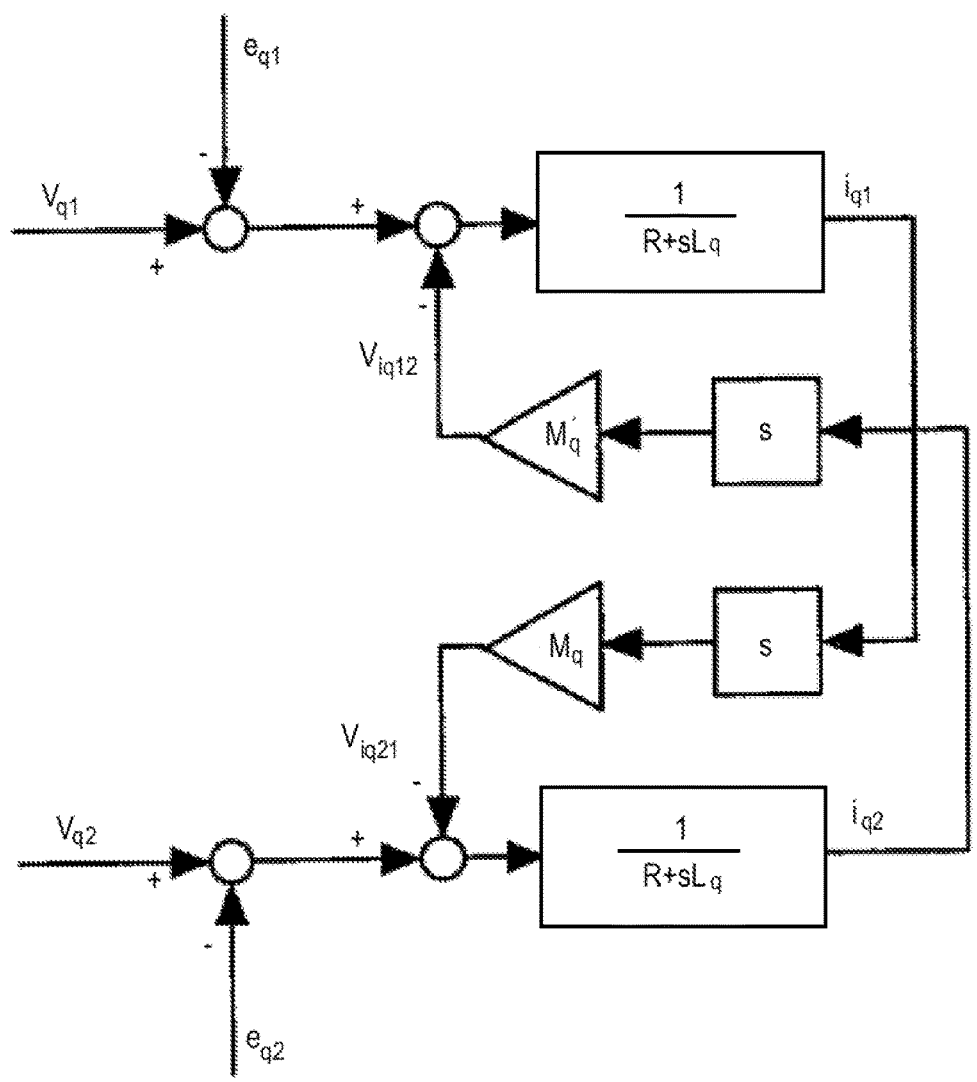
FIG. 5 is a diagram representing in block diagram format a q axis equivalent circuit when the coordinates of equivalent circuits of the stator of the alternating current rotating machine of Embodiment 1 are transformed on the two rotational axes (d-q axes).

Of the two rotational axes (d-q axes), the heretofore described argument relates to the d axis equivalent circuit shown in FIG. 4, but the same can be said for the q axis equivalent circuit shown in FIG. 5. In contrast with the equivalent circuit of FIG. 4, the induced voltages represented by eq1 and eq2 are included in FIG. 5, but the induced voltages are provided by the product of the flux linkage and the rotation speed of the alternating current rotating machine 1a, and the response frequency of the rotation speed is generally sufficiently low in comparison with the electrical time constant of the alternating current rotating machine 1a, because of which, even when a pulse voltage sufficiently smaller than the electrical time constant is applied, as in FIG. 12 and FIG. 13, fluctuation of iq1 and iq2 due to eq1 and eq2 is practically zero, and can be ignored. Therefore, the q axis equivalent circuit of FIG. 5 can be thought of as being equivalent to the d axis equivalent circuit of FIG. 4, and in the same way as the results in FIG. 12 and FIG. 13, the amount of change in iq1 and iq2 decreases when Vq1=Vq2, while the amount of change in iq1 and iq2 increases when the relationship is such that Vq2=−Vq1.

Furthermore, with a d axis direction component V1_d of the first vectors V1 and a d axis direction component V2_d of the second vectors V2 respectively set as the voltages Vd1 and Vd2 applied to the d axis equivalent circuit of FIG. 4, and a q axis direction component V1_q of the first vectors V1 and a q axis direction component V2_q of the second vectors V2 respectively set as the voltages Vq1 and Vq2 applied to the q axis equivalent circuit of FIG. 5, a description will be given of a current amplitude fluctuation (11) with respect to the first three-phase windings, and a current amplitude fluctuation (12) with respect to the second three-phase windings, with respect to phase difference when the phase difference between V1 and V2 is caused to fluctuate from 0 degrees to 180 degrees.

[Math. 1]

$$\sqrt{2(i_{d1}^2 + i_{q1}^2)} \qquad (1\text{-}1)$$

$$\sqrt{2(i_{d2}^2 + i_{q2}^2)} \qquad (1\text{-}2)$$

Figure 15:
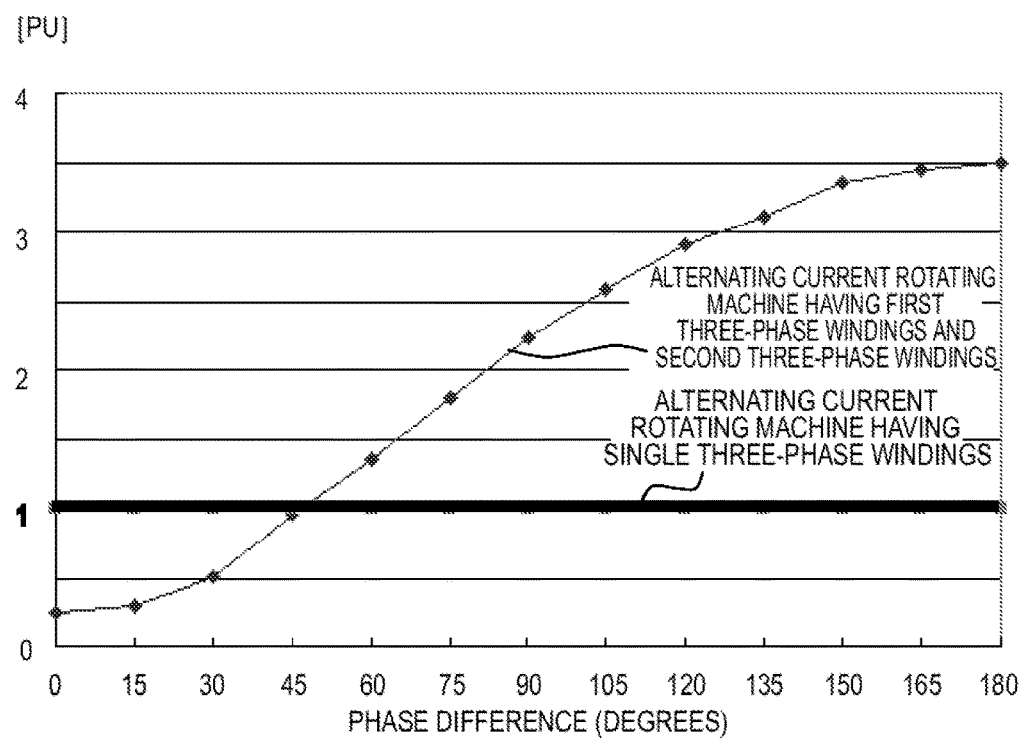
FIG. 15 is a diagram wherein, in Embodiment 1, the horizontal axis represents a phase difference Δθ (degrees), while the vertical axis represents the relative value of the current amplitude fluctuation with respect to the first three-phase windings with respect to that in an alternating current rotating machine having a single three-phase winding.

In FIG. 15, the horizontal axis represents a phase difference Δθ (degrees), while the vertical axis represents the relative value of the current amplitude fluctuation with respect to the first three-phase windings with respect to current amplitude fluctuation in an alternating current rotating machine having a single three-phase winding. In the same way, in FIG. 16, the horizontal axis represents the phase difference Δθ (degrees), while the vertical axis represents the relative value of the current amplitude fluctuation with respect to the second three-phase windings with respect to current amplitude fluctuation in an alternating current rotating machine having a single three-phase winding.

Figure 16:
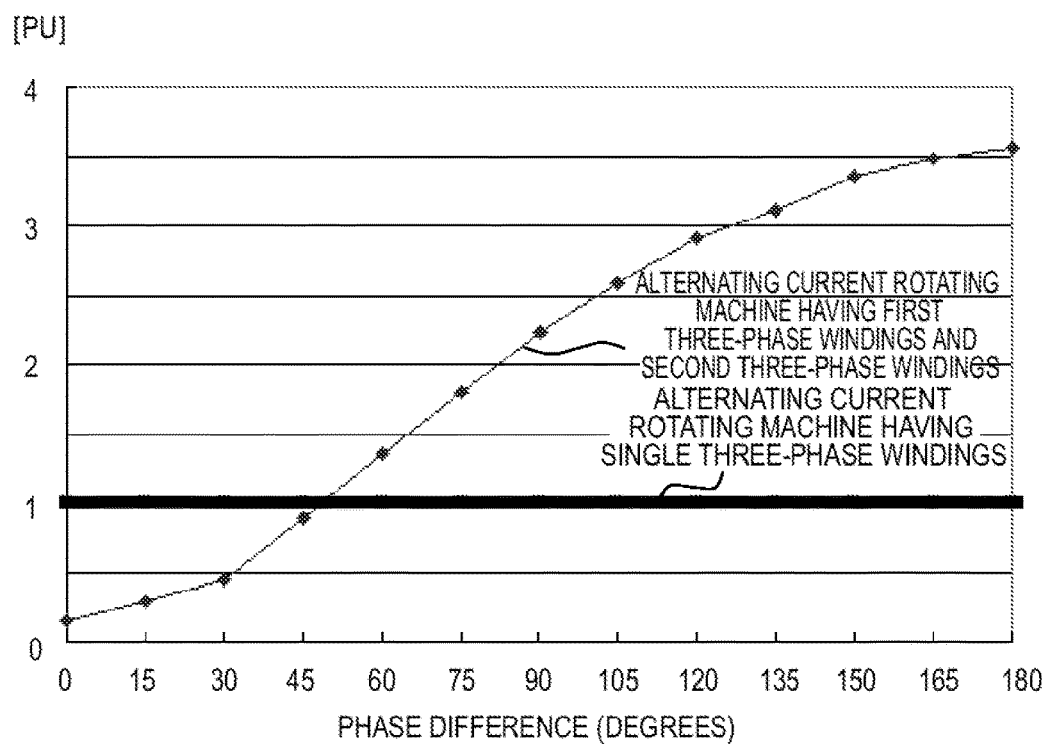
FIG. 16 is a diagram wherein, in Embodiment 1, the horizontal axis represents the phase difference Δθ (degrees), while the vertical axis represents the relative value of the current amplitude fluctuation with respect to second three-phase windings with respect to that in an alternating current rotating machine having a single three-phase winding.
Figure 17:
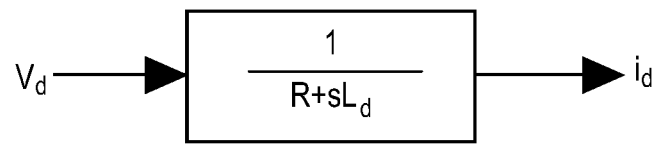
FIG. 17 is a diagram showing a d axis equivalent circuit of an alternating current rotating machine having a single three-phase winding.
Figure 18:
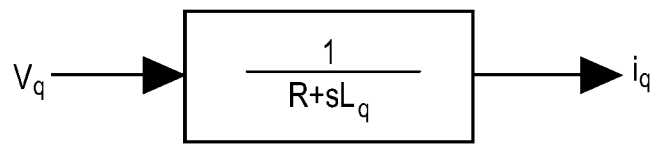
FIG. 18 is a diagram showing a q axis equivalent circuit of an alternating current rotating machine having a single three-phase winding.

In both FIG. 15 and FIG. 16, the current amplitude fluctuation in the alternating current rotating machine having a single three-phase winding is taken, using a per unit method, to be 1(PU). Herein, d axis and q axis equivalent circuits of the alternating current rotating machine having a single three-phase winding are shown in FIG. 17 and FIG. 18 respectively. The configuration is such that applied voltages Vd and Vq are input directly into primary delay systems 1/(R+sLd) and 1/(R+sLq) respectively, and as there is a single three-phase winding, interference voltage does not exist. Note that, as the response frequency of the rotation speed is sufficiently lower than the electrical time constant in FIG. 17 and FIG. 18, speed electromotive force and induced voltage proportional to rotation speed are ignored.

Figure 14:
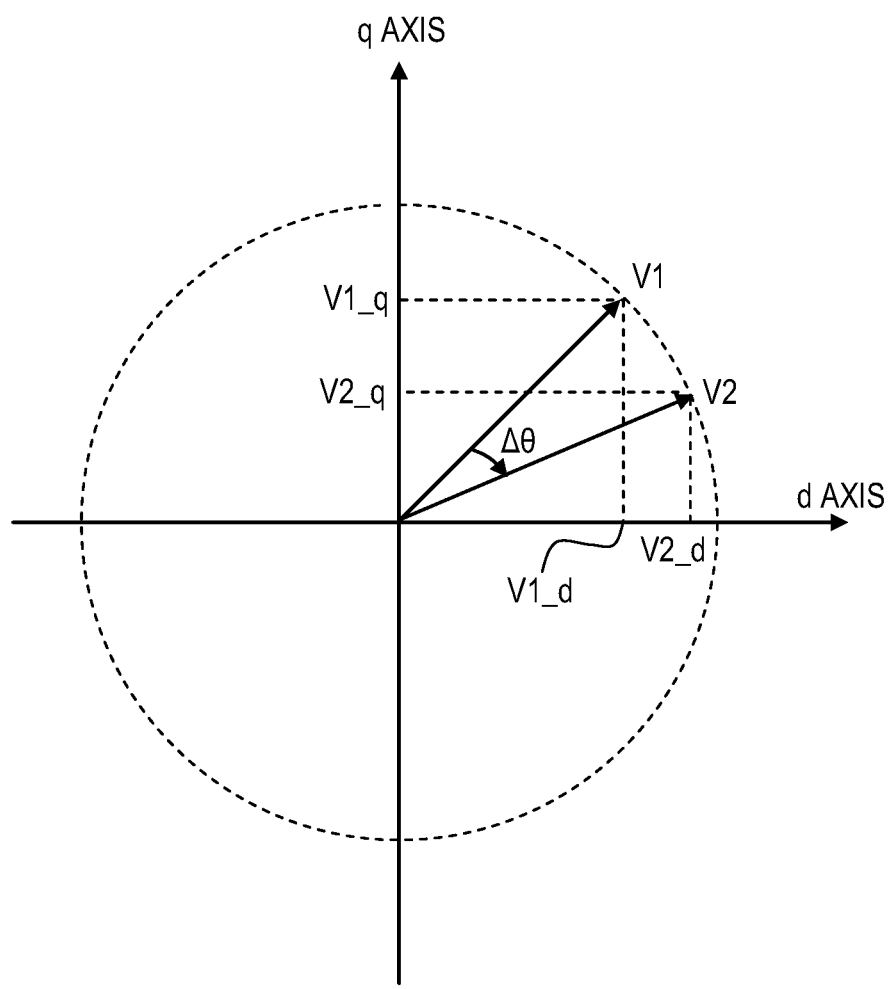
FIG. 14 is a diagram showing a phase difference M between a first vector V1 and second vector V2 in Embodiment 1.

According to FIG. 15 and FIG. 16, the smaller the phase difference Δθ between the first vectors V1 and second vectors V2, the smaller the current amplitude fluctuation of the first three-phase windings and second three-phase windings. This is because the smaller the phase difference Δθ, the nearer the values of V1_d and V2_d, and V1_q and V2_q, shown in FIG. 14, and both the d axis and q axis are such that the interference voltage acts in a direction that weakens the applied voltage. In particular, when the phase difference is 45 degrees or less, the current amplitude fluctuation can be reduced in comparison with that of the alternating current rotating machine having a single three-phase winding, in which the applied voltages are input directly into the primary delay systems, and is at a minimum when the phase difference is 0 degrees. Herein, the previously described case wherein the first voltage vectors and second voltage vectors coincide corresponds to a case wherein the phase difference is 0 degrees in FIG. 14 to FIG. 16.

A time provided for detecting the first bus current Idc1, such as Δt1 or Δt2 shown in FIG. 11, differs depending on the kind of semiconductor switch in the first power conversion means 3 or second power conversion means 4, but is generally from several microseconds to several tens of microseconds, which is sufficiently shorter than the electrical time constant of the alternating current rotating machine 1a. Therefore, the amount of change in the three-phase currents Iu1, Iv1, and Iw1 of the first windings, and the amount of change in the three-phase currents Iu2, Iv2, and Iw2 of the second windings, at Δt1 and Δt2 can also be reduced. For example, in FIG. 11, the fluctuation values ΔIu1_1 and ΔIu1_2 of Iu1 in the period Δt1 in which coinciding vectors are output can be reduced, and furthermore, the fluctuation values ΔIw1_1 and ΔIw1_2 of Iw1 in the period Δt2 can be reduced. Therefore, the detected value of Iu1 and the detected value of Iw1 are such that values near the average current of Iu1 and the average current of Iw1 respectively can be obtained.

In this way, in Embodiment 1, first switching signals and second switching signals are output to an alternating current rotating machine wherein there is no phase difference between first windings (multi-phase windings) and second windings (multi-phase windings), so that at least two combinations wherein a first voltage vector and second voltage vector coincide, those being V1(1) and V1(2) and V2(1) and V2(2) respectively, are generated, and the first bus current Idc1 is detected at the timing at which the first voltage vector and second voltage vector coincide. Therefore, fluctuation of the currents Iu1, Iv1, and Iw1 flowing through the first three-phase windings and fluctuation of the currents Iu2, Iv2, and Iw2 flowing through the second three-phase windings can be reduced, as a result of which the current of the first multi-phase windings of the three-phase alternating current rotating machine can be accurately detected.

In Embodiment 1, the configuration is such that first switching signals and second switching signals are output to an alternating current rotating machine wherein there is no phase difference between first windings (multi-phase windings) and second windings (multi-phase windings), so that at least two combinations wherein a first voltage vector and second voltage vector coincide are generated, but the invention is not limited to this. Even when adopting a configuration wherein the first power conversion means 3 and second power conversion means 4 output first switching signals and second switching signals using commonly known PWM technology such as carrier comparison or space vector modulation, and the first bus current Idc1 is detected at the timing at which a first voltage vector and second voltage vector coincide, fluctuation of Iu1, Iv1, and Iw1 and Iu2, Iv2, and Iw2 is small at the timing in question, and Iu1, Iv1, and Iw1 can be accurately obtained from the first bus current Idc1. Therefore, it is not essential that first switching signals and second switching signals are output so that at least two combinations wherein a first voltage vector and second voltage vector coincide are generated.

Embodiment 2

A description of portions in common with Embodiment 1 will be omitted. Embodiment 2 differs from Embodiment 1 in that a combination wherein a first voltage vector and second voltage vector coincide is generated from the time t3(n) to a time t4(n), in addition to the time t1(n) to t2(n) and the time t2(n) to t3(n), in the switching signal generating means 5a. The first bus current Idc1 is detected at a time ts1-3(n) during the timing at which the first voltage vector and second voltage vector coincide, and whereas two combinations wherein a first voltage vector and second voltage vector coincide are generated in Embodiment 1, three combinations are generated in Embodiment 2.

Figure 19:
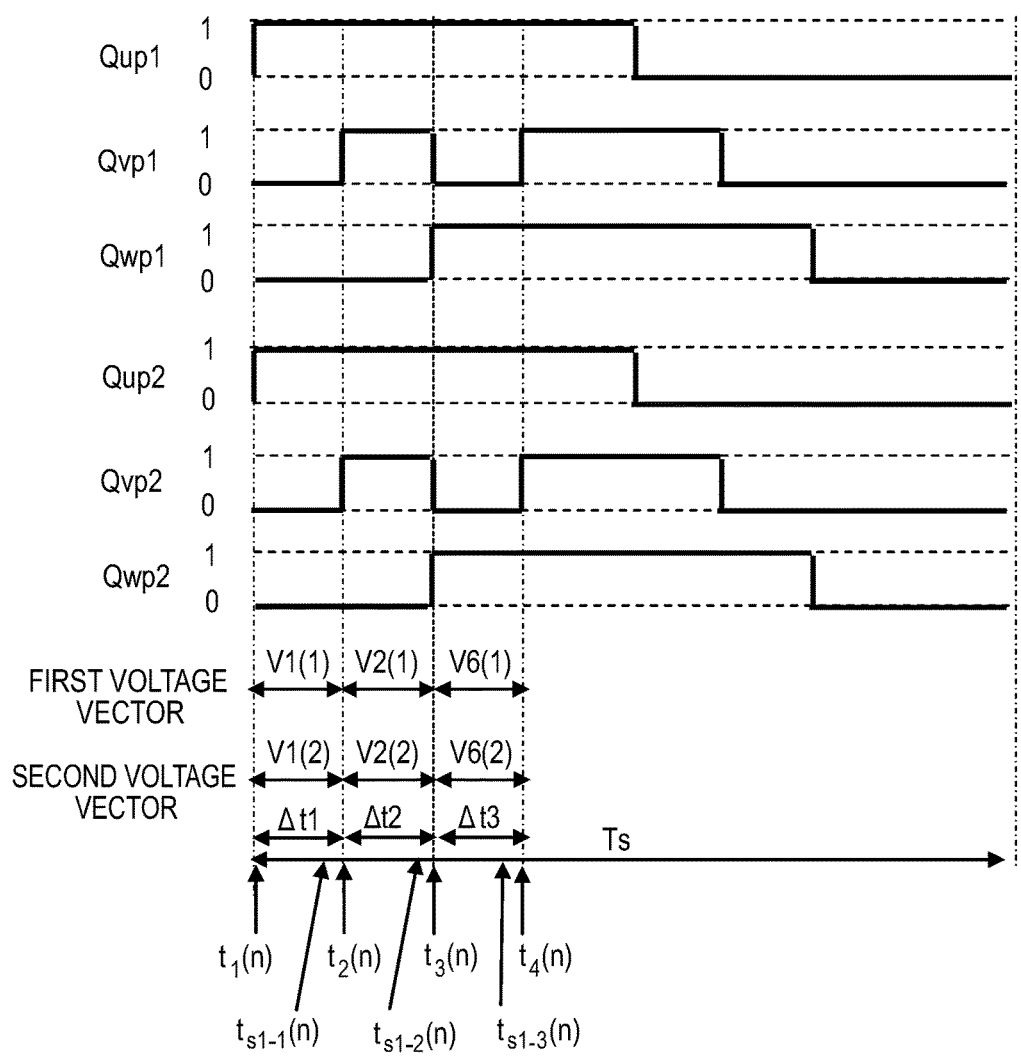
FIG. 19 is a diagram illustrating an operation of switching signal generating means in Embodiment 2.

FIG. 19 is a diagram illustrating an operation of switching signal generating means 5b in Embodiment 2. In FIG. 19, owing to three combinations wherein a first voltage vector and second voltage vector coincide being generated, the first bus current Idc1 is equivalent to Iu1, −Iw1, and −Iv1 from the time t1(n) to t2(n), the time t2(n) to t3(n), and the time t3(n) to t4(n) respectively, because of which an advantage is obtained in that all currents in the first three-phase windings can be detected.

In Embodiment 2, as heretofore described, by three combinations from among the coinciding vectors V1(1) and V1(2), V2(1) and V2(2), V3(1) and V3(2), V4(1) and V4(2), V5(1) and V5(2), and V6(1) and V6(2), wherein Iu1, Iv1, and Iw1 can be detected from the first bus current Idc1 in FIG. 6, being output during the switching cycle Ts, an advantage is obtained in that all currents in the first three-phase windings can be accurately detected. Generation of three or more combinations wherein a first voltage vector and second voltage vector coincide can also be implemented in the same way.

Embodiment 3

A description of portions in common with Embodiments 1 and 2 will be omitted. In Embodiments 1 and 2, a description has been given of an aspect such that two or more combinations wherein a first voltage vector and second voltage vector coincide are generated in each switching cycle Ts, and the first bus current Idc1 is detected at the timing at which the first voltage vector and second voltage vector coincide, but in Embodiment 3, a description will be given of a case wherein the switching cycle Is and a current detection cycle Tc differ, and Tc=n×Ts (n is an integer of 2 or higher). In this case, there being no need to generate a combination wherein a first voltage vector and second voltage vector coincide in each switching cycle Ts, as is the case in Embodiments 1 and 2, it is sufficient that such a combination is generated in the current detection cycle Tc.

Figure 20:
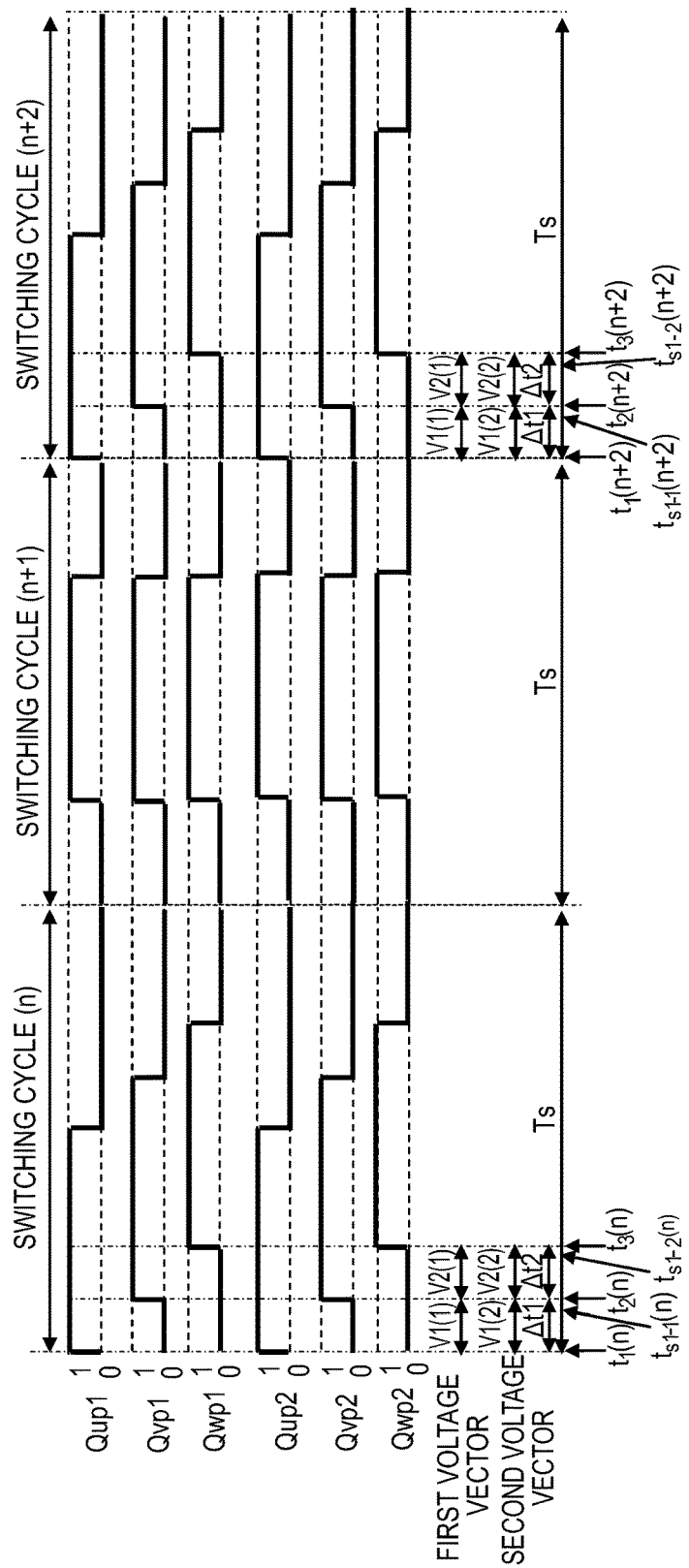
FIG. 20 is a diagram illustrating an operation of switching signal generating means in Embodiment 3.

FIG. 20 is a diagram illustrating an operation of switching signal generating means 5c in Embodiment 3. The diagram shows an example wherein Tc=2×Ts, and an operation the same as that of the switching signal generating means 5a (FIG. 10) is carried out in a switching cycle (n). Next, as no current is detected in a switching cycle (n+1), commonly known switching control technology such as carrier comparison or space vector modulation is used, without a combination wherein a first voltage vector and second voltage vector coincide being generated. Then, in a switching cycle (n+2), two combinations wherein a first voltage vector and second voltage vector coincide are generated in the same way as in the switching cycle (n), and the first bus current Idc1 is detected at a time ts1-1 (n+2) and a time ts1-2 (n+2). The same operation as in the switching cycle (n) is carried out in a switching cycle (n+k1) (k1 is an even number of 4 or higher), and the same operation as in the switching cycle (n+1) is carried out in a switching cycle (n+k2) (k2 is an odd number of 3 or higher). Operations can be implemented in the same way when the switching cycle Ts and current detection cycle Tc are such that Tc=x×Ts (x is an integer of 3 or higher). As heretofore described, an advantage is obtained in that Embodiments 1 and 2 can be implemented even when the current detection cycle Tc and switching cycle Ts differ.

Embodiment 4

Figure 21:
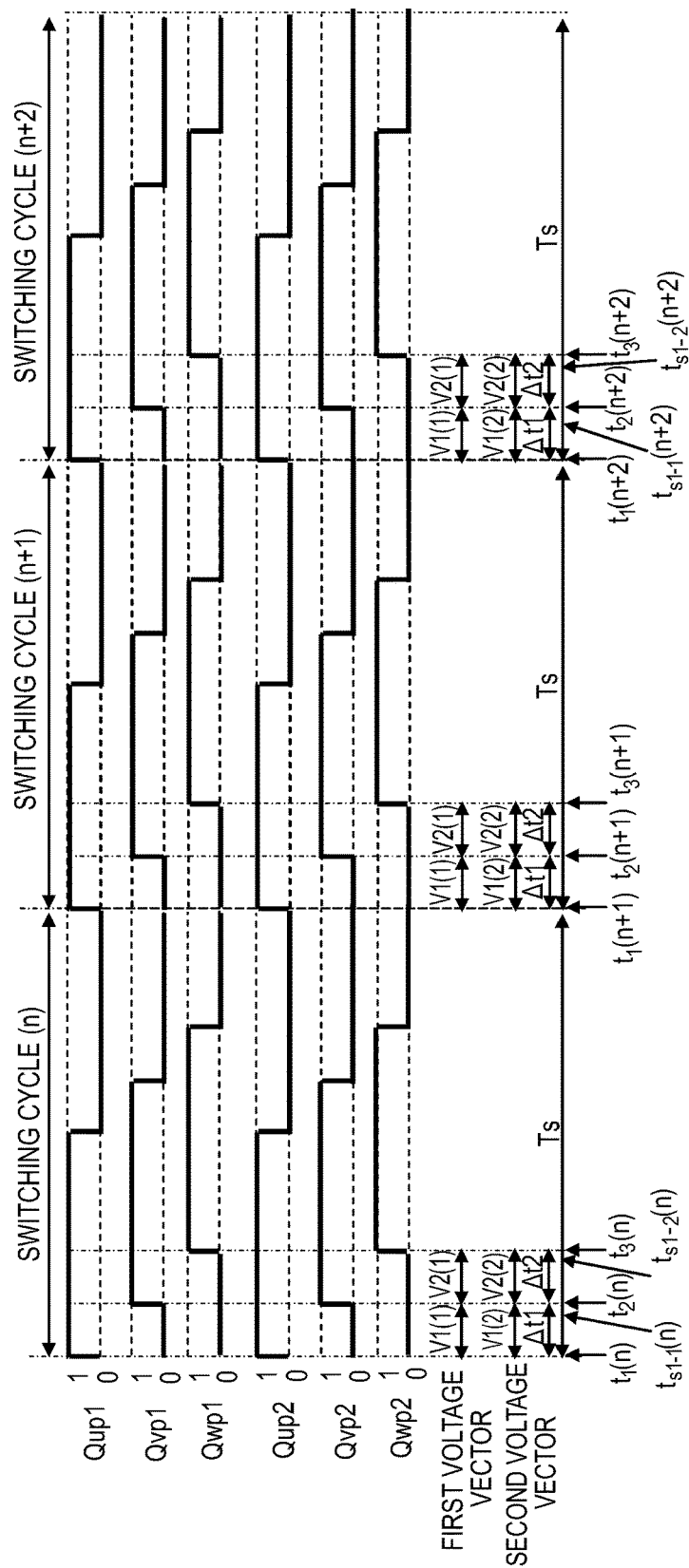
FIG. 21 is a diagram illustrating an operation of switching signal generating means in Embodiment 4.

A description of portions in common with Embodiments 1 to 3 will be omitted. In Embodiment 4, when the switching cycle Ts and current detection cycle Tc differ and Tc=n×Ts, two or three combinations wherein a first voltage vector and second voltage vector coincide are generated in each switching cycle Ts. FIG. 21 is a diagram illustrating an operation of switching signal generating means 5d in Embodiment 4. In the drawing, the operations of the switching cycle (n) and switching cycle (n+2) are the same as in FIG. 20. Two combinations wherein a first voltage vector and second voltage vector coincide, those being V1(1) and V1(2) from a time t1(n+1) to t2(n+1) and V2(1) and V2(2) from a time t2(n+1) to t3(n+1), are generated in the switching cycle (n+1), in the same way as in the switching cycle (n) and switching cycle (n+2). The same applies when Tc=x×Ts.

Next, advantages of Embodiment 4 will be described. For example, when the current detection cycle Tc is set to 100 μs and the switching cycle Ts is set to 50 μs (switching frequency 20 kHz), the configuration of Embodiment 3 is such that a combination wherein a first voltage vector and second voltage vector coincide is generated in each current detection cycle Tc (=100 μs). Therefore, despite the switching cycle Ts being 50 μs, a 10 kHz component, which is a reciprocal of Tc (=100 μs), is included in the first switching signals Qup1 to Qwp1 and second switching signals Qup2 to Qwp2, as a result of which voltage having the 10 khz component is applied to the first three-phase windings and second three-phase windings of the alternating current rotating machine 1a, and the 10 kHz component is also included in the currents Iu1, Iv1, and Iw1 flowing through the first three-phase windings and the currents Iu2, Iv2, and Iw2 flowing through the second three-phase windings. Depending on the magnitude of the component, a problem may occur in that 10 khz of noise is generated from the alternating current rotating machine 1a.

However, Embodiment 4 is such that the component of the current detection cycle Tc is almost completely removed from the first switching signals Qup1 to Qwp1 and second switching signals Qup2 to Qwp2 by a combination wherein a first voltage vector and second voltage vector coincide being output in each switching cycle Ts. Therefore, the configuration of Embodiment 4 is such that even when the switching cycle Ts is 50 μs and the current detection cycle Tc is 100 μs, a combination wherein a first voltage vector and second voltage vector coincide is output in each cycle Ts (=50 μs) of the first switching signals Qup1 to Qwp1 and second switching signals Qup2 to Qwp2, because of which the component of the current detection cycle Tc is almost completely removed, and the 10 khz of noise decreases. As heretofore described, an advantage is obtained in that the cycle Tc frequency component noise from the alternating current rotating machine 1a is reduced in comparison with Embodiment 3.

Embodiment 5

Figure 22:
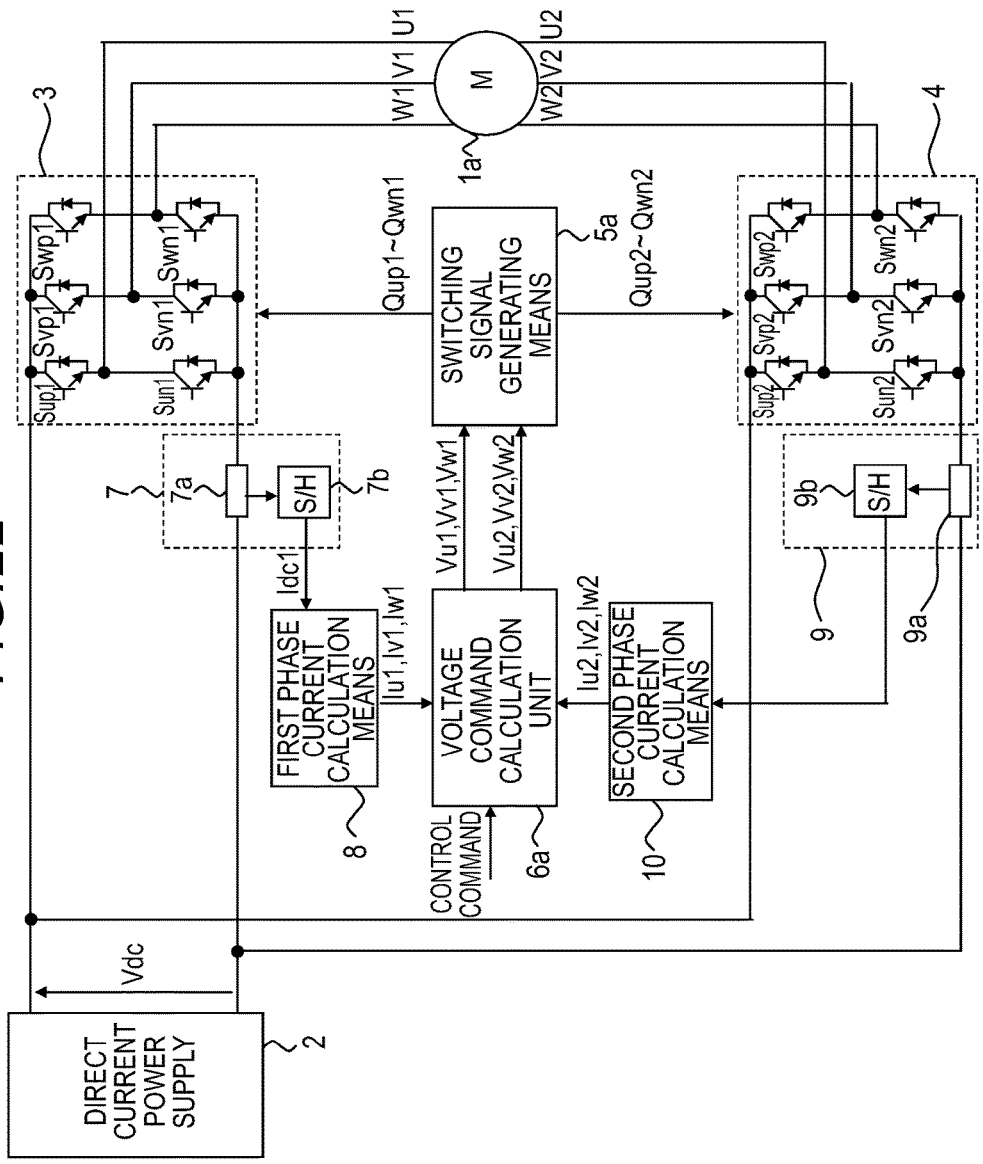
FIG. 22 is a configuration diagram showing the whole of a power conversion device in Embodiment 5.

A description of portions in common with Embodiments 1 to 4 will be omitted. FIG. 22 is a configuration diagram showing the whole of a power conversion device in Embodiment 5. FIG. 23 shows the relationship between the second switching signals Qup2 to Qwn2 and the second voltage vectors, second bus current, and currents Iu2, Iv2, and Iw2 flowing through the second three-phase windings. FIG. 22 differs from the overall configuration of the power conversion device in Embodiment 1 shown in FIG. 1 in that second current detection means 9 and second phase current calculation means 10 are added. The second current detection means 9 detects a second bus current Idc2, which is current flowing between the direct current power supply 2 and second power conversion means 4, and outputs the second bus current Idc2 to the second phase current calculation means 10. The second current detection means 9 is configured of a shunt resistor 9a, and a sample and hold instrument 9b that detects the second bus current Idc2 by sampling and holding current flowing through the shunt resistor 9a. A gauge current transformer (CT) may be used instead of the shunt resistor 9a, in which case the second bus current Idc2 is detected by the detected value of the gauge current transformer being sampled and held by the sample and hold instrument 9b.

The second phase current calculation means 10, based on the second bus current Idc2 and second switching signals Qup2 to Qwn2, outputs the second winding (second three-phase winding) currents Iu2, Iv2, and Iw2 in accordance with the relationship shown in FIG. 23. Herein, in the case of a three-phase three-wire type of alternating current rotating machine, a configuration wherein the currents of any two phases of the second winding currents Iu2, Iv2, and Iw2 are calculated and output may be adopted, utilizing the fact that the sum of the currents flowing through the three phases is zero.

A voltage command calculation unit 6a, in the same way as the voltage command calculation unit 6, calculates the first voltage commands Vu1, Vv1, and Vw1 and second voltage commands Vu2, Vv2, and Vw2 for driving the alternating current rotating machine 1a, and outputs the voltage commands to the switching signal generating means 5a. V/F control whereby the amplitudes of the first voltage commands and second voltage commands are determined after setting a speed (frequency) command f of the alternating current rotating machine 1a as the control command in FIG. 22, current feedback control whereby a current command of the alternating current rotating machine 1a is set as the control command, the first voltage commands Vu1, Vv1, and Vw1 are calculated, based on the deviation between the control command and the currents Iu1, Iv1, and Iw1 flowing through the first three-phase windings output by the first phase current calculation means 8, using proportional-integral control for adjusting the deviation to zero, and the second voltage commands Vu2, Vv2, and Vw2 are calculated, based on the deviation between the control command and the currents Iu2, Iv2, and Iw2 flowing through the second three-phase windings output by the second phase current calculation means 10, using proportional-integral control for adjusting the deviation to zero, is used as a method of calculating the first voltage commands Vu1, Vv1, and Vw1 and second voltage commands Vu2, Vv2, and Vw2. Note that as V/F control is feedforward control, the first three-phase currents Iu1, Iv1, and Iw1 and second three-phase currents Iu2, Iv2, and Iw2 are not necessary. Therefore, in this case, input of the first three-phase currents Iu1, Iv1, and Iw1 and second three-phase currents Iu2, Iv2, and Iw2 into the voltage command calculation unit 6a is not essential.

Next, detection of the second bus current Idc2 in the second current detection means 9 is such that the second bus current Idc2 is detected at the times ts1-1(n) and ts1-2(n), in the same way as the first bus current Idc1 in FIG. 10, which shows the operation of the switching signal generating means 5a. In this way, in Embodiment 5, first switching signals and second switching signals are output so that at least two combinations wherein a first voltage vector and second voltage vector coincide, those being V1(1) and V1(2) and V2(1) and V2(2), are generated from the times t1(n) to t2(n) and t2(n) to t3(n) respectively, and the first bus current Idc1 and second bus current Idc2 are detected at the timing at which the first voltage vector and second voltage vector coincide.

Hereafter, a description will be given of advantages of the second bus current being detected at the timing at which the first voltage vector and second voltage vector coincide. As described in Embodiment 1, the amount of change in the currents Iu1, Iv1, and Iw1 flowing through the first three-phase windings, and the amount of change in the currents Iu2, Iv2, and Iw2 flowing through the second three-phase windings, in Δt1 or Δt2 is smallest when Vd1 and Vd2 coincide and Vq1 and Vq2 coincide. Therefore, first switching signals and second switching signals are output, and the currents Iu2, Iv2, and Iw2 flowing through the second three-phase windings can be accurately detected at the timing at which the first voltage vector and second voltage vector coincide.

Also, FIG. 16 shows that, in comparison with an alternating current rotating machine having a single three-phase winding, the current amplitude fluctuation of current flowing through the second three-phase windings is small when the phase difference is 0 degrees, because of which the discrepancy with the average of the currents Iu2, Iv2, and Iw2 flowing through the second three-phase windings, detected at the timing at which coinciding vectors are output, can be reduced.

Also, in Embodiment 5, the configuration is such that first switching signals and second switching signals are output to an alternating current rotating machine wherein there is no phase difference between first windings and second windings, so that at least two combinations wherein a first voltage vector and second voltage vector coincide are generated, but even when adopting a configuration wherein the first power conversion means 3 and second power conversion means 4 output first switching signals and second switching signals using commonly known PWM technology such as carrier comparison or space vector modulation, and the second bus current Idc2 is detected at the timing at which a first voltage vector and second voltage vector coincide, fluctuation of Iu2, Iv2, and Iw2 is small at the timing in question, and Iu2, Iv2, and Iw2 can be accurately obtained from the second bus current Idc2.

As heretofore described, Embodiment 5 is such that, in addition to current flowing through the first three-phase windings of the alternating current rotating machine 1a, current flowing through the second three-phase windings can also be accurately detected by the second current detection means 9 and second phase current calculation means 10 being included. In Embodiment 5, a description has been given of a configuration wherein the second current detection means 9 and second phase current calculation means 10 are added to Embodiment 1, and of advantages thereof, but it goes without saying that a configuration wherein the second current detection means 9 and second phase current calculation means are added can be combined with the configurations of Embodiments 2 to 4.

Embodiment 6

A description of portions in common with Embodiments 1 to 5 will be omitted. Embodiment 6 differs from FIG. 1, which shows the overall configuration of the power conversion device in Embodiment 1, in that the alternating current rotating machine 1a is changed to an alternating current rotating machine 1b, the voltage command calculation unit 6 is changed to a voltage command calculation unit 6b, and the switching signal generating means 5a is changed to switching signal generating means 5e. The voltage command calculation unit 6b, in the same way as the voltage command calculation unit 6, calculates the first voltage commands Vu1, Vv1, and Vw1 and second voltage commands Vu2, Vv2, and Vw2 for driving the alternating current rotating machine 1b, and outputs the voltage commands to the switching signal generating means 5e. As the details are the same as those of the voltage command calculation unit 6, they will be omitted.

Figure 24:
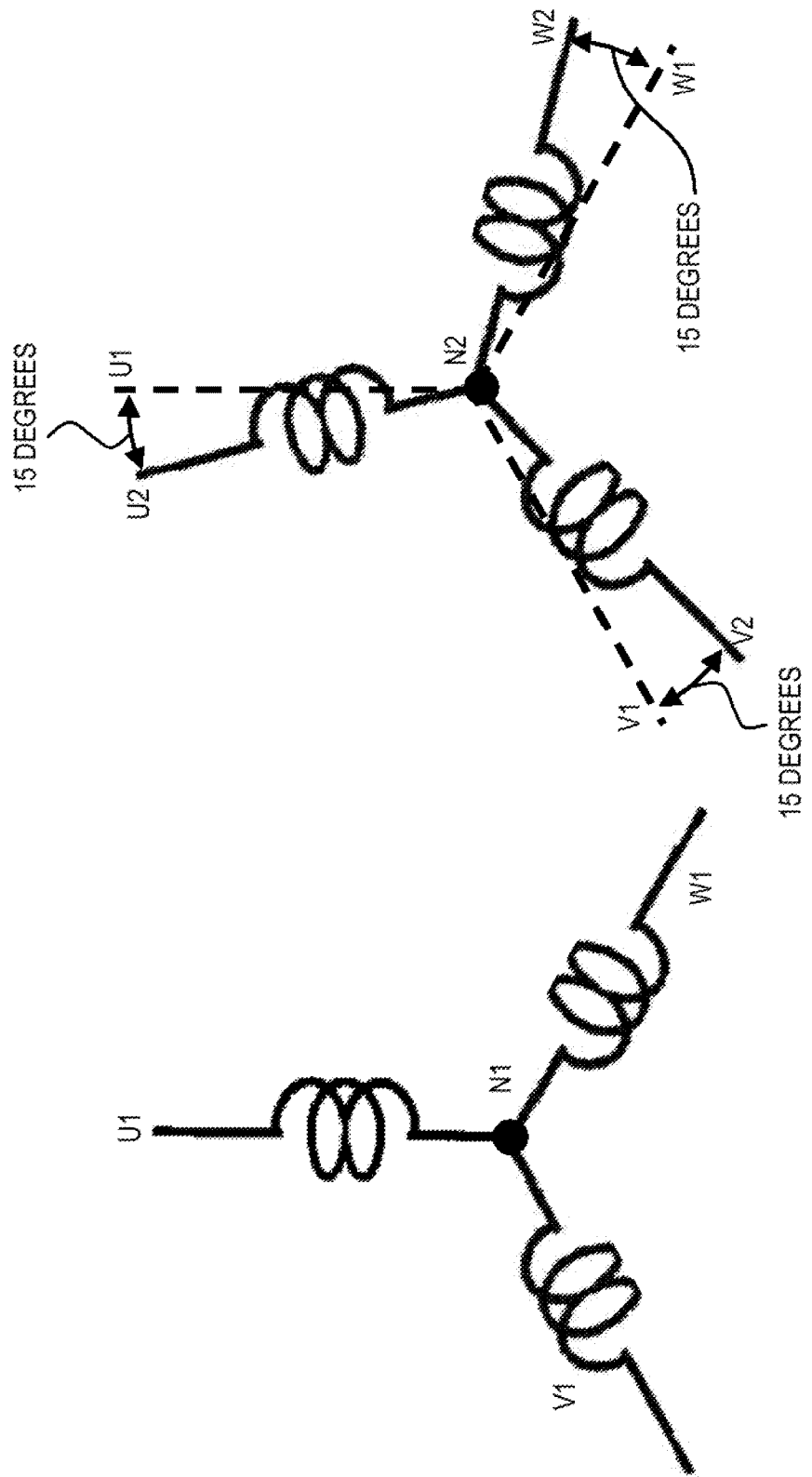
FIG. 24 is a diagram showing the phase difference between first windings and second windings of a stator of an alternating current rotating machine of Embodiment 6.

The alternating current rotating machine 1b differs from the alternating current rotating machine 1a in having a phase difference of an electrical angle of 15 degrees between the U1 winding and U2 winding, V1 winding and V2 winding, and W1 winding and W2 winding, as shown in FIG. 24 (with regard to the phase difference, the first three-phase windings U1, V1, and W1, shown by dotted lines, are shown superimposed on the second three-phase windings U2, V2, and W2, shown by solid lines, in FIG. 24). In this case too, by carrying out coordinate transformation of the first three-phase windings U1, V1, and W1 and second three-phase windings U2, V2, and W2 on the two rotational axes (d-q axes), the alternating current rotating machine 1b becomes equivalent to the alternating current rotating machine 1a described in Embodiment 1.

Herein, as the first three-phase windings U1, V1, and W1 and second three-phase windings U2, V2, and W2 have a phase difference of 15 degrees, it should be noted that, in order to carry out coordinate transformation on common axes, those being the two rotational axes (d-q), when the angle formed with the d axis with the first winding U1 axis as a reference is taken to be θ, it is sufficient that coordinate transformation is carried out in the first three-phase windings U1, V1, and W1 at the angle θ, but it is necessary that coordinate transformation is carried out in the second three-phase windings U2, V2, and W2 at an angle (θ−15).

Therefore, when carrying out coordinate transformation of the first three-phase windings U1, V1, and W1 and second three-phase windings U2, V2, and W2 having a 15 degree phase difference on common axes, those being the two rotational axes (d-q), a d axis equivalent circuit represented in block diagram format can be represented by FIG. 4, while a q axis equivalent circuit represented in block diagram format can be represented by FIG. 5, in the same way as in the case of the alternating current rotating machine 1a. Therefore, in the same way as the alternating current rotating machine 1a, the alternating current rotating machine 1b is such that, with regard to current fluctuation when a pulse voltage sufficiently shorter than the electrical time constant is applied as described in Embodiment 1, the amount of change in current flowing through the first three-phase windings and current flowing through the second three-phase windings decreases when the difference between Vd1 and Vd2 is small and the difference between Vq1 and Vq2 is small.

Figure 25:
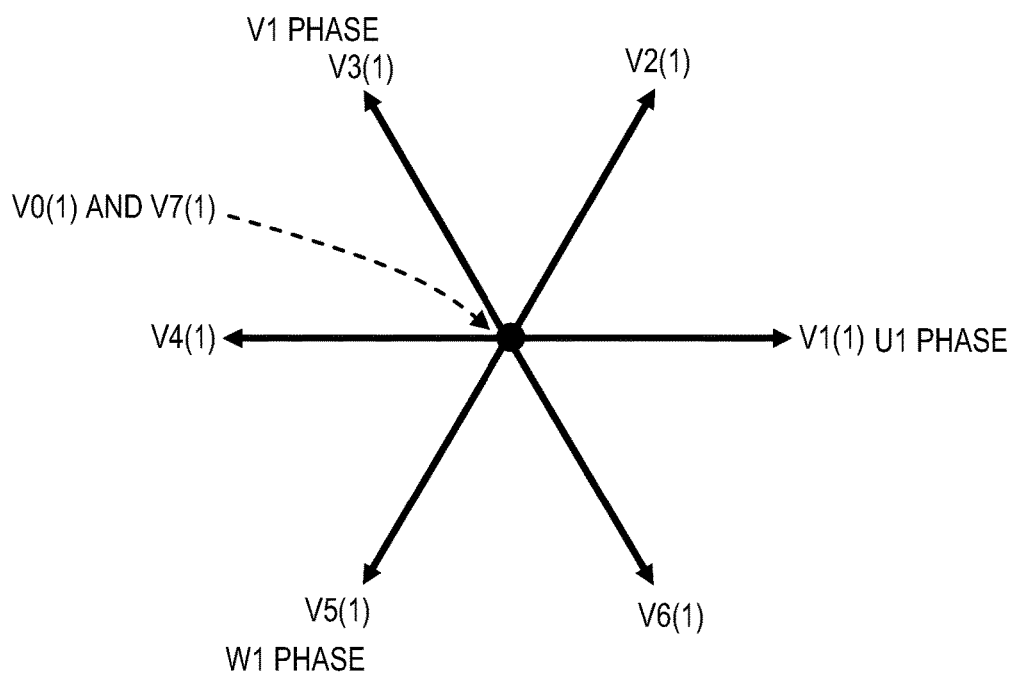
FIG. 25 is a diagram showing first voltage vectors of Embodiment 6.
Figure 26:
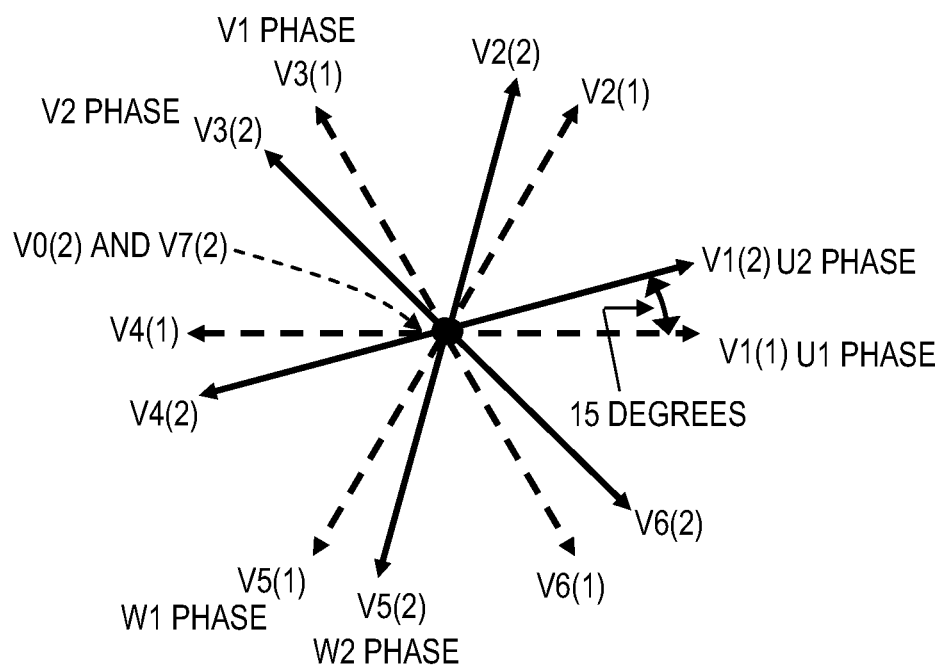
FIG. 26 is a diagram showing second voltage vectors as solid lines and showing the first voltage vectors as broken lines in Embodiment 6.

Next, a description will be given of the relationship between the first voltage vectors and second voltage vectors in Embodiment 6. FIG. 25 shows the first voltage vectors, and this drawing is the same as FIG. 7 described in Embodiment 1. Meanwhile, FIG. 26 shows the second voltage vectors as solid lines, and shows the first voltage vectors as broken lines. Herein, the vectors V0(2) and V7(2) are shown as a black circle at the origin, and although V0(1) and V7(1) also exist at the origin, they are omitted here. As previously described, the alternating current rotating machine 1b has a phase difference of 15 degrees between the first three-phase windings and second three-phase windings, because of which V1(1) and V1(2), V2(1) and V2(2), V3(1) and V3(2), V4(1) and V4(2), V5(1) and V5(2), and V6(1) and V6(2) all have a phase difference of 15 degrees, with V0(1) and V0(2) and V7(1) and V7(2), which have no magnitude, being exceptions.

Herein, the relationship is such that V1(1) has a phase difference of 15 degrees with V1(2), and a phase difference of 45 degrees with V6(2). Therefore, the second voltage vector nearest (having the smallest phase difference with) V1(1) is V1(2). In the same way, the second voltage vectors nearest (having the smallest phase difference with) the first voltage vectors V2(1), V3(1), V4(1), V5(1), and V6(1) are V2(2), V3(2), V4(2), V5(2), and V6(2) respectively. In the invention, the relationship between a first voltage vector and the nearest second voltage vector (the second voltage vector having the smallest phase difference) is defined as neighboring. Therefore, vectors in a neighboring relationship in Embodiment 6 are V1(1) and V1(2), V2(1) and V2(2), V3(1) and V3(2), V4(1) and V4(2), V5(1) and V5(2), and V6(1) and V6(2).

Next, a description will be given of an operation of the switching signal generating means 5e in Embodiment 6. The operation of the switching signal generating means 5e can be illustrated by FIG. 10, in the same way as in Embodiment 1. Two combinations wherein a first voltage vector and second voltage vector are neighboring, those being V1(1) and V1(2) from the time t1(n) to t2(n) and V2(1) and V2(2) from the time t2(n) to t3(n), are generated, and the first bus current Idc1 is detected at the times ts1−1(n) and ts1−2(n) during those timings. Regarding a method of selecting the two neighboring combinations, it is sufficient to select combinations wherein two phases of the first three-phase windings Iu1, Iv1, and Iw1 can be detected from the first bus current Idc1 from among the vectors in a neighboring relationship, those being V1(1) and V1(2), V2(1) and V2(2), V3(1) and V3(2), V4(1) and V4(2), V5(1) and V5(2), and V6(1) and V6(2), referring to FIG. 6. In FIG. 10, Iu1 is detected at the time ts1−1(n), and −Iw1 is detected at the time ts1−2(n).

Hereafter, a description will be given, with regard to the alternating current rotating machine 1b having a 15 degree phase difference between the first three-phase windings and second three-phase windings, of advantages of the first bus current being detected at the timing at which a first voltage vector and second voltage vector are neighboring. As the first voltage vectors and second voltage vectors have a phase difference of 15 degrees, coinciding vectors cannot be output as in Embodiments 1 to 5. Therefore, the d axis component of the first voltage vectors and the d axis direction component of the second voltage vectors, and the q axis component of the first voltage vectors and the q axis direction component of the second voltage vectors, cannot be caused to coincide simultaneously. However, by vectors wherein a first voltage vector and second voltage vector are neighboring being output, the d axis component of the first voltage vectors and the d axis direction component of the second voltage vectors, and the q axis component of the first voltage vectors and the q axis direction component of the second voltage vectors, come closest as values in comparison with when non-neighboring vectors are output, as a result of which current fluctuation while neighboring vectors are output can be reduced furthest.

Figure 27:
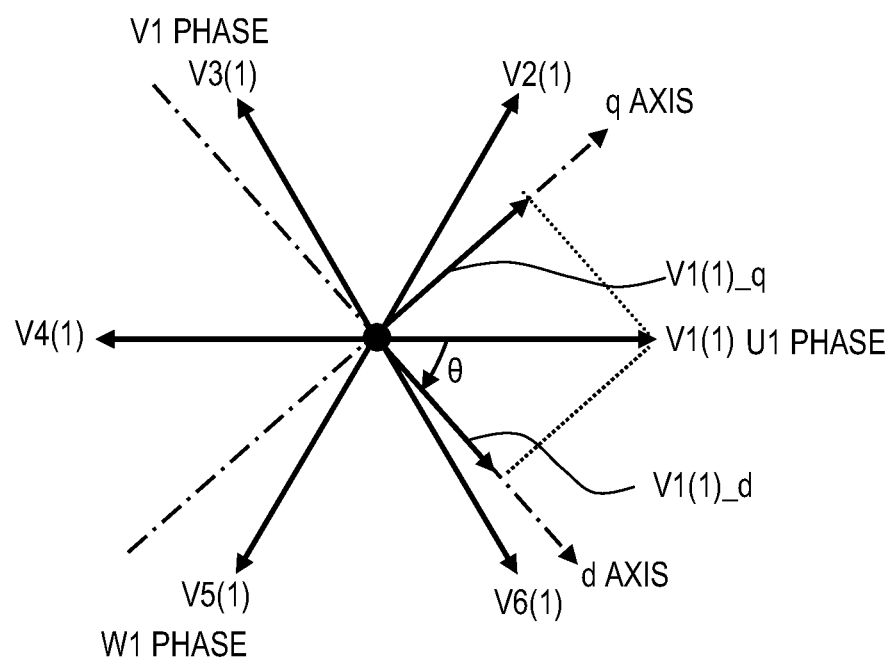
FIG. 27 is a diagram wherein a first voltage vector V1(1) in Embodiment 6 is represented by a d axis direction component V1(1)_d and a q axis direction component V1(1)_q.
Figure 28:
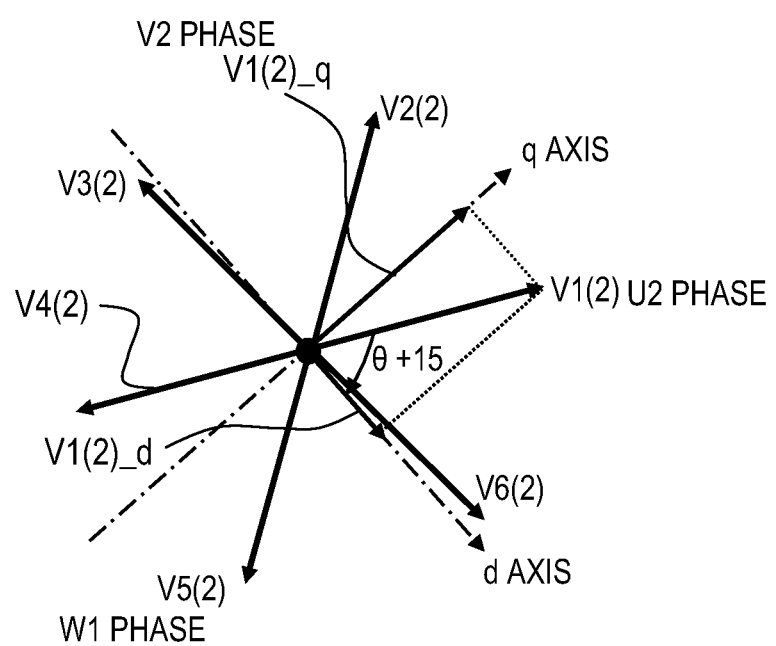
FIG. 28 is a diagram wherein a second voltage vector V1(2) in Embodiment 6 is represented by a d axis direction component V1(2)_d and a q axis direction component V1(2)_q.

In FIG. 27, V1(1) is represented by a d axis direction component V1(1)_d and a q axis direction component V1(1)_q, while in FIG. 28, V1(2) is represented by a d axis direction component V1(2)_d and a q axis direction component V1(2)_q. Note that the angle of the d axis with the U1 phase as a reference is θ. As the U1 phase has a difference of 15 degrees with the U2 phase, the angle of the d axis with the U2 phase as a reference is θ+15. As V1(1) and V1(2) are in a neighboring relationship, the difference between the values of the d axis direction components V1(1)_d and V1(2)_d and the q axis direction components V1(1)_q and V1(2)_q is small in comparison with when V1(1) and V1(2) are in another vector relationship. As a result of this, the amount of change in current flowing through the first three-phase windings and current flowing through the second three-phase windings between the times t1(n) and t2(n) decreases. Herein, according to FIG. 6, the first bus current Idc1 is equivalent to Iu1 when V1(1) is being output as the first voltage vector, because of which Iu1 can be accurately detected.

Figure 29:
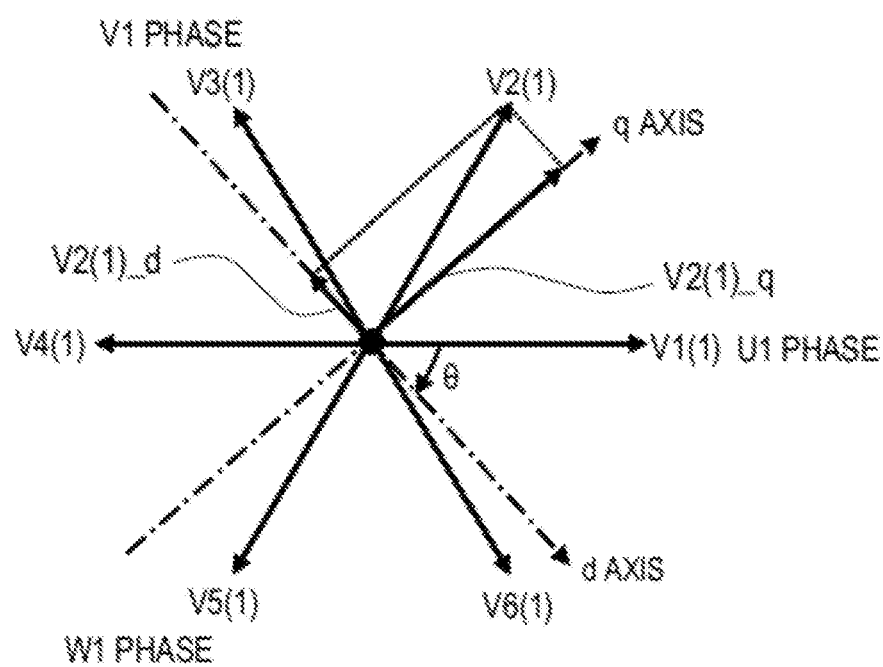
FIG. 29 is a diagram wherein a first voltage vector V2(1) in Embodiment 6 is represented by a d axis direction component V2(1)_d and a q axis direction component V2(1)_q.
Figure 30:
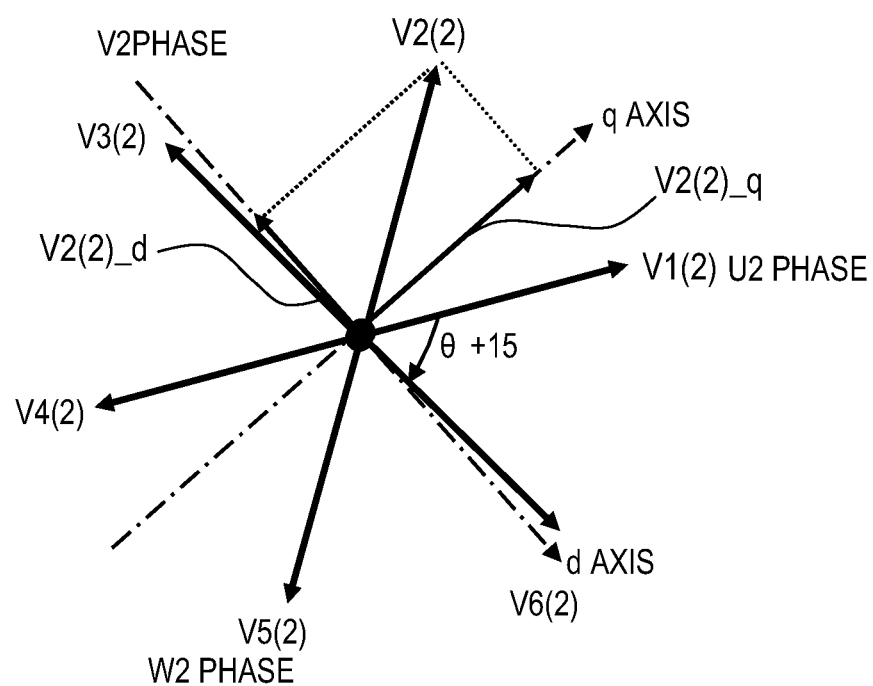
FIG. 30 is a diagram wherein a second voltage vector V2(2) in Embodiment 6 is represented by a d axis direction component V2(2)_d and a q axis direction component V2(2)_q.

In FIG. 29, V2(1) is represented by a d axis direction component V2(1)_d and a q axis direction component V2(1)_q, while in FIG. 30, V2(2) is represented by a d axis direction component V2(2)_d and a q axis direction component V2(2)_q. According to FIG. 29 and FIG. 30, the difference between the values of the d axis direction components V2(1)_d and V2(2)_d and the q axis direction components V2(1)_q and V2(2)_q is small in comparison with when V2(1) and V2(2) are in another vector relationship when V2(1) and V2(2), wherein the first voltage vector and second voltage vector are in a neighboring relationship, are being output. As a result of this, the fluctuation in current flowing through the first three-phase windings and current flowing through the second three-phase windings between the times t2(n) and t3(n) is small. Herein, according to FIG. 6, the first bus current Idc1 is equivalent to −Iw1 when V2(1) is being output as the first voltage vector, because of which Iw1 can be accurately detected.

Therefore, as Iu1 and Iw1 can be accurately detected, Iv1 can be accurately obtained by calculating from a value wherein the sign of the sum of Iu1 and Iw1, both of which have been accurately detected, is inverted, bearing in mind that the sum of the three phases of current in the alternating current rotating machine 1b is zero. Also, FIG. 16 shows that, in comparison with an alternating current rotating machine having a single three-phase winding, the current amplitude fluctuation is also small when the phase difference is 15 degrees, because of which the discrepancy with the average of the currents Iu1, Iv1, and Iw1 flowing through the first three-phase windings, detected at a timing at which neighboring vectors are output, can be reduced.

In this way, in Embodiment 6, the first switching signals and second switching signals are output to an alternating current rotating machine having a 15 degree phase difference between the first windings and second windings, so that two combinations wherein a first voltage vector and second voltage vector are neighboring, those being V1(1) and V1(2) and V2(1) and V2(2), are generated, and the first bus current Idc1 is detected at the timing at which the first voltage vector and second voltage vector coincide. Of the first voltage vectors V1(1) to V6(1) necessary in order to detect the currents Iu1, Iv1, and Iw1 flowing through the first three-phase windings based on the detected first bus current Idc1, two combinations such that two differing phases of Iu1, Iv1, and Iw1 can be regenerated from the first bus current Idc1 are output, whereby fluctuation in Iu1, Iv1, and Iw1 and Iu2, Iv2, and Iw2 during this period can be reduced, and current flowing through the first windings of the three-phase alternating current rotating machine can be accurately detected.

In Embodiment 6, the configuration is such that the first switching signals and second switching signals are output to the alternating current rotating machine 1b having a 15 degree phase difference between the first three-phase windings and second three-phase windings, so that at least two combinations wherein a first voltage vector and second voltage vector are neighboring are generated, but the invention is not limited to this. Even when adopting a configuration wherein the first power conversion means 3 and second power conversion means 4 output first switching signals and second switching signals using commonly known PWM technology such as carrier comparison or space vector modulation, and the first bus current Idc1 is detected at the timing at which a first voltage vector and second voltage vector are neighboring, fluctuation of Iu1, Iv1, and Iw1 and Iu2, Iv2, and Iw2 is small at the timing in question, and Iu1, Iv1, and Iw1 can be accurately obtained from the first bus current Idc1.

It goes without saying that, by referring to the changes between Embodiment 1 and Embodiment 2, a method whereby at least three combinations wherein a first voltage vector and second voltage vector are neighboring are generated can easily be realized for the alternating current rotating machine 1b from Embodiment 6. Also, it goes without saying that, by referring to the changes between Embodiment 1 and Embodiments 3 and 4, an example wherein the current detection cycle Tc and switching cycle differ can easily be realized for the alternating current rotating machine 1b from Embodiment 6. Also, it goes without saying that, by referring to the changes between Embodiment and Embodiment 5, current flowing through the second three-phase windings of the alternating current rotating machine 1b can be detected using the second current detection means 9 and second phase current calculation means 10 in the configuration of Embodiment 6.

Embodiment 7

A description of portions in common with Embodiments 1 to 6 will be omitted. Configurations of Embodiment 7 differing from those of Embodiment 6 are a voltage command calculation unit 6c, an alternating current rotating machine 1c, and switching signal generating means 5f. The voltage command calculation unit 6c, in the same way as the voltage command calculation unit 6, calculates the first voltage commands Vu1, Vv1, and Vw1 and second voltage commands Vu2, Vv2, and Vw2 for driving the alternating current rotating machine 1c, and outputs the voltage commands to the switching signal generating means 5f. As the details are the same as those of the voltage command calculation unit 6, they will be omitted.

Figure 31:
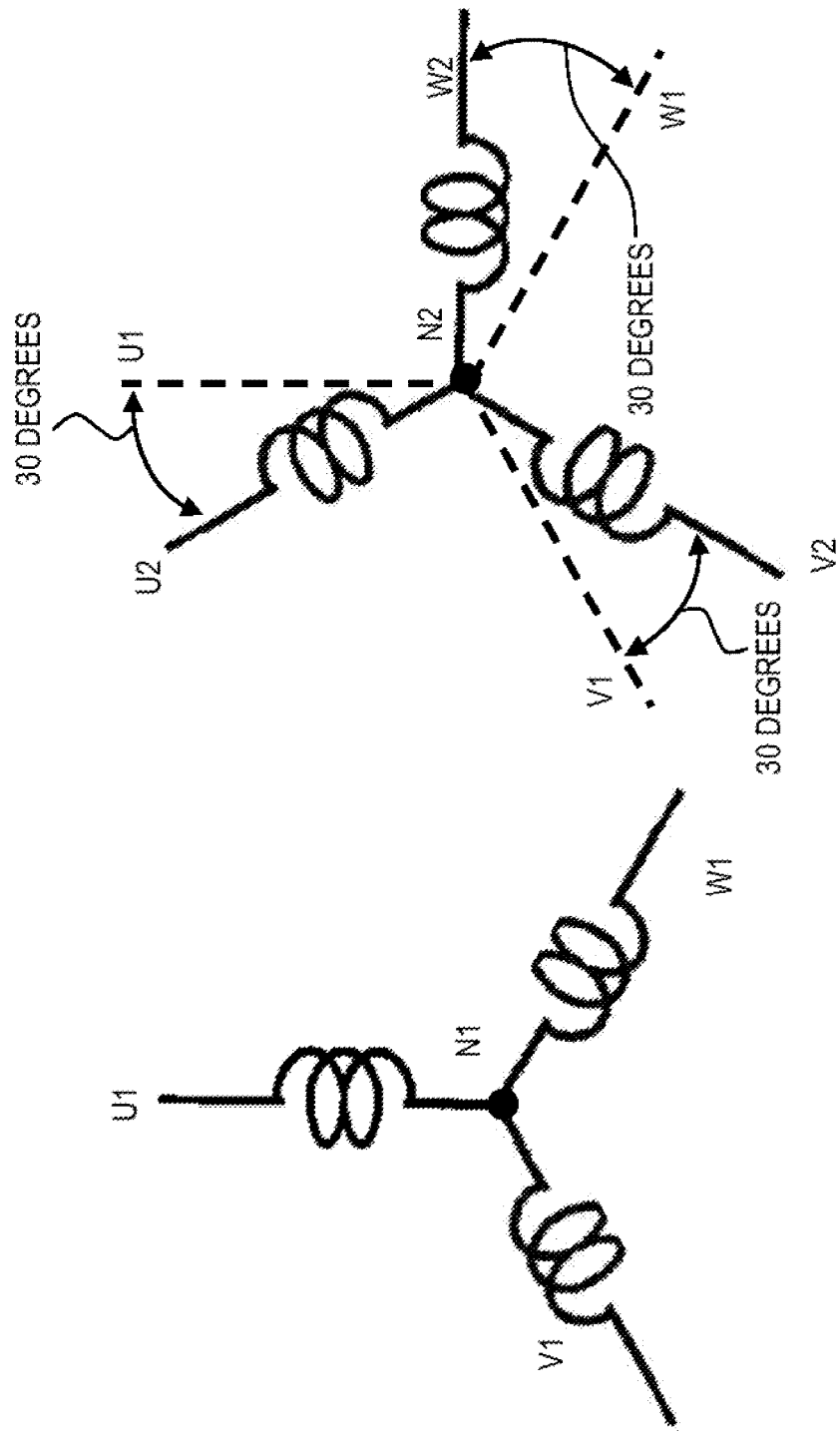
FIG. 31 is a diagram showing the phase difference between first windings and second windings of a stator of an alternating current rotating machine of Embodiment 7.

The alternating current rotating machine 1c differs from the alternating current rotating machine 1b in having a phase difference of 30 degrees between the U1 winding and U2 winding, V1 winding and V2 winding, and W1 winding and W2 winding, as shown in FIG. 31 (with regard to the phase difference, the first three-phase windings U1, V1, and W1, shown by dotted lines, are shown superimposed on the second three-phase windings U2, V2, and W2, shown by solid lines, in FIG. 31). In this case too, by carrying out coordinate transformation of the first three-phase windings U1, V1, and W1 and second three-phase windings U2, V2, and W2 on the two rotational axes (d-q axes), the alternating current rotating machine 1c becomes equivalent to the alternating current rotating machine 1a described in Embodiment 1 or the alternating current rotating machine 1b described in Embodiment 6. Herein, the first three-phase windings U1, V1, and W1 and second three-phase windings U2, V2, and W2 have a phase difference of 30 degrees, because of which, in order to carry out coordinate transformation on common axes, those being the two rotational axes (d-q), when the angle formed with the d axis with the first winding U1 axis as a reference is taken to be θ, it is sufficient that coordinate transformation is carried out on the first three-phase windings U1, V1, and W1 at the angle θ, but it is necessary that coordinate transformation is carried out on the second three-phase windings U2, V2, and W2 at an angle (θ−30).

Therefore, when carrying out coordinate transformation of the first three-phase windings U1, V1, and W1 and second three-phase windings U2, V2, and W2 having a 30 degree phase difference on common axes, those being the two rotational axes (d-q), a d axis equivalent circuit represented in block diagram format can be represented by FIG. 4, while a q axis equivalent circuit represented in block diagram format can be represented by FIG. 5, in the same way as in the case of the alternating current rotating machine 1a and alternating current rotating machine 1b. Therefore, in the same way as the alternating current rotating machine 1a and alternating current rotating machine 1b, the alternating current rotating machine 1c is such that, with regard to current fluctuation when a pulse voltage sufficiently shorter than the electrical time constant is applied as described in Embodiment 1, the amount of change in current flowing through the first three-phase windings and current flowing through the second three-phase windings decreases when the values of Vd1 and Vd2 are near and the values of Vq1 and Vq2 are near.

Figure 32:
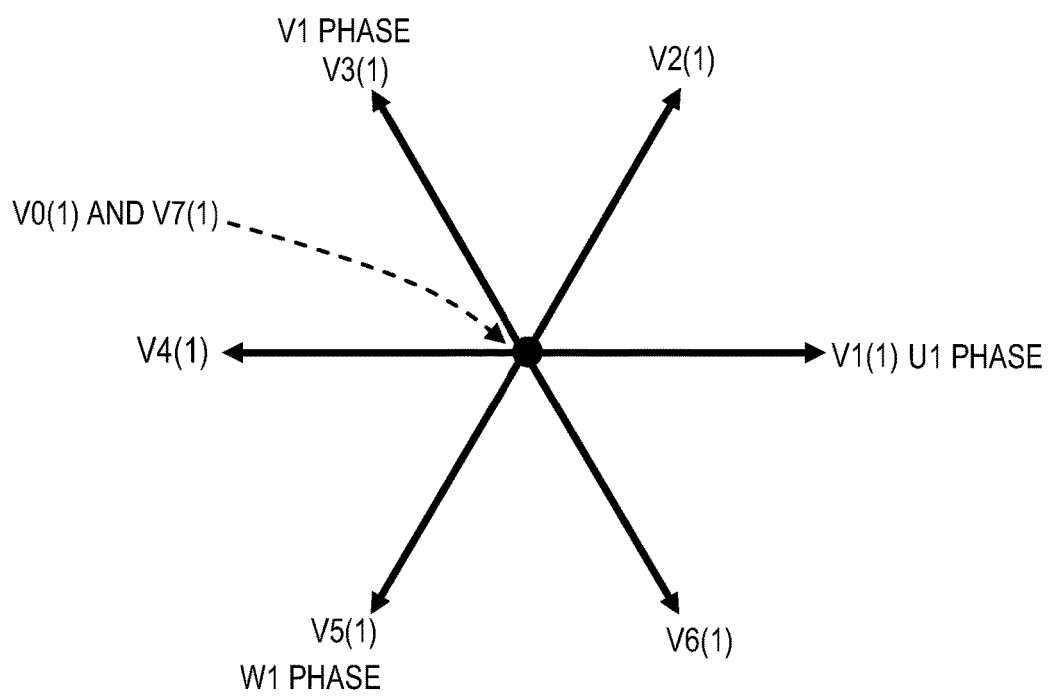
FIG. 32 is a diagram showing first voltage vectors of Embodiment 7.
Figure 33:
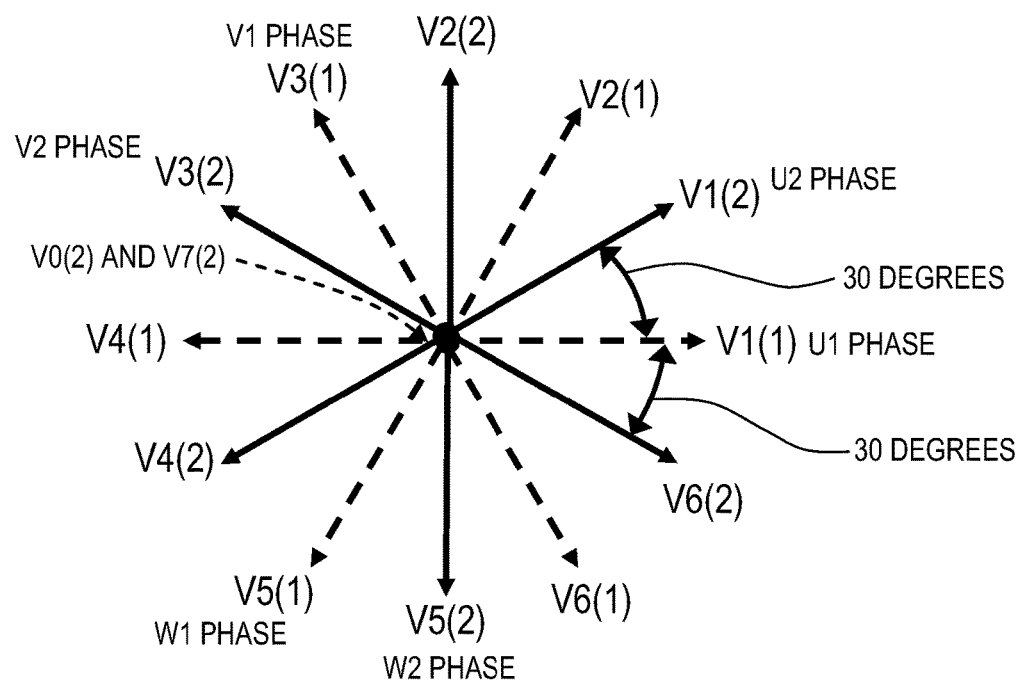
FIG. 33 is a diagram showing second voltage vectors as solid lines and showing the first voltage vectors as broken lines in Embodiment 7.

Next, a description will be given of the relationship between the first voltage vectors and second voltage vectors in Embodiment 7. FIG. 32 shows the first voltage vectors, and this drawing is the same as the drawing described in Embodiment 1. Meanwhile, FIG. 33 shows the second voltage vectors as solid lines, and shows the first voltage vectors as broken lines. Herein, the vectors V0(2) and V7(2) are shown as a black circle at the origin, and although V0(1) and V7(1) also exist at the origin, they are omitted here. As previously described, the alternating current rotating machine 1c in Embodiment 7 has a phase difference of 30 degrees between the first three-phase windings and second three-phase windings, because of which V1(1) has a 30 degree phase difference with V1(2) and V6(2), V2(1) has a 30 degree phase difference with V1(2) and V2(2), V3(1) has a 30 degree phase difference with V2(2) and V3(2), V4(1) has a 30 degree phase difference with V3(2) and V4(2), V5(1) has a 30 degree phase difference with V4(2) and V5(2), and V6(1) has a 30 degree phase difference with V5(2) and V6(2), with V0(1), V0(2), V7(1), and V7(2), which have no magnitude, being exceptions.

In the invention, the second voltage vector nearest (having the smallest phase difference with) a first voltage vector is defined as neighboring, as described in Embodiment 6. It is clear from FIG. 33 that in the alternating current rotating machine 1c, wherein the phase difference between the first three-phase windings and second three-phase windings is 30 degrees, the phase difference between a first voltage vector other than V0(1) and V7(1) and the nearest second voltage vector (the second voltage vector having the smallest phase difference) is 30 degrees. Therefore, neighboring vectors in Embodiment 7 are a combination of a first voltage vector and second voltage vector in the relationship, previously given as an example, of having a 30 degree phase difference.

Next, a description will be given of an operation of the switching signal generating means 5f in Embodiment 7. The operation of the switching signal generating means 5f can be illustrated by FIG. 10, in the same way as in Embodiment 1.

Two combinations wherein a first voltage vector and second voltage vector are neighboring, those being V1(1) and V1(2) from the time t1(n) to t2(n) and V2(1) and V2(2) from the time t2(n) to t3(n), are generated, and the first bus current Idc1 is detected at the times ts1-1(n) and ts1-2(n) during those timings. Regarding a method of selecting the two neighboring combinations, it is sufficient to select combinations wherein two phases of the first three-phase windings Iu1, Iv1, and Iw1 can be detected from the first bus current Idc1 from among the vectors in a neighboring relationship, those being V1(1) with V1(2) and V6(2), V2(1) with V1(2) and V2(2), V3(1) with V2(2) and V3(2), V4(1) with V3(2) and V4(2), V5(1) with V4(2) and V5(2), and V6(1) with V5(2) and V6(2), referring to FIG. 6. In FIG. 10, Iu1 is detected at the time ts1-1(n), and -Iw1 is detected at the time ts1-2(n).

In this way, in Embodiment 7, the first switching signals and second switching signals are output to an alternating current rotating machine having a 30 degree phase difference between the first windings and second windings, so that two combinations wherein a first voltage vector and second voltage vector are neighboring, those being V1(1) with V1(2) or V6(2) and V2(1) with V1(2) or V2(2), are generated, and the first bus current Idc1 is detected at the timing at which the first voltage vector and second voltage vector coincide. Of the first voltage vectors V1(1) to V6(1) necessary in order to detect the currents Iu1, Iv1, and Iw1 flowing through the first three-phase windings based on the detected first bus current Idc1, two combinations such that two differing phases of Iu1, Iv1, and Iw1 can be regenerated from the first bus current Idc1 are output, whereby fluctuation in current flowing through the first three-phase windings and current flowing through the second three-phase windings during this period can be reduced, and current flowing through the first windings of the three-phase alternating current rotating machine can be accurately detected.

Also, FIG. 15 and FIG. 16 show that, in comparison with an alternating current rotating machine having a single three-phase winding, the current amplitude fluctuation is also small when the phase difference is 30 degrees, because of which the discrepancy with the average of the currents Iu1, Iv1, and Iw1 flowing through the first three-phase windings, detected at the timing at which neighboring vectors are output, can be reduced.

In Embodiment 7, the configuration is such that the first switching signals and second switching signals are output to the alternating current rotating machine 1c having a 30 degree phase difference between the first three-phase windings and second three-phase windings, so that at least two combinations wherein a first voltage vector and second voltage vector are neighboring are generated, but the invention is not limited to this. Even when adopting a configuration wherein the first power conversion means 3 and second power conversion means 4 output first switching signals and second switching signals using commonly known PWM technology such as carrier comparison or space vector modulation, and the first bus current Idc1 is detected at the timing at which a first voltage vector and second voltage vector are neighboring, fluctuation in current flowing through the first three-phase windings and current flowing through the second three-phase windings is small at the timing in question, and Iu1, Iv1, and Iw1 can be accurately obtained from the first bus current Idc1.

It goes without saying that, by referring to the changes between Embodiment 1 and Embodiment 2, a method whereby at least three combinations wherein a first voltage vector and second voltage vector are neighboring are generated can easily be realized for the alternating current rotating machine 1c from Embodiment 7. Also, it goes without saying that, by referring to the changes between Embodiment 1 and Embodiments 3 and 4, an example wherein the current detection cycle Tc and switching cycle differ can easily be realized for the alternating current rotating machine 1c from Embodiment 7. Also, it goes without saying that, by referring to the changes between Embodiment and Embodiment 5, current flowing through the second three-phase windings of the alternating current rotating machine 1c can be detected using the second current detection means 9 and second phase current calculation means 10 in the configuration of Embodiment 7.

Embodiment 8

A description of portions in common with Embodiments 1 to 7 will be omitted. Configurations of Embodiment 8 differing from those of Embodiment 7 are a voltage command calculation unit 6d, an alternating current rotating machine 1d, and switching signal generating means 5g. The voltage command calculation unit 6d, in the same way as the voltage command calculation unit 6, calculates the first voltage commands Vu1, Vv1, and Vw1 and second voltage commands Vu2, Vv2, and Vw2 for driving the alternating current rotating machine 1d, and outputs the voltage commands to the switching signal generating means 5g. As the details are the same as those of the voltage command calculation unit 6, they will be omitted.

Figure 34:
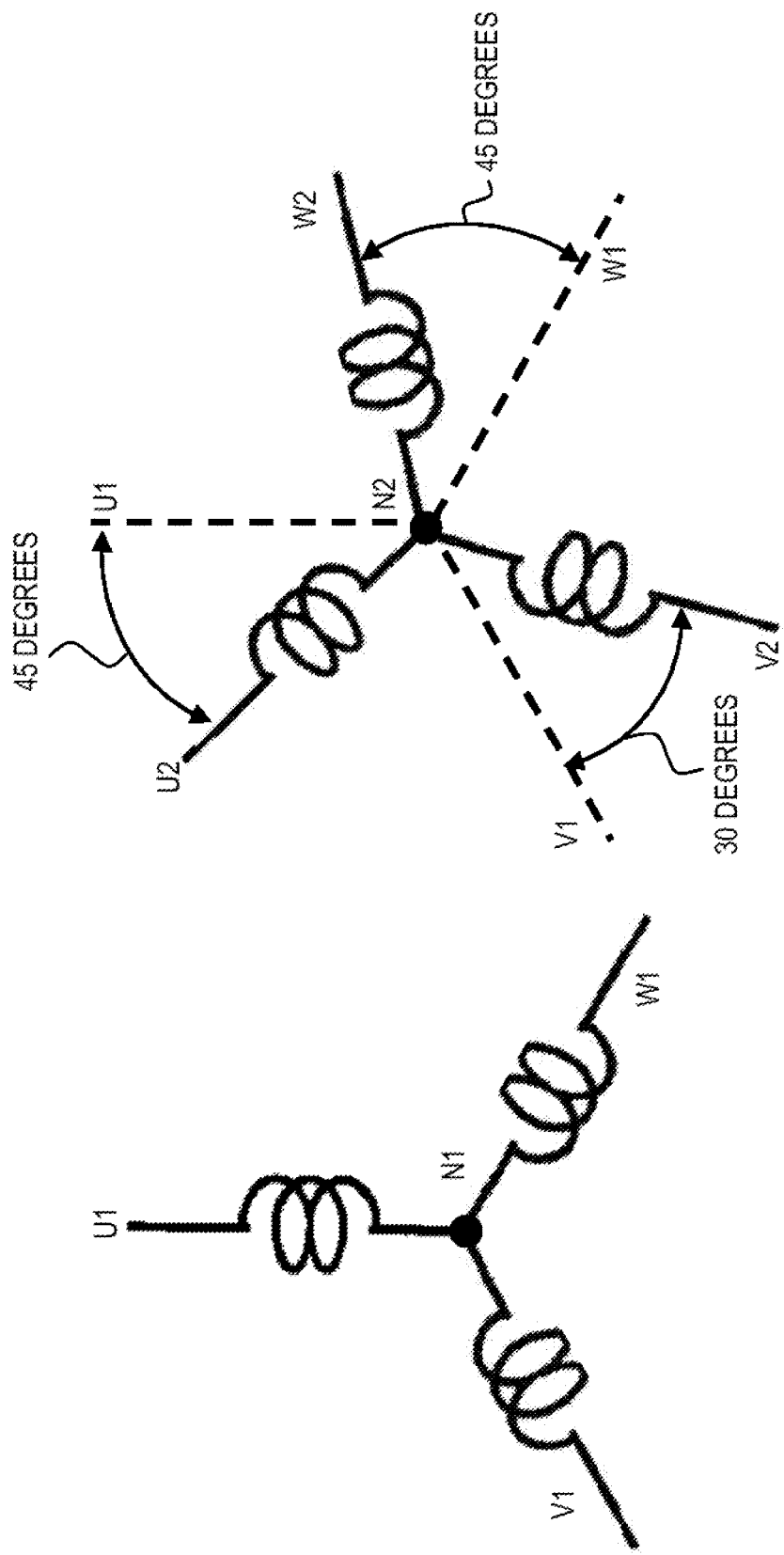
FIG. 34 is a diagram showing the phase difference between first windings and second windings of an stator of an alternating current rotating machine of Embodiment 8.

The alternating current rotating machine 1d differs from the alternating current rotating machine 1c in having a phase difference of 45 degrees between the U1 winding and U2 winding, V1 winding and V2 winding, and W1 winding and W2 winding, as shown in FIG. 34 (with regard to the phase difference, the first three-phase windings U1, V1, and W1, shown by dotted lines, are shown superimposed on the second three-phase windings U2, V2, and W2, shown by solid lines, in FIG. 34). In this case too, by carrying out coordinate transformation of the first three-phase windings U1, V1, and W1 and second three-phase windings U2, V2, and W2 on the two rotational axes (d-q axes), the alternating current rotating machine 1d becomes equivalent to the alternating current rotating machine 1a, the alternating current rotating machine 1b, and the alternating current rotating machine 1c described in Embodiments 1 to 7. Herein, the first three-phase windings U1, V1, and W1 and second three-phase windings U2, V2, and W2 have a phase difference of 45 degrees, because of which, in order to carry out coordinate transformation on common axes, those being the two rotational axes (d-q), when the angle formed with the d axis with the first winding U1 axis as a reference is taken to be $\theta$, it is sufficient that coordinate transformation is carried out on the first three-phase windings U1, V1, and W1 at the angle $\theta$, but it is necessary that coordinate transformation is carried out on the second three-phase windings U2, V2, and W2 at an angle ($\theta-45$).

Therefore, when carrying out coordinate transformation of the first three-phase windings U1, V1, and W1 and second three-phase windings U2, V2, and W2 having a 45 degree phase difference on common axes, those being the two rotational axes (d-q), a d axis equivalent circuit represented in block diagram format can be represented by FIG. 4, while a q axis equivalent circuit represented in block diagram format can be represented by FIG. 5, in the same way as in the case of the alternating current rotating machine 1a, alternating current rotating machine 1b, and alternating current rotating machine 1c. Therefore, in the same way as the alternating current rotating machine 1a, alternating current rotating machine 1b, and alternating current rotating machine 1c, the alternating current rotating machine 1d is such that, with regard to current fluctuation when a pulse voltage sufficiently shorter than the electrical time constant is applied as described in Embodiment 1, fluctuation in current flowing through the first three-phase windings and current flowing through the second three-phase windings decreases when the values of Vd1 and Vd2 are near and the values of Vq1 and Vq2 are near.

Figure 35:
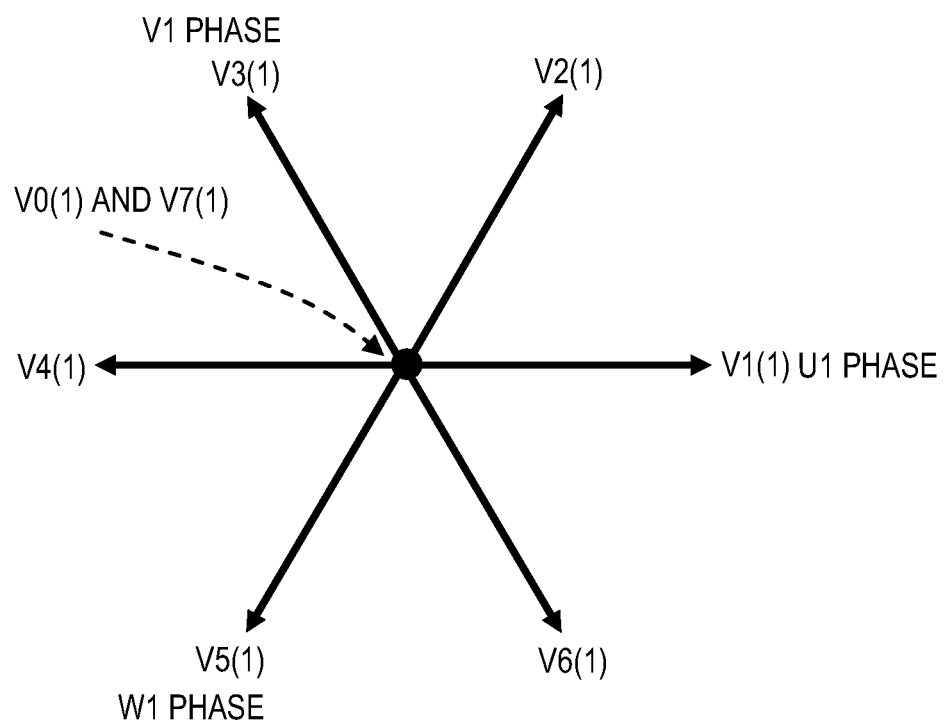
FIG. 35 is a diagram showing first voltage vectors of Embodiment 8.
Figure 36:
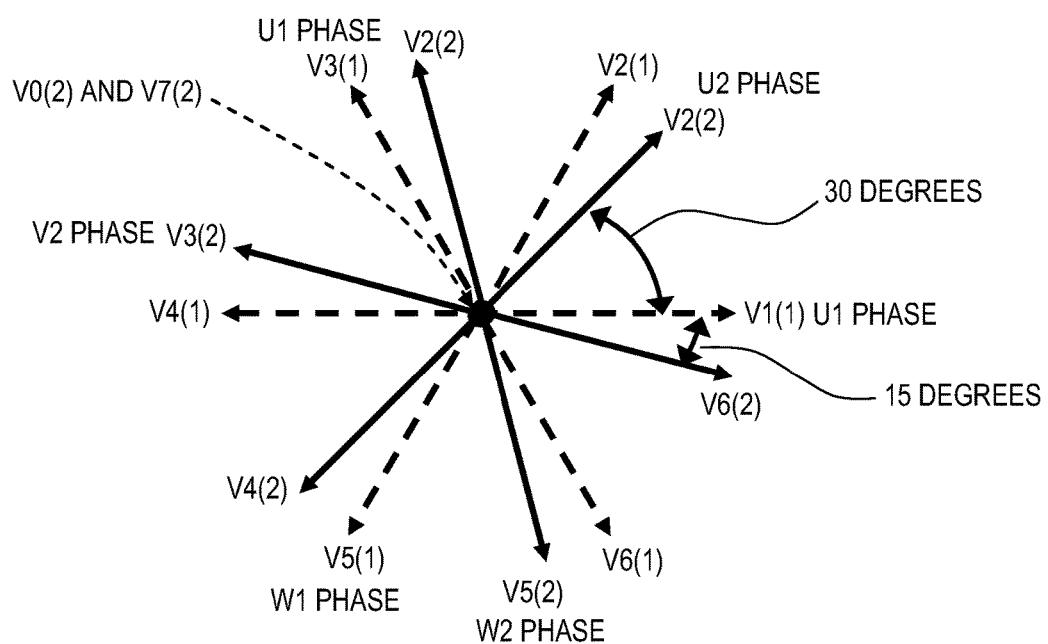
FIG. 36 is a diagram showing second voltage vectors as solid lines and showing the first voltage vectors as broken lines in Embodiment 8.

Next, a description will be given of the relationship between the first voltage vectors and second voltage vectors in Embodiment 8. FIG. 35 shows the first voltage vectors, and this drawing is the same as the drawing described in Embodiment 1. Meanwhile, FIG. 36 shows the second voltage vectors as solid lines, and shows the first voltage vectors as broken lines. Herein, the vectors V0(2) and V7(2) are shown as a black circle at the origin, and although V0(1) and V7(1) also exist at the origin, they are omitted here.

As previously described, the alternating current rotating machine 1d in Embodiment 8 has a phase difference of 45 degrees between the first three-phase windings and second three-phase windings, because of which V1(1) and V6(2), V2(1) and V1(2), V3(1) and V2(2), V4(1) and V3(2), V5(1) and V4(2), and V6(1) and V5(2) all have a phase difference of 15 degrees, with V0(1), V0(2), V7(1), and V7(2), which have no magnitude, being exceptions. In the invention, the second voltage vector nearest (having the smallest phase difference with) a first voltage vector is defined as neighboring, as described in Embodiment 6. It is clear from FIG. 36 that in the alternating current rotating machine 1d, wherein the phase difference between the first three-phase windings and second three-phase windings is 45 degrees, the phase difference between a first voltage vector other than V0(1) and V7(1) and the nearest second voltage vector (the second voltage vector having the smallest phase difference) is 15 degrees. Therefore, neighboring vectors in Embodiment 8 are V1(1) and V6(2), V2(1) and V1(2), V3(1) and V2(2), V4(1) and V3(2), V5(1) and V4(2), and V6(1) and V5(2), which are in a 15 degree phase difference relationship.

Figure 37:
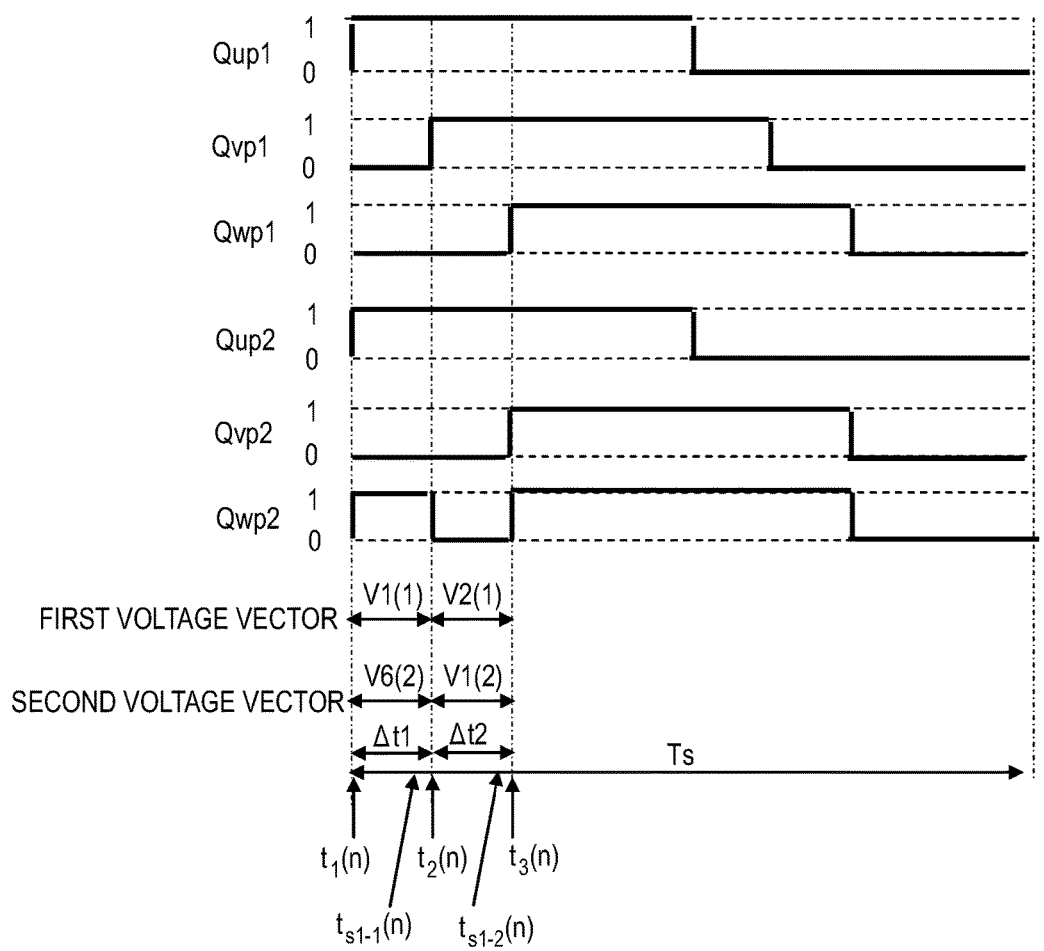
FIG. 37 is an illustration of an operation in the switching signal cycle Ts relating to a method of generating the first and second switching signals in switching signal generating means, and to first bus current detection timing in current detection means, of Embodiment 8.

Next, referring to FIG. 37, a description will be given of an operation of the switching signal generating means 5g in Embodiment 8. Two combinations wherein a first voltage vector and second voltage vector are neighboring, those being V1(1) and V6(2) from the time t1(n) to t2(n) and V2(1) and V1(2) from the time t2(n) to t3(n), are generated, and the first bus current Idc1 is detected at the times ts1−1(n) and ts1−2(n) during those timings. Regarding a method of selecting the two neighboring combinations, it is sufficient to select combinations wherein two phases of the first three-phase windings Iu1, Iv1, and Iw1 can be detected from the first bus current Idc1 from among the vectors in a neighboring relationship, those being V1(1) and V6(2), V2(1) and V1(2), V3(1) and V2(2), V4(1) and V3(2), V5(1) and V4(2), and V6(1) and V5(2), referring to FIG. 6. In FIG. 37, Iu1 is detected at the time ts1−1(n), and −Iw1 is detected at the time ts1−2(n).

In this way, in Embodiment 8, the first switching signals and second switching signals are output to an alternating current rotating machine having a 45 degree phase difference between the first windings and second windings, so that two combinations wherein a first voltage vector and second voltage vector are neighboring are generated, and the first bus current Idc1 is detected at the timing at which the neighboring vectors are output, whereby fluctuation in current flowing through the first three-phase windings and current flowing through the second three-phase windings can be reduced, and current flowing through the first windings of the alternating current rotating machine 1d can be accurately detected.

Also, FIG. 15 and FIG. 16 show that, in comparison with an alternating current rotating machine having a single three-phase winding, the current amplitude fluctuation is also small when the phase difference is 15 degrees, because of which the discrepancy with the average of the currents Iu1, Iv1, and Iw1 flowing through the first three-phase windings, detected at the timing at which neighboring vectors are output, can be reduced.

In Embodiment 8, the configuration is such that the first switching signals and second switching signals are output to the alternating current rotating machine 1d having a 45 degree phase difference between the first windings and second windings, so that at least two combinations wherein a first voltage vector and second voltage vector are neighboring are generated, but the invention is not limited to this. Even when adopting a configuration wherein the first power conversion means 3 and second power conversion means 4 output first switching signals and second switching signals using commonly known PWM technology such as carrier comparison or space vector modulation, and the first bus current Idc1 is detected at the timing at which a first voltage vector and second voltage vector are neighboring, fluctuation in current flowing through the first three-phase windings and current flowing through the second three-phase windings is small at the timing at which the neighboring vectors are output, and Iu1, Iv1, and Iw1 can be accurately obtained from the first bus current Idc1.

It goes without saying that, by referring to the changes between Embodiment 1 and Embodiment 2, a method whereby at least three combinations wherein a first voltage vector and second voltage vector are neighboring are generated can easily be realized for the alternating current rotating machine 1d from Embodiment 8. Also, it goes without saying that, by referring to the changes between Embodiment 1 and Embodiments 3 and 4, an example wherein the current detection cycle Tc and switching cycle differ can easily be realized for the alternating current rotating machine 1d from Embodiment 8. Also, it goes without saying that, by referring to the changes between Embodiment and Embodiment 5, current flowing through the second three-phase windings of the alternating current rotating machine 1d can be detected using the second current detection means 9 and second phase current calculation means 10 in the configuration of Embodiment 8.

Heretofore, the alternating current rotating machine 1b having a 15 degree phase difference between the first three-phase windings and second three-phase windings has been described in Embodiment 6, the alternating current rotating machine 1c having a 30 degree phase difference between the first three-phase windings and second three-phase windings has been described in Embodiment 7, and the alternating current rotating machine 1d having a 45 degree phase difference between the first three-phase windings and second three-phase windings has been described in Embodiment 8, but it goes without saying that, by referring to Embodiments 6, 7, and 8, the invention can also be implemented in the same way for an alternating current rotating machine wherein the phase difference between the first three-phase windings and second three-phase windings is of an arbitrary angle.

Embodiment 9

A description of portions in common with Embodiments 1 to 8 will be omitted. A configuration of Embodiment 9 differing from those of Embodiment 1 is switching signal generating means 5h. An example such that two combinations wherein a first voltage vector and second voltage vector coincide are generated has been disclosed for the switching signal generating means 5a in Embodiment 1, but in the case of the switching signal generating means 5h in Embodiment 9, corresponding combinations are switched in the switching signal generating means 5a based on a voltage magnitude relationship or voltage phase in at least one of the first voltage commands and second voltage commands.

Figure 38:
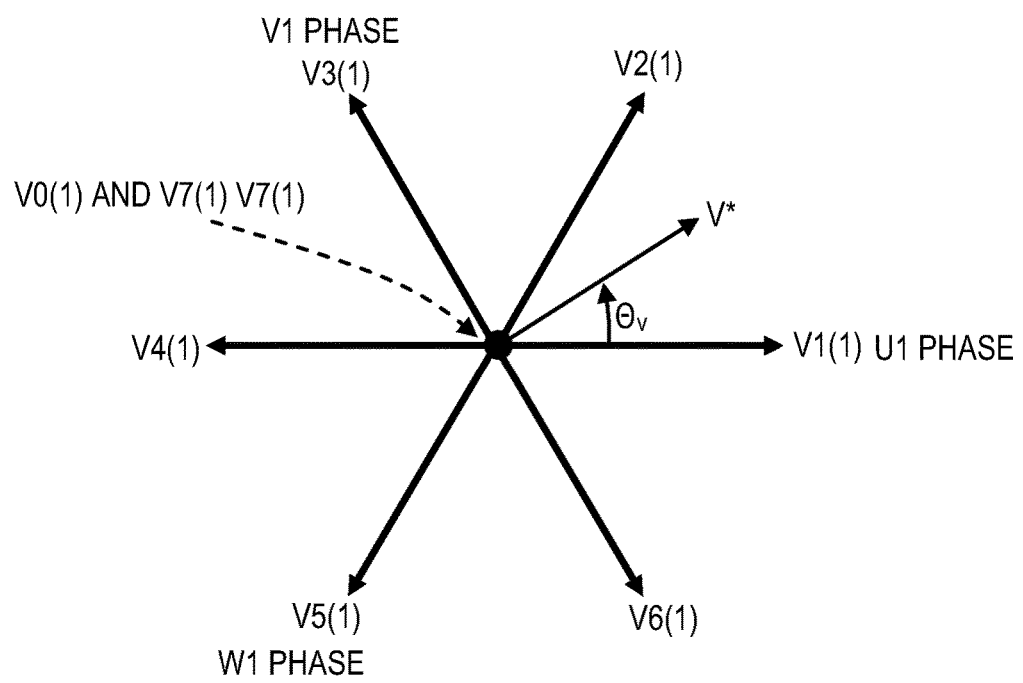
FIG. 38 is a diagram illustrating the voltage phase of a voltage command vector in Embodiment 9.

A voltage phase is an angle θv of a voltage command vector V* having the U1 phase direction (V1(1) direction) as a reference, as shown in FIG. 38. The voltage command vector V* is expressed in the following way, using the first winding voltage commands Vu1, Vv1, and Vw1.

$$V^* = 2/3 \times (Vu1 + Vv1 \times \exp(j120) + Vw1 \times \exp(-j120)) \quad (9\text{-}1)$$
$$= Vamp \times \exp(j\theta v)$$

Note that $$Vu1 = Vamp \times \cos(\theta v) \quad (9\text{-}2)$$

$$Vv1 = Vamp \times \cos(\theta v - 120) \quad (9\text{-}3)$$

$$Vw1 = Vamp \times \cos(\theta v + 120) \quad (9\text{-}4)$$

Herein, Vamp is the amplitude of the first voltage command, while j is an imaginary unit (j×j=−1).

Next, FIG. 39 shows an example of switching between two combinations in the switching signal generating means 5h. In the drawing, in accordance with the voltage phase θv, V1(1) and V1(2), and V2(1) and V2(2), are selected as combinations wherein a first voltage vector and second voltage vector coincide in a range in which θv is 0 to 60 degrees, one of these combinations is output from the time t1(n) to t2(n) in FIG. 10, and the other combination is output from the time t2(n) to t3(n). In the same way, V2(1) and V2(2), and V3(1) and V3(2), are selected as combinations wherein a first voltage vector and second voltage vector coincide in a range in which θv is 60 to 120 degrees, one of these combinations is output from the time t1(n) to t2(n) in FIG. 10, and the other combination is output from the time t2(n) to t3(n).

Figure 40:
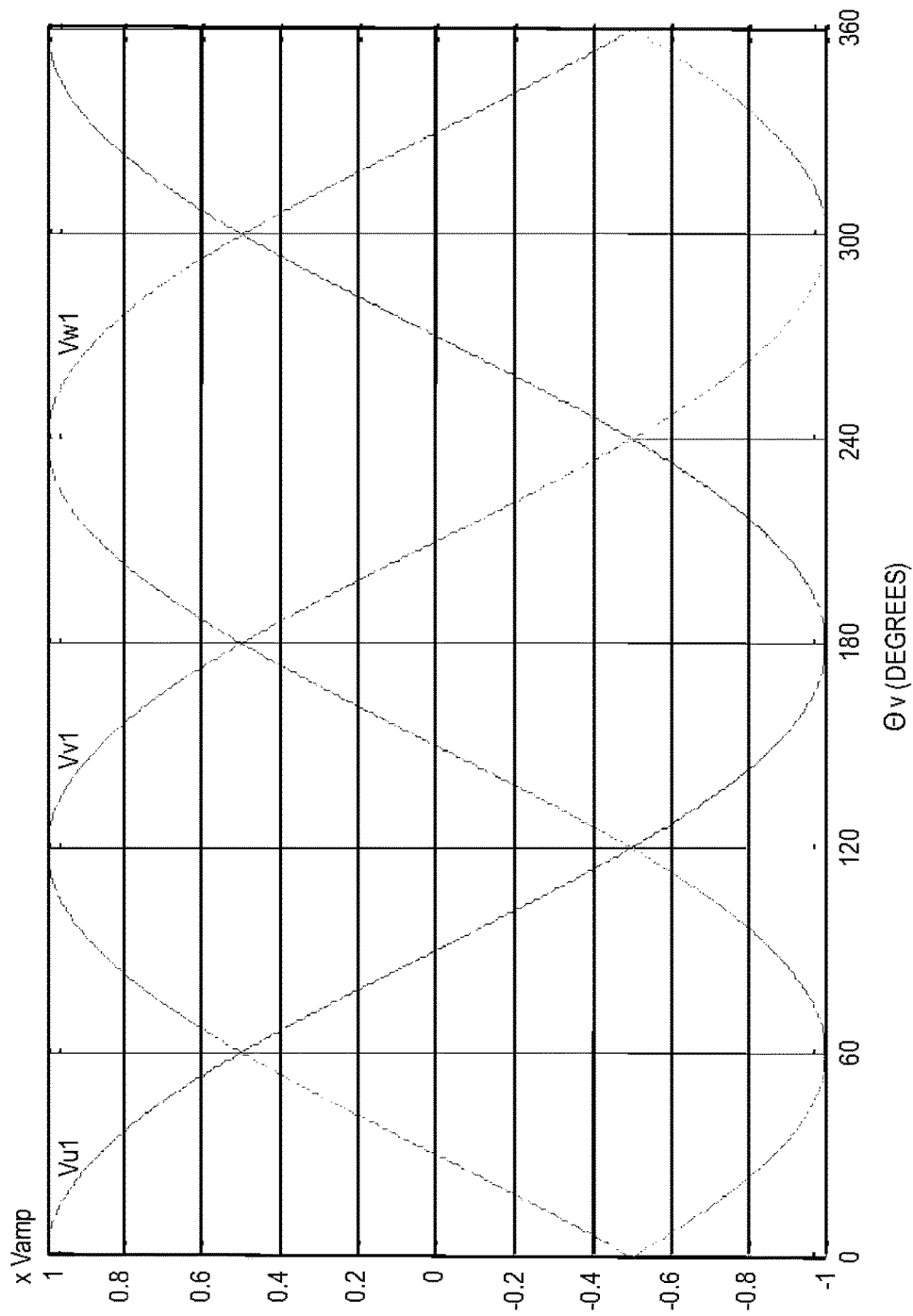
FIG. 40 is a diagram showing an aspect of the voltage magnitude relationship between first voltage commands Vu1, Vv1, and Vw1 switching in accordance with a voltage command vector angle θv in Embodiment 9.

Also, θv and the first voltage commands Vu1, Vv1, and Vw1 are such that the voltage magnitude relationship between the first voltage commands Vu1, Vv1, and Vw1 switches in accordance with θv, as shown in FIG. 40. FIG. 39 shows the voltage magnitude relationship between the first winding voltage commands (the magnitude relationship between the three voltage commands Vu1, Vv1, and Vw1) with respect to θv. According to this, a first combination and second combination may be determined based on the voltage magnitude relationship, as in FIG. 39. The combinations of FIG. 39 are set so that the combination nearest (having the smallest phase difference with) the voltage command vector V* is selected from among V1(1) to V6(1), and voltage with a large amplitude can be output from the first power conversion means 3.

In the same way, the first combination and second combination can be switched by calculating the voltage phase θv with respect to the second voltage commands by substituting Vu2, Vv2, and Vw2 for Vu1, Vv1, and Vw1 respectively in Expressions (9-2 to 9-4). Furthermore, using both the first voltage commands and second voltage commands, the first combination and second combination may be switched by taking the average values of Vu1 and Vu2, Vv1 and Vv2, and Vw1 and Vw2 to be Vu_ave, Vv_ave, and Vw_ave respectively, and calculating the voltage phase θv based on the average values of the first voltage commands and second voltage commands by substituting Vu_ave, Vv_ave, and Vw_ave for Vu1, Vv1, and Vw1 respectively in Expressions (9-2 to 9-4). At this time, switching can also be carried out based on the voltage magnitude order of Vu2, Vv2, and Vw2 and the voltage magnitude order of Vu_ave, Vv_ave, and Vw_ave.

By switching based on Vu2, Vv2, and Vw2, voltage of a greater amplitude can be output from the second power conversion means 4, and by switching based on Vu_ave, Vv_ave, and Vw_ave, a combination of high voltage outputs from both the first power conversion means 3 and the second power conversion means 4 can be compiled. In Embodiment 9, a description has been given of examples of selecting and switching with regard to the switching signal generating means 5h, but it goes without saying that implementation can be carried out in the same way with regard to the switching signal generating means 5a to 5g.

As heretofore described, the switching signal generating means in Embodiment 9 is such that combinations wherein a first voltage vector and second voltage vector coincide or neighbor are switched based on the voltage magnitude relationship or voltage phase of three voltage commands in at least one of the first winding voltage commands and second voltage commands, whereby voltage of a large amplitude can be output by the first power conversion means 3 and second power conversion means 4, while maintaining the advantages described in Embodiments 1 to 8.

Embodiment 10

Figure 41:
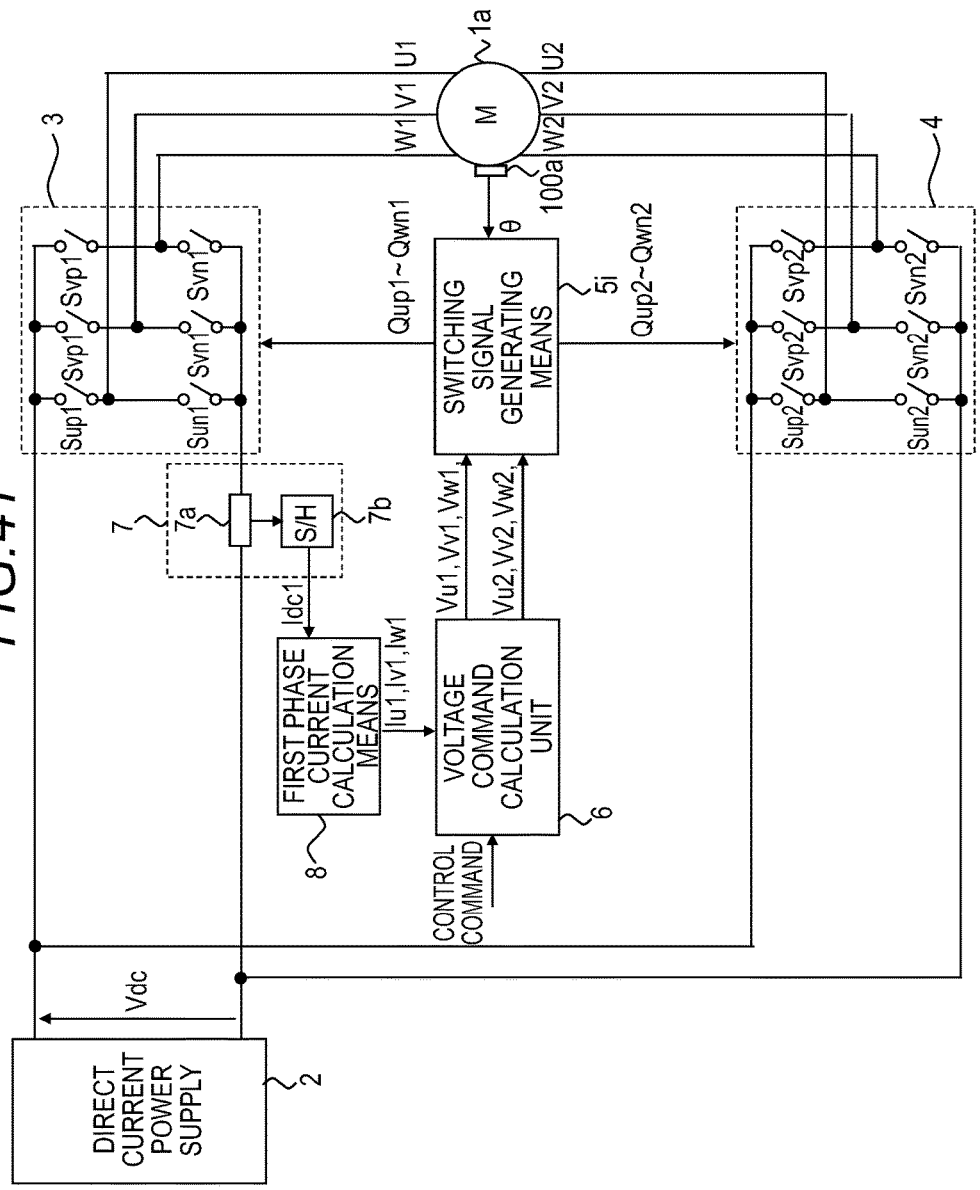
FIG. 41 is a configuration diagram showing the whole of a power conversion device in Embodiment 10.

A description of portions in common with Embodiments 1 to 9 will be omitted. FIG. 41 shows the whole configuration of a power conversion device in Embodiment 10. Compared with FIG. 1, which represents the configuration of Embodiment 1, position detection means 100a, which detects a rotation position θ of the alternating current rotating machine 1a, and switching signal generating means 5i differ. The position detection means 100a detects the rotation position θ of the alternating current rotating machine 1a using a position detector such as an encoder, resolver, or hole sensor. Also, the rotation position θ may be detected using a method whereby the rotation position is estimated from information on the voltage or current of the alternating current rotating machine 1a.

Next, the switching signal generating means 5i will be described. An example such that two combinations wherein a first voltage vector and second voltage vector coincide are generated has been described for the switching signal generating means 5a in Embodiment 1, but in the case of the switching signal generating means 5i in Embodiment 10, two corresponding combinations are switched in accordance with the rotation position θ in particular. FIG. 42 shows a method of switching two combinations in the switching signal generating means 5i.

In the drawing a first combination and second combination are set in accordance with the rotation position θ. For example, V1(1) and V1(2), and V2(1) and V2(2), are selected as coinciding combinations when θ is in a range of 270 to 330 degrees, one of these combinations is output from the time t1(n) to t2(n) in FIG. 10, and the other combination is output from the time t2(n) to t3(n). In the same way, V2(1) and V2(2), and V3(1) and V3(2), are selected as coinciding combinations when θ is in a range of 330 to 0 degrees or 0 to 30 degrees, one of these combinations is output from the time t1(n) to t2(n) in FIG. 10, and the other combination is output from the time t2(n) to t3(n). Hereafter, in the same way, switching is carried out as shown in FIG. 42. FIG. 42 also shows a q axis phase θq. The relationship between θ and θq is such that θq is a phase 90 degrees advanced with respect to θ.

Figure 43:
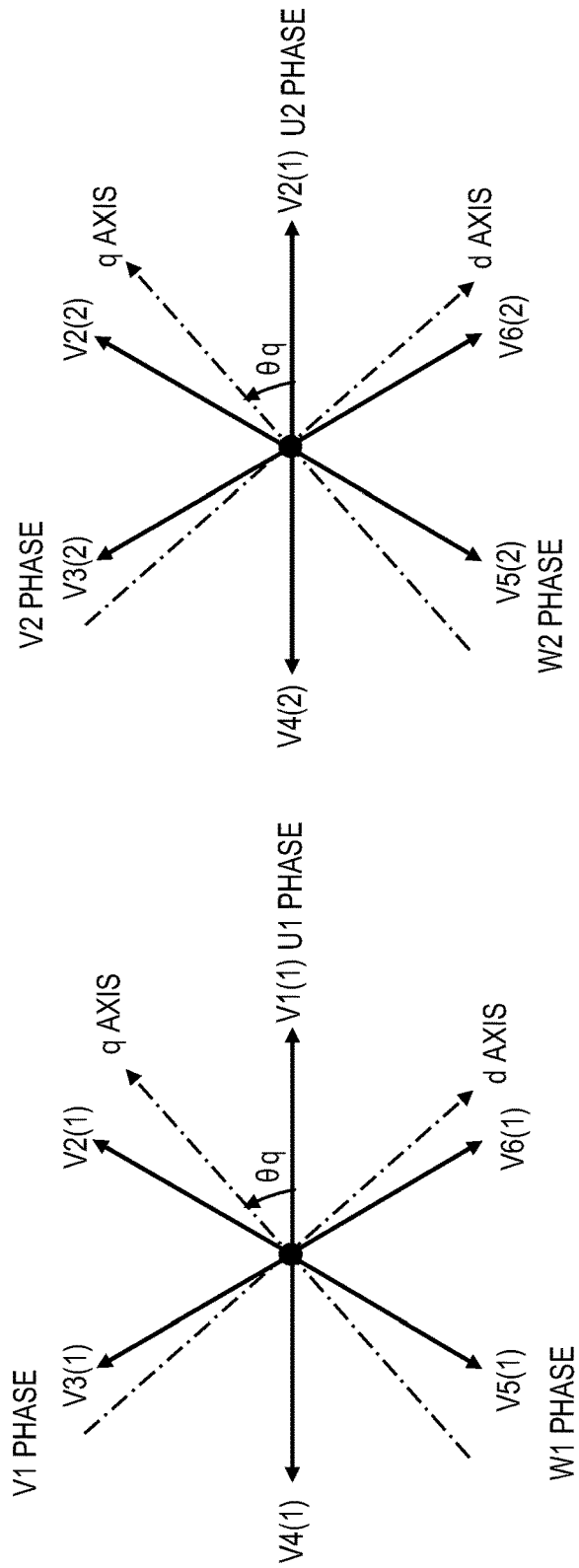
FIG. 43 is a diagram illustrating the relationship between a q axis phase θq and voltage vectors in Embodiment 10.
Figure 44:
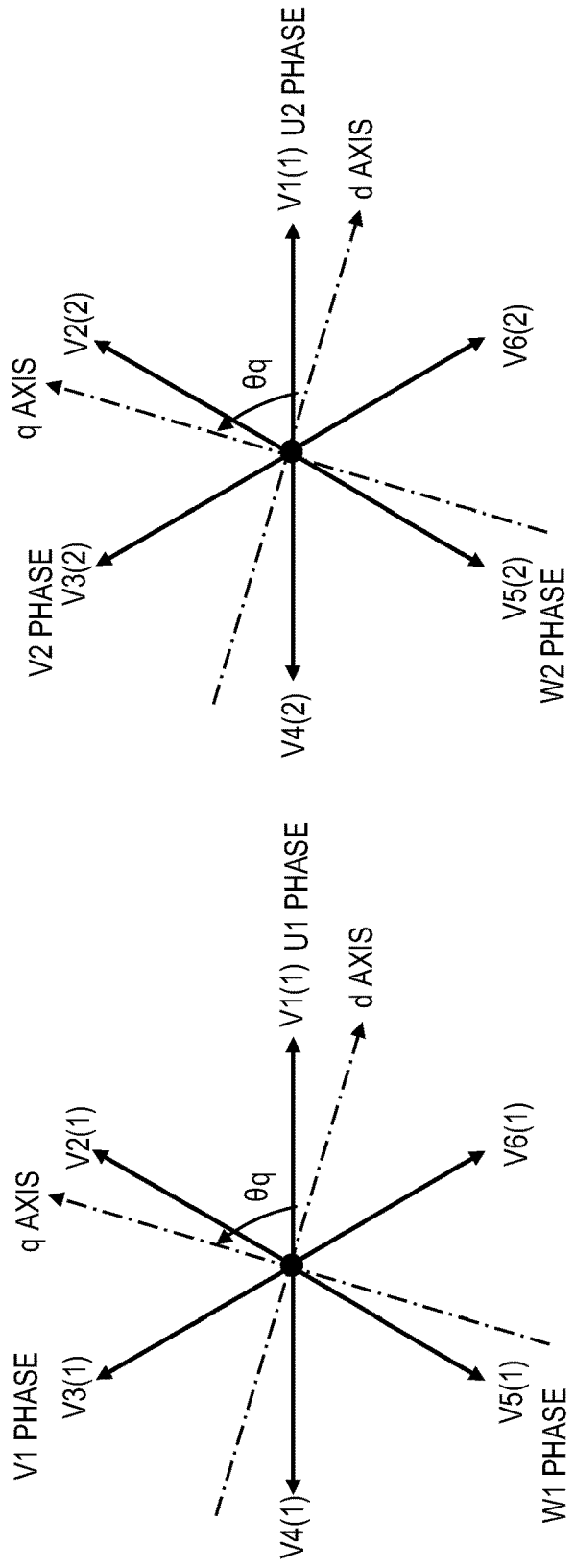
FIG. 44 is a diagram illustrating the relationship between the q axis phase θq and voltage vectors in Embodiment 10.

FIG. 42 is such that, of the coinciding combinations, two combinations sandwiching the q axis are switched and selected. Two examples thereof are shown. In FIG. 42, V1(1) and V1(2), and V2(1) and V2(2), are output as coinciding combinations when θq is in a range of 0 to 60 degrees but, as shown in FIG. 43, V1(1) and V2(1), and V1(2) and V2(2), exist on the left and right sandwiching the q axis. Also, in FIG. 42, V2(1) and V2(2), and V3(1) and V3(2), are output as coinciding combinations when θq is in a range of 60 to 120 degrees, but in FIG. 44, V2(1) and V3(1), and V2(2) and V3(2), exist on the left and right sandwiching the q axis.

Hereafter, a description will be given of advantages of combinations sandwiching the q axis being selected and switched as in FIG. 42. All first voltage vectors and second voltage vectors sandwiching the q axis have a small phase difference with the q axis in comparison with the phase difference with the d axis, because of which, in a case of component decomposition in the d axis and q axis directions, the q axis direction component becomes larger. Therefore, when the switching signal generating means 5i outputs in two coinciding ways, voltages applied to the first windings and second windings of the alternating current rotating machine 1a from the first power conversion means 3 and second power conversion means 4 are both such that the q axis direction component is large in comparison with that in the d axis direction. Herein, when the alternating current rotating machine 1a has saliency and Ld<Lq is established, or when the alternating current rotating machine 1a does not have saliency, but the inductance fluctuates owing to magnetic saturation and Ld<Lq is established, the q axis direction impedance is high in comparison with the d axis direction impedance. Therefore, by selecting and switching coinciding combinations so as to be larger in the q axis direction than in the d axis direction, in other words, in the direction of higher impedance, the amount of change in the currents Iu1, Iv1, and Iw1 of the first three-phase windings and currents Iu2, Iv2, and Iw2 of the second three-phase windings can be further reduced. Therefore, as these amounts of change can be further reduced, current nearer to the average current can be detected.

Heretofore, combinations have been selected and switched so that a q axis direction sign 90 degrees ahead of the d axis is sandwiched on the positive side, but combinations can be selected and switched so that a q axis direction sign 90 degrees behind the d axis is sandwiched on the negative side. Also, when the alternating current rotating machine 1a has saliency and Ld>Lq is established, or when the alternating current rotating machine 1a does not have saliency but Ld>Lq is established owing to magnetic saturation, it is sufficient that two coinciding combinations are selected and switched so as to sandwich the d axis sign positive side or d axis sign negative side. Also, it goes without saying that, by referring to the changes between Embodiment 1 and Embodiment 5, current nearer to the average current flowing through the second three-phase windings of the alternating current rotating machine 1a can be detected using the second current detection means 9 and second phase current calculation means 10 in the configuration of Embodiment 10.

Embodiment 11

Figure 45:
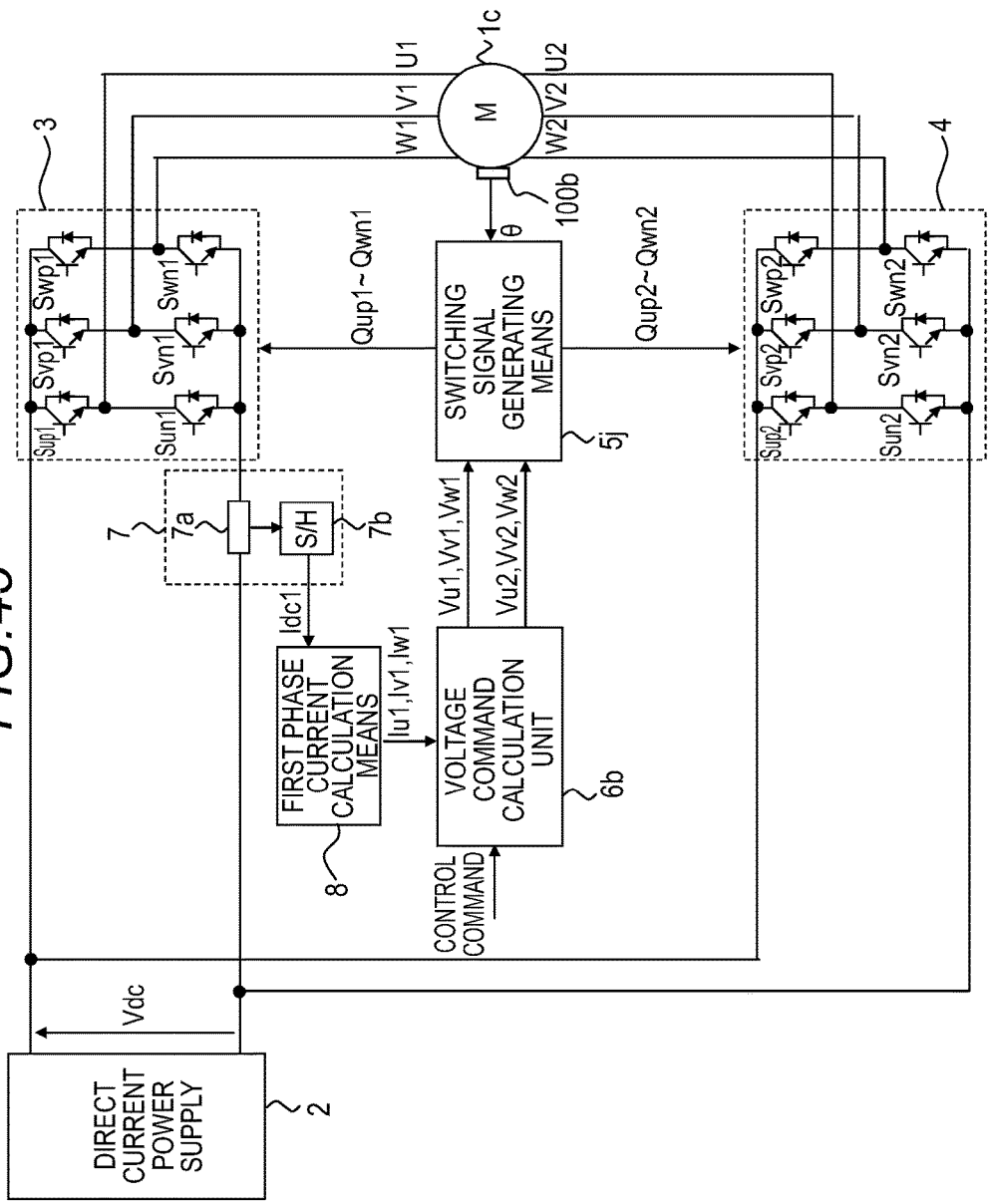
FIG. 45 is a configuration diagram showing the whole of a power conversion device in Embodiment 11.

A description relating to portions in common with Embodiments 1 to 10 will be omitted. FIG. 45 is a diagram showing the whole configuration of a power conversion device in Embodiment 11. Compared with FIG. 41, which represents the configuration of Embodiment 10, the voltage command calculation unit 6b, the alternating current rotating machine 1c, position detection means 100b, which detects a rotation position θ of the alternating current rotating machine 1c, and switching signal generating means 5j differ. The position detection means 100b detects the rotation position θ of the alternating current rotating machine 1c using a position detector such as an encoder, resolver, or hole sensor. Also, the rotation position θ may be detected using a method whereby the rotation position is estimated from information on the voltage or current of the alternating current rotating machine 1c.

Next, the switching signal generating means 5j will be described. The switching signal generating means 5i in Embodiment 10 is such that two corresponding combinations are switched in accordance with the rotation position θ, but in the case of the switching signal generating means 5j in Embodiment 11, two neighboring combinations, described in regard to the alternating current rotating machine 1c having a phase difference of 30 degrees between the first three-phase windings and second three-phase windings described in Embodiment 7, are switched in accordance with the rotation position θ. A switching method is shown in FIG. 46. In the drawing, a first combination and second combination are output in accordance with the rotation position θ.

For example, V1(1) and V1(2), and V2(1) and V2(2), are selected as neighboring combinations when θ is in a range of 285 to 345 degrees, one of these combinations is output from the time t1(n) to t2(n) in FIG. 10, and the other combination is output from the time t2(n) to t3(n). In the same way, V2(1) and V2(2), and V3(1) and V3(2), are selected as neighboring combinations when θ is in a range of 345 to 0 degrees or 0 to 45 degrees, one of these combinations is output from the time t1(n) to t2(n) in FIG. 10, and the other combination is output from the time t2(n) to t3(n). Hereafter, in the same way, switching is carried out as shown in FIG. 46. FIG. 46 also shows the q axis phase θq.

The switching angles are in a relationship of being delayed by 15 degrees in comparison with the switching angles shown in FIG. 42 in Embodiment 10, but this is because, as there is a 30 degree phase difference between the first three-phase windings and second three-phase windings in the alternating current rotating machine 1c, the phase of the second voltage vectors is delayed by 30 degrees in comparison with the first voltage vectors. Therefore, when taking the averages of the first voltage vectors and second voltage vectors, the averages are delayed by 15 degrees in comparison with the first voltage vectors. The average vectors are as V1(ave) (the average of V1(1) and V1(2)), V2(ave) (the average of V2(1) and V2(2)), V3(ave) (the average of V3(1) and V3(2)), V4(ave) (the average of V4(1) and V4(2)), V5(ave) (the average of V5(1) and V5(2)), and V6(ave) (the average of V6(1) and V6(2)) in FIG. 47, which are delayed by 15 degrees with respect to V1(1), V2(1), V3(1), V4(1), V5(1), and V6(1) respectively.

Figure 47:
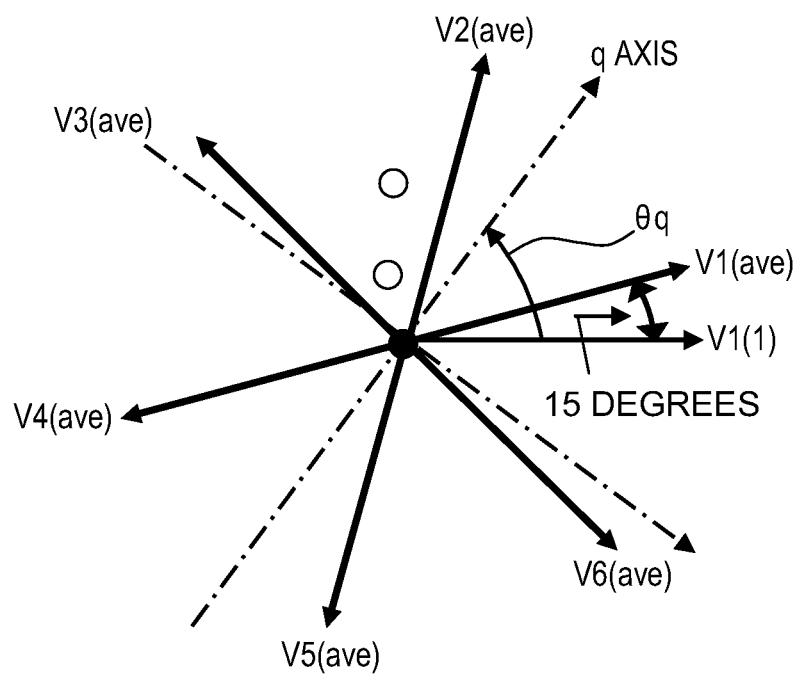
FIG. 47 is a diagram showing average vectors of first voltage vectors and second voltage vectors in Embodiment 11.

FIG. 46 is such that, of the six average vectors shown in FIG. 47, two combinations sandwiching the q axis are switched and selected. One example thereof is shown. In FIG. 46, V1(1) and V1(2), and V2(1) and V2(2), are output as neighboring combinations when θq is in a range of 15 to 75 degrees, but as this corresponds to the average vectors V1(ave) (the average vector of V1(1) and V1(2)) and V2(ave) (the average vector of V2(1) and V2(2)), V1(ave) and V2(ave) sandwich the q axis, as shown in FIG. 47.

Hereafter, a description will be given of advantages of average vectors sandwiching the q axis being selected and switched by switching as in FIG. 46. When selecting combinations that sandwich the q axis, the q axis direction component becomes larger in a case of component decomposition in the d axis and q axis directions. Therefore, when the switching signal generating means 5*j* outputs in two neighboring ways, voltages applied to the alternating current rotating machine 1*c* from the first power conversion means 3 and second power conversion means 4 are such that the q axis direction component is large in comparison with that in the d axis direction. Herein, when the alternating current rotating machine 1*c* has saliency and Ld<Lq is established, or when the alternating current rotating machine 1*c* does not have saliency, but the inductance fluctuates owing to magnetic saturation and Ld<Lq is established, the q axis direction impedance is high in comparison with the d axis direction impedance. Therefore, by selecting and switching coinciding combinations so as to be larger in the q axis direction than in the d axis direction, in other words, in the direction of higher impedance, the amount of change in the currents Iu1, Iv1, and Iw1 of the first three-phase windings and currents Iu2, Iv2, and Iw2 of the second three-phase windings when outputting in two coinciding ways can be further reduced. Therefore, as these amounts of change can be further reduced, an advantage is obtained in that current nearer to the average current can be detected.

Heretofore, combinations have been selected and switched so that a q axis direction sign 90 degrees ahead of the d axis is sandwiched on the positive side, but combinations can be selected and switched so that a q axis direction sign 90 degrees behind the d axis is sandwiched on the negative side. Also, when the alternating current rotating machine 1*c* has saliency and Ld>Lq is established, or when the alternating current rotating machine 1*c* does not have saliency but Ld>Lq is established owing to magnetic saturation, two neighboring combinations may be selected and switched so as to sandwich the d axis sign positive side or d axis sign negative side. Also, a description has been given in Embodiment 11 of the alternating current rotating machine 1*c* having a 30 degree phase difference between the first three-phase windings and second three-phase windings, but it goes without saying that Embodiment 11 is also applicable to an alternating current rotating machine having a phase difference other than 30 degrees. Also, it goes without saying that, by referring to the changes between Embodiment 1 and Embodiment 5, current flowing through the second three-phase windings of the alternating current rotating machine 1*c* can be detected using the second current detection means 9 and second phase current calculation means 10 in the configuration of Embodiment 11.

Embodiment 12

Figure 48:
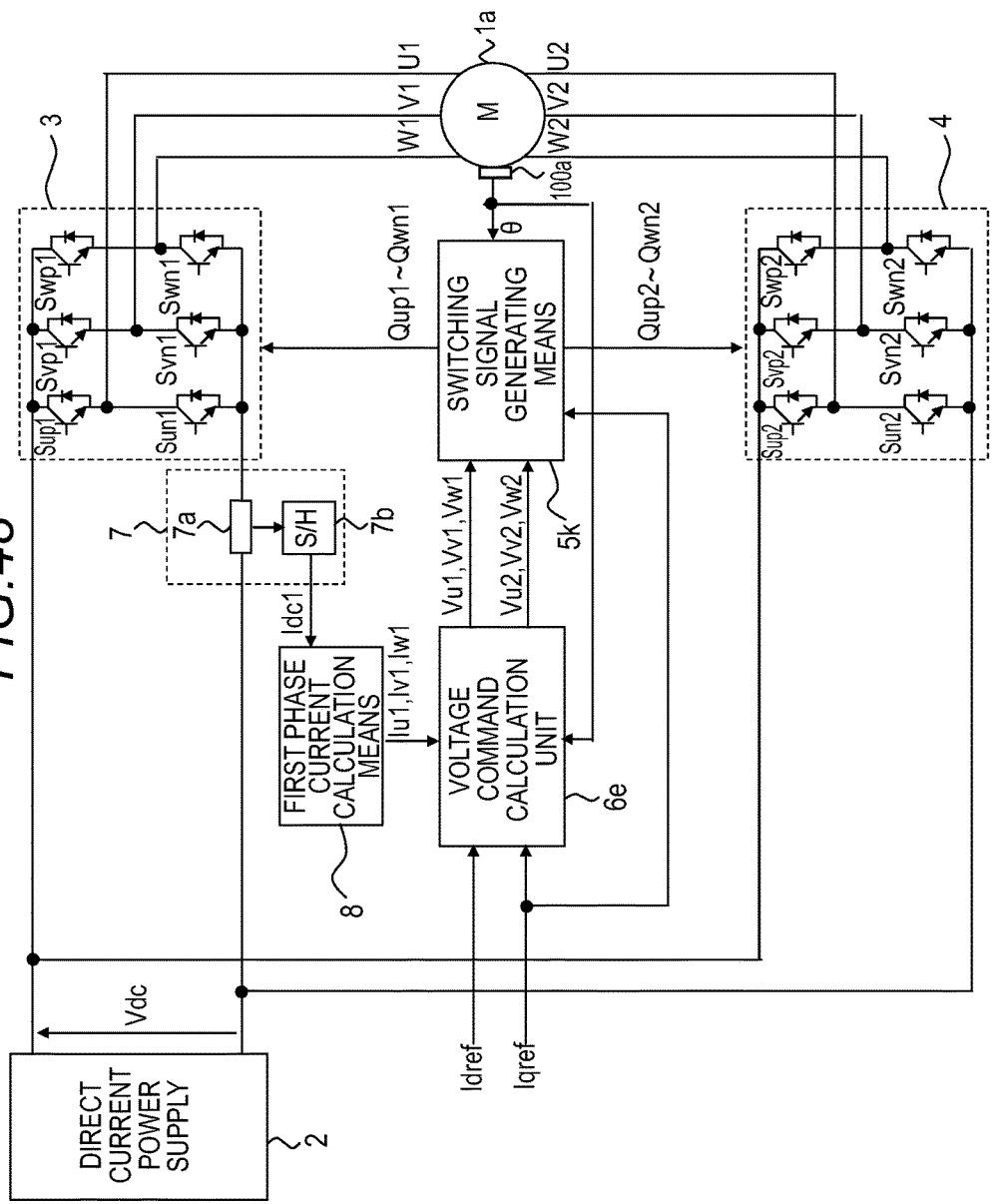
FIG. 48 is a configuration diagram showing the whole of a power conversion device in Embodiment 12.

A description relating to portions in common with Embodiments 1 to 11 will be omitted. FIG. 48 is a diagram showing the whole configuration of a power conversion device in Embodiment 12. Compared with FIG. 41, which represents the configuration of Embodiment 10, a voltage command calculation unit 6*e* and switching signal generating means 5*k* differ. The voltage command calculation unit 6*e* takes in current commands Idref and Idref and the rotation position θ of the alternating current rotating machine 1*a*, and calculates the first voltage commands Vu1, Vv1, and Vw1 and second voltage commands Vu2, Vv2, and Vw2. With regard to a calculation method, there is implementation of vector control by carrying out coordinate transformation on the two rotational axes (d-q axes) based on the rotation position θ, and the like, but as this is commonly known technology, details will be omitted.

Figure 49:
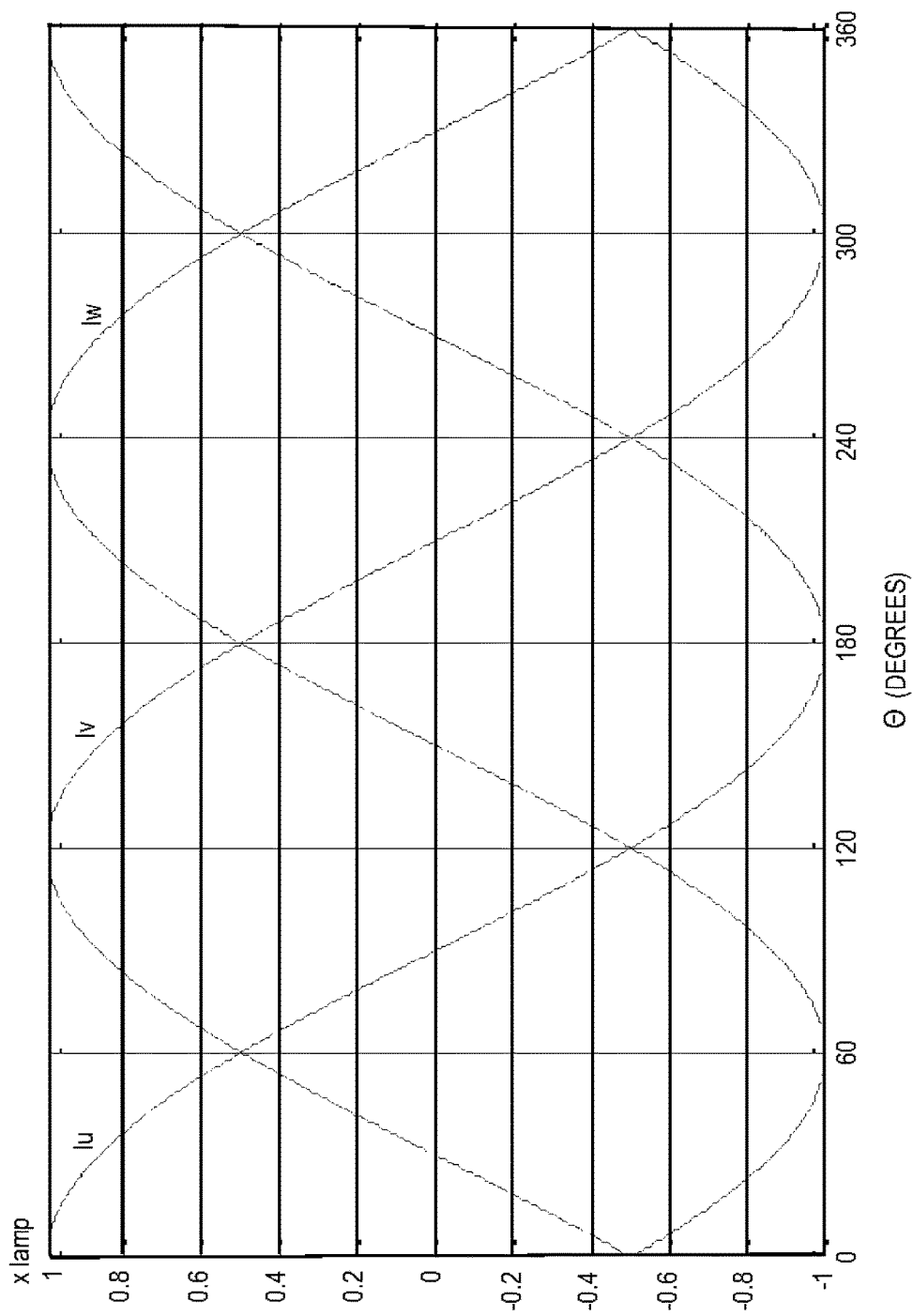
FIG. 49 is a diagram showing an example of waveforms of current commands Iu, Iv, and Iw in Embodiment 12.

Next, the switching signal generating means 5*k* will be described. The current command Iqref is input, and the switching signal generating means 5*k* converts the current command Iqref into static three-phase coordinates using the rotation position θ, thereby obtaining the current commands Iu, Iv, and Iw. An example of the waveforms of the current commands Iu, Iv, and Iw is shown in FIG. 49. Herein, two coinciding combinations are output as in FIG. 50, based on the magnitude relationship of Iu, Iv, and Iw. This means simply that the switching reference in FIG. 42 in Embodiment 10 is changed from the rotation position to the magnitude relationship of Iu, Iv, and Iw. Therefore, the same advantages as those obtained in Embodiment 10 are obtained.

Also, in Embodiments 1 to 12, a description has been given of a permanent magnet synchronous rotating machine having first three-phase windings and second three-phase windings as an alternating current rotating machine. Herein, an induction rotating machine having first three-phase windings and second three-phase windings and a reluctance motor having first three-phase windings and second three-phase windings are such that, although the rotor structure differs in comparison with that of a permanent magnet synchronous rotating machine, the armature winding structure has first three-phase windings and second three-phase windings, because of which, in common with a permanent magnet synchronous rotating machine, mutual inductance occurs between the armature windings, the invention is applicable, and the same advantages are obtained.

Also, in Embodiments 1 to 12, a description has been given of an alternating current rotating machine having first three-phase windings and second three-phase windings, but in a case of multi-phase windings other than three-phase windings too, the advantage in that there is little current change in the first multi-phase windings and second multi-phase windings at a timing at which voltage vectors configured of first multi-phase windings and second multi-phase windings coincide or neighbor is maintained, because of which such a case is included in the invention.

Furthermore, it goes without saying that implementation is possible in the same way for an alternating current rotating machine having a multiple (three or more) of multi-phase windings by referring to Embodiments 1 to 12.

The invention is such that embodiments can be freely combined, and each embodiment can be modified or omitted as appropriate, without departing from the scope of the invention.

The invention claimed is:

1. A power conversion device, comprising:
an alternating current rotating machine having first multi-phase windings and second multi-phase windings;
a direct current power supply;
a voltage command calculator that outputs a first voltage command and second voltage command;
switching signal generator that outputs a first switching signal based on the first voltage command and outputs a second switching signal based on the second voltage command;
a first power converter that converts direct current voltage of the direct current power supply based on the first switching signal and applies voltage to the first multi-phase windings;
a second power converter that converts direct current voltage of the direct current power supply based on the second switching signal and applies voltage to the second multi-phase windings;

a first current detector that detects a first bus current, which is current flowing between the direct current power supply and first power converter; and a first phase current calculator that calculates the current flowing through the first multi-phase windings of the alternating current rotating machine based on the detected first bus current, wherein the first current detector detects the first bus current at a timing at which a first non-zero voltage vector, whose components represent voltages applied to the respective first multi-phase windings based on the first switching signal and a second non-zero voltage vector, whose components represent voltages applied to the respective second multi-phase windings based on the second switching signal, either:

(i) coincide with one another in a case where the second switching signal is the same as the first switching signal and the first and second multi-phase windings have no phase difference therebetween; or (ii) neighbor one another so as to have a phase difference therebetween which is smaller than a phase difference between the first non-zero voltage vector and any other voltage vector whose components represent voltages applied to the respective second multi-phase windings based on the second switching signal in a case where the second switching signal is different to the first switching signal and the first and second multi-phase windings have a phase difference therebetween.

2. The power conversion device according to claim 1, comprising:

second current detector that detects a second bus current, which is current flowing between the direct current power supply and second power converter; and second phase current calculator that calculates the current flowing through the second multi-phase windings of the alternating current rotating machine based on the detected second bus current, wherein the second current detector detects the second bus current at a timing at which the first non-zero voltage vector and second non-zero voltage vector neighbor or coincide.

3. The power conversion device according to claim 2, wherein the alternating current rotating machine is an n-phase alternating current rotating machine such that the first multi-phase windings and second multi-phase windings have a phase difference, and the switching signal generator outputs the first switching signal and second switching signal so that at least n−1 combinations wherein the first non-zero voltage vector and second non-zero voltage vector neighbor are generated in every detection cycle of the first bus current or every cycle of the first and second switching signals.

4. The power conversion device according to claim 3, wherein the phase difference between the first multi-phase windings and second multi-phase windings in the alternating current rotating machine is 30 degrees.

5. The power conversion device according to claim 1, wherein the alternating current rotating machine is an n-phase alternating current rotating machine such that the first multi-phase windings and second multi-phase windings have no phase difference, and the switching signal generator outputs the first switching signal and second switching signal so that at least n−1 combinations wherein the first non-zero voltage vector and second non-zero voltage vector coincide are generated in every detection cycle of the first bus current or every cycle of the first and second switching signals.

6. The power conversion device according to claim 2, wherein the alternating current rotating machine is an n-phase alternating current rotating machine such that the first multi-phase windings and second multi-phase windings have no phase difference, and the switching signal generator outputs the first switching signal and second switching signal so that at least n−1 combinations wherein the first non-zero voltage vector and second non-zero voltage vector coincide are generated in every detection cycle of the first bus current or every cycle of the first and second switching signals.

7. The power conversion device according to claim 5, wherein the switching signal generator switches the combinations based on the voltage magnitude relationship or current phase in at least one of a voltage command of the first multi-phase windings and a voltage command of the second multi-phase windings.

8. The power conversion device according to claim 7, comprising rotation position detector that detects the rotation position of the alternating current rotating machine, wherein the switching signal generator switches the combinations based on the rotation position.

9. The power conversion device according to claim 7, comprising rotation position detector that detects the rotation position of the alternating current rotating machine, wherein the voltage command calculator calculates a first voltage command and second voltage command based on a current command and the rotation position of the n-phase alternating current rotating machine, and the switching signal generator switches the combinations based on the current command.

10. The power conversion device according to claim 5, comprising rotation position detector that detects the rotation position of the alternating current rotating machine, wherein the switching signal generator switches the combinations based on the rotation position.

11. The power conversion device according to claim 5, comprising rotation position detector that detects the rotation position of the alternating current rotating machine, wherein the voltage command calculator calculates a first voltage command and second voltage command based on a current command and the rotation position of the n-phase alternating current rotating machine, and the switching signal generator switches the combinations based on the current command.

12. The power conversion device according to claim 1, wherein the alternating current rotating machine is an n-phase alternating current rotating machine such that the first multi-phase windings and second multi-phase windings have a phase difference, and the switching signal generator outputs the first switching signal and second switching signal so that at least n−1 combinations wherein the first non-zero voltage vector and second non-zero voltage vector neighbor are generated in every detection cycle of the first bus current or every cycle of the first and second switching signals.

13. The power conversion device according to claim 12, wherein the phase difference between the first multi-phase windings and second multi-phase windings in the alternating current rotating machine is 30 degrees.

14. The power conversion device according to claim 12, wherein the switching signal generator switches the combinations based on the voltage magnitude relationship or current phase in at least one of a voltage command of the first multi-phase windings and a voltage command of the second multi-phase windings.

15. The power conversion device according to claim 12, comprising rotation position detector that detects the rotation position of the alternating current rotating machine, wherein the switching signal generator switches the combinations based on the rotation position.

16. The power conversion device according to claim 12, comprising rotation position detector that detects the rotation position of the alternating current rotating machine, wherein
   the voltage command calculator calculates a first voltage command and second voltage command based on a current command and the rotation position of the n-phase alternating current rotating machine, and
   the switching signal generator switches the combinations based on the current command.

17. The power conversion device according to claim 1, wherein the first current detector is disposed between the power converter and the direct current power supply.

18. The power conversion device according to claim 1, wherein the first current detector is disposed between the first power converter and the direct current power supply.

* * * * *